US011190878B1

(12) United States Patent
Patel et al.

(10) Patent No.: US 11,190,878 B1
(45) Date of Patent: Nov. 30, 2021

(54) HEADPHONES WITH ON-HEAD DETECTION

(71) Applicant: Apple Inc., Cupertino, CA (US)

(72) Inventors: Axit H. Patel, Sunnyvale, CA (US); Edwin J. Corona Aparicio, San Francisco, CA (US); Daniel R. Bloom, Alameda, CA (US); Tsu-Hui Lin, Cupertino, CA (US); Yuta Kuboyama, Sunnyvale, CA (US); Michael B. Minerbi, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/023,243

(22) Filed: Sep. 16, 2020

(51) Int. Cl.
| | |
|---|---|
| *H04R 5/033* | (2006.01) |
| *H04R 5/04* | (2006.01) |
| *H04R 1/10* | (2006.01) |
| *H01L 31/107* | (2006.01) |
| *H04R 1/02* | (2006.01) |
| *G01N 21/3563* | (2014.01) |

(52) U.S. Cl.
CPC ......... *H04R 5/033* (2013.01); *G01N 21/3563* (2013.01); *H01L 31/107* (2013.01); *H04R 1/028* (2013.01); *H04R 1/1008* (2013.01); *H04R 1/1091* (2013.01); *H04R 5/04* (2013.01)

(58) Field of Classification Search
CPC .......... H04R 5/033; H04R 5/04; H04R 1/028; H04R 1/1041; H04R 1/1091; H04R 1/1008; H01L 31/107; G01N 21/3563
USPC ................. 381/309, 311, 74, 370, 371, 384; 455/575.2
See application file for complete search history.

(56) References Cited

U.S. PATENT DOCUMENTS

| | | | |
|---|---|---|---|
| 5,125,032 A | 6/1992 | Meister et al. | |
| 5,138,722 A | 8/1992 | Urella et al. | |
| 5,144,678 A * | 9/1992 | Lenz .................... | H04R 1/1041 381/371 |
| 5,381,486 A | 1/1995 | Ludeke et al. | |
| 5,469,505 A | 11/1995 | Gattey et al. | |
| 5,604,813 A | 2/1997 | Evans et al. | |
| 6,295,366 B1 | 9/2001 | Haller et al. | |

(Continued)

FOREIGN PATENT DOCUMENTS

| | | |
|---|---|---|
| CN | 101136665 | 9/2013 |
| CN | 203260518 | 10/2013 |

(Continued)

OTHER PUBLICATIONS

U.S. Appl. No. 17/023,240, Notice of Allowance, dated Jul. 14, 2021, 9 pages.

(Continued)

*Primary Examiner* — Xu Mei
(74) *Attorney, Agent, or Firm* — Kilpatrick Townsend & Stockton LLP

(57) ABSTRACT

This disclosure includes several different features suitable for use in circumaural and supra-aural headphones designs. Designs that enhance user comfort and improve user control of the headphones are discussed. Various sensor configurations and electronic component positions are also discussed. User convenience features that include detachable cushions and automatically detecting the donning and doffing of headphones are also discussed.

20 Claims, 51 Drawing Sheets

(56) References Cited

U.S. PATENT DOCUMENTS

| | | | |
|---|---|---|---|
| 8,559,621 B2* | 10/2013 | Gerhardt | H04M 1/6041 |
| | | | 379/430 |
| 8,760,310 B2* | 6/2014 | Rosener | H04M 1/05 |
| | | | 340/686.1 |
| 8,767,996 B1 | 7/2014 | Lin et al. | |
| 9,648,409 B2* | 5/2017 | Puskarich | H04R 5/04 |
| 10,291,976 B2* | 5/2019 | Peterson | H04R 1/1008 |
| 10,306,350 B1* | 5/2019 | Lin | H04R 1/1041 |
| 11,109,135 B1 | 8/2021 | Corona Aparicio et al. | |
| 2005/0018859 A1* | 1/2005 | Buchholz | H04R 1/1016 |
| | | | 381/74 |
| 2008/0128198 A1 | 6/2008 | Du et al. | |
| 2012/0102629 A1 | 5/2012 | Lott et al. | |
| 2013/0121494 A1* | 5/2013 | Johnston | H04R 1/1041 |
| | | | 381/56 |
| 2015/0041289 A1 | 2/2015 | Ely | |
| 2015/0160683 A1 | 6/2015 | Fust et al. | |
| 2016/0044405 A1 | 2/2016 | Huang et al. | |
| 2016/0182990 A1 | 6/2016 | Yamamoto | |
| 2017/0085988 A1 | 3/2017 | Hardi et al. | |
| 2017/0180863 A1 | 6/2017 | Biggs | |
| 2017/0374448 A1* | 12/2017 | Patel | H04R 29/001 |
| 2018/0039086 A1* | 2/2018 | Jiang | H04R 1/1041 |
| 2018/0220218 A1 | 8/2018 | Karacal | |
| 2018/0220219 A1 | 8/2018 | Karacal | |
| 2019/0101359 A1 | 4/2019 | Zimmer | |
| 2019/0222913 A1 | 7/2019 | Leclerc et al. | |
| 2020/0029881 A1 | 1/2020 | Flood et al. | |
| 2020/0213703 A1 | 7/2020 | Yoneyama | |
| 2020/0280786 A1* | 9/2020 | Kole | H04R 5/04 |
| 2020/0374622 A1 | 11/2020 | Kara et al. | |
| 2020/0396529 A1 | 12/2020 | Thomas | |

FOREIGN PATENT DOCUMENTS

| | | |
|---|---|---|
| EP | 2096881 | 9/2009 |
| EP | 2523469 | 11/2012 |
| EP | 3244629 | 11/2017 |
| KR | 20010098100 | 11/2001 |
| KR | 20060051367 | 5/2006 |
| KR | 20190040284 | 4/2019 |

OTHER PUBLICATIONS

U.S. Appl. No. 17/023,234, Notice of Allowance, dated Apr. 30, 2021, 10 pages.

European Patent Application No. 20198264.2, Extended European Search Report, dated Feb. 22, 2021, 9 pages.

European Patent Application No. 20198265.9, Extended European Search Report, dated Mar. 12, 2021, 7 pages.

U.S. Appl. No. 17/023,239, Non-Final Office Action, dated Oct. 15, 2021, 9 pages.

U.S. Appl. No. 17/023,244, Notice of Allowance, dated Oct. 20, 2021, 11 pages.

Korea Patent Application No. 10-2020-0124830, Office Action, dated Aug. 30, 2021, 10 pages.

* cited by examiner

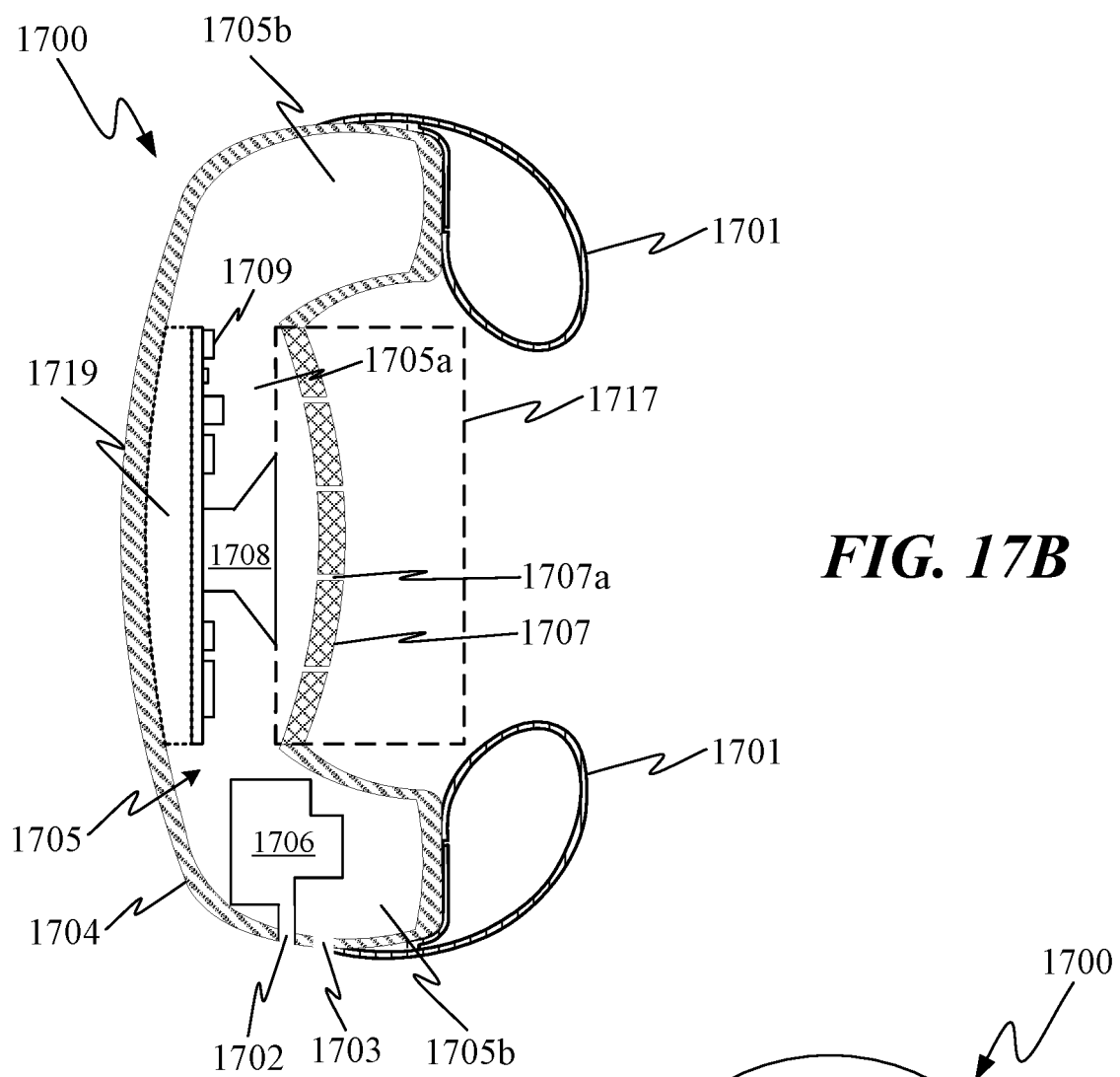
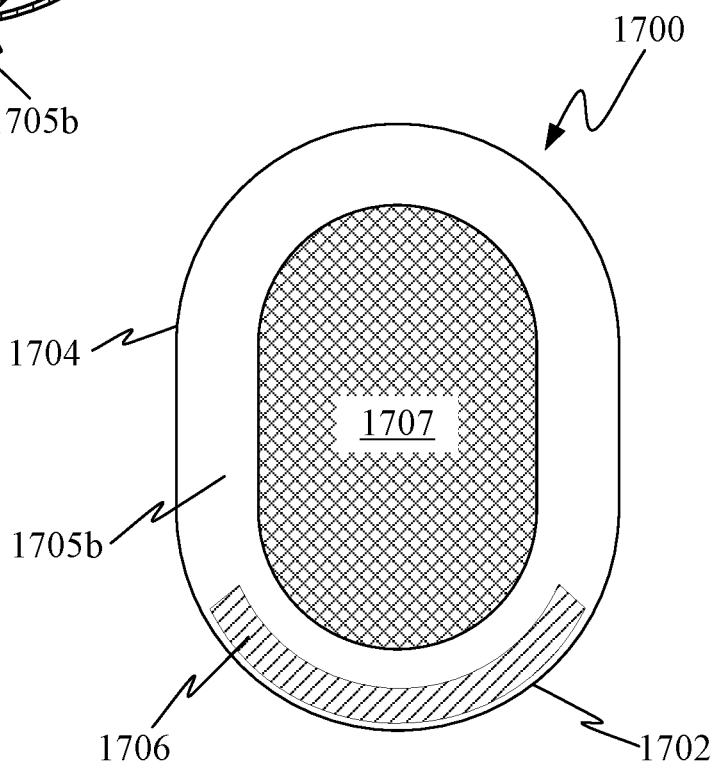
*FIG. 17B*
*FIG. 17C*

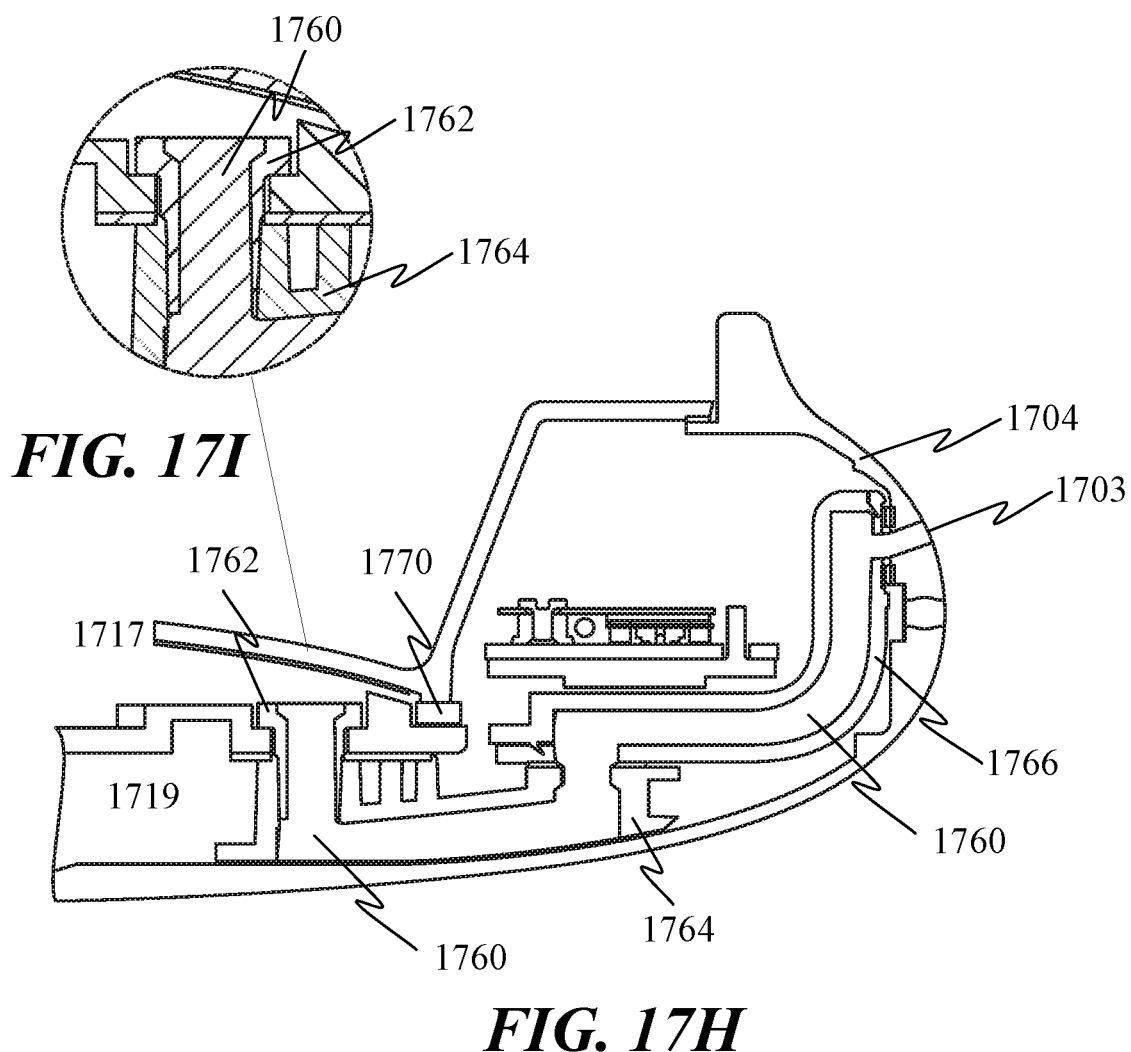
*FIG. 17I*
*FIG. 17H*
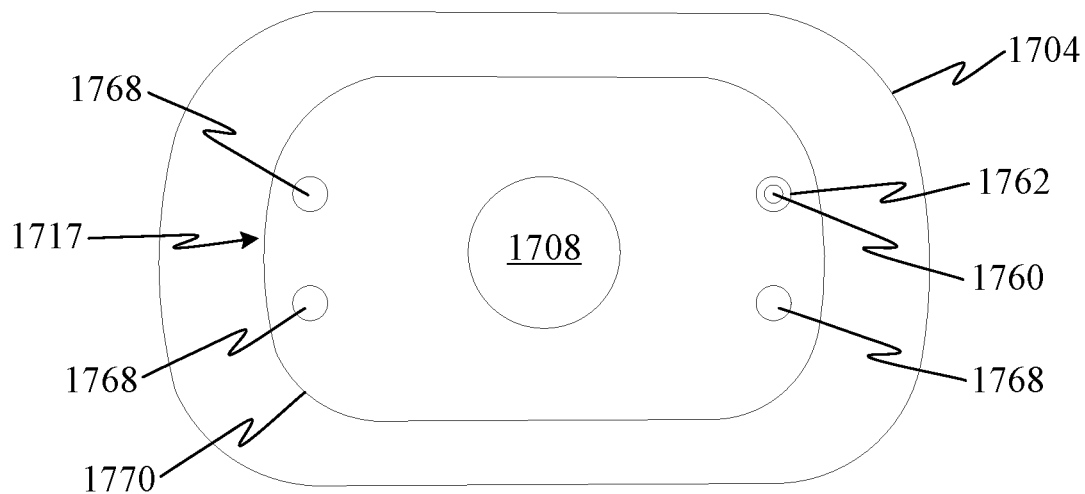
*FIG. 17J*

HEADPHONES WITH ON-HEAD DETECTION

FIELD

The described embodiments relate generally to headphones such as over-ear and on-ear headphones. More particularly, the various features help improve the overall user experience by incorporating an array of sensors and new mechanical features into the headphones.

BACKGROUND

Headphones have now been in use for many years. Consumers have become accustomed to regular, essentially yearly improvements in size, functionality and other design aspects of various electronic devices that consumers use in their day-to-day lives including devices such as smart phones, tablet and laptop computers, as well as listening devices such as earbuds and headphones. Accordingly, while numerous headphone designs exist in the market, new and improved designs are continuously being sought to satisfy consumer demands and preferences.

SUMMARY

This disclosure describes numerous improvements on circumaural and supra-aural headphone designs. The headphones can include space and weight saving components that enhance the comfort for the user when the user is wearing the headphones. The headphones can include a headband connected to an upper portion of earpieces. The earpieces can include a pivot mechanism that can allow for rotation of the earpieces relative to the headband with a constant application of force. The rotation of the earpieces can be measured by one or more sensors in the pivot mechanism to determine an orientation of the earpieces. The orientation of the earpieces can be used to determine whether the headphones should be changed between an operational mode and a standby mode.

The headphones can also include earpieces with cushions that have variable thickness. The variable thickness cushions can be more comfortable for a user and can provide a better seal between the cushions and the users head. The improved seal can reduce external noise that can reach the user. Various headphones can also include a headband with multiple pieces formed into a single headband. The headband can be optimized for a clamp force that provides a snug comfortable fit for the user and will not degrade over time. The headband can include a mesh component that can form to a user's head when the headphones are being warn.

Headphones described herein can include an antenna for receiving and transmitting radio frequency (RF) waves. The antenna can receive and transmit the RF waves across multiple frequency ranges using capacitive components. The antenna can include plating to increase the transmission of the RF emissions and can be oriented in the earpieces to direct the RF waves toward a user.

Headphones can include inputs that can be optimized for users. The resistance of the inputs to depressing and rotation can be optimized to allow a user to feel when the input has been pressed and/or rotated. Dampening material can also be positioned in the inputs to reduce noise that can be generated when components come in contact with one another. For example, dampening material can be put between two metal components to reduce or prevent the components from making noise when they come in contact.

Headphones can include a detection system to determine when they have been donned or doffed. The detection system can emit light towards a user and detected the reflected light. The reflected light can be used to determine if a user is present and if their ear is positioned in the earpiece. If a user's ear is in the earpiece, the headphones can be put into operational mode.

A listening device is disclosed and includes the following: a first earpiece; a headband having a first end coupled to the first earpiece, the first earpiece comprising: an earpiece housing defining an interior volume; a speaker disposed within the interior volume; and a pivot mechanism coupled to the earpiece housing and operable to enable the earpiece housing to rotate separate from the headband along a first axis, the pivot mechanism comprising: an aperture sized and shaped to receive one of the first or second ends of the headband; first and second pivot rods; a first cylinder having a first channel and coupled to the first pivot rod; a first piston that fits within the first channel and is coupled to the second pivot rod; and a first compression spring at least partially surrounding the first piston and the first cylinder and positioned to compress relative to the aperture while opposing rotation of the pivot mechanism about the first axis.

An earpiece is disclosed and includes the following: an earpiece housing defining an interior volume; a speaker disposed within the interior volume; and a pivot mechanism disposed at a first end of the earpiece housing and operable to enable the earpiece housing to rotate along a first axis and comprising: an aperture sized and shaped to receive a first end of a headband; first and second pivot rods; a first cylinder having a first channel and a second cylinder having a second channel, the first and second cylinders coupled to the first pivot rod; a first piston positionable within the first channel and a second piston positionable within the second channel, the first and second pistons coupled to the second pivot rod; and a first compression spring at least partially surrounding the first piston and the first cylinder and a second compression spring at least partially surrounding the second piston and the second cylinder and positioned to compress relative to the aperture while opposing rotation of the pivot mechanism about the first axis.

Headphones are disclosed and include the following: a first earpiece comprising a first earpiece housing defining a first interior volume and a first pivot mechanism coupled to the first earpiece housing and operable to enable the first earpiece to rotate about a first axis, the first pivot mechanism comprising: a first aperture sized and shaped to receive a first end of a headband; first and second pivot rods; a first cylinder having a first channel and coupled to the first pivot rod; a first piston that fits within the first channel and is coupled to the second pivot rod; and a first compression spring at least partially surrounding the first piston and the first cylinder and positioned to compress relative to the first aperture while opposing rotation of the first pivot mechanism about the first axis; and a second earpiece comprising a second earpiece housing defining a second interior volume and a second pivot mechanism coupled to the second earpiece housing and operable to enable the second earpiece to rotate about a second axis, the second pivot mechanism comprising: a second aperture sized and shaped to receive a second end of a headband; third and fourth pivot rods; a second cylinder having a second channel and coupled to the third pivot rod; a second piston that fits within the second channel and is coupled to the fourth pivot rod; and a second compression spring at least partially surrounding the second piston and the second cylinder and positioned to compress relative to the second aperture while opposing rotation of the second pivot mechanism about the second axis.

Headphones are disclosed and include the following: a headband; and an earpiece coupled with one end of the headband, the earpiece comprising: an earpiece housing defining an aperture; a button assembly positionable in the aperture and comprising: a button housing having an upper portion and a lower portion and defining a channel having a central axis; a crown axially aligned with the central axis and configured to move into engagement with the button housing; a damper positioned between the upper portion of the button housing and the crown and configured to dampen vibrations caused when the crown engages the button housing; a hub coupled with the crown and positioned in the channel and translatable along and rotatable about the central axis, the hub comprising one or more markings and configured to engage a compressible dome when the hub is translated toward an interior of the earpiece housing; and seals positioned between the hub and the button housing, one of the seals having a variable diameter and contacts the hub and the button housing with only a portion of the seal.

An earpiece is disclosed and includes the following: an earpiece housing defining an aperture; a button assembly positionable in the aperture and comprising: a button housing having an upper portion and a lower portion and defining a channel having a central axis; a crown axially aligned with the central axis and configured to move into engagement with the upper portion of the button housing; a first damper positioned between the button housing and the crown and configured to dampen vibrations caused when the crown engages the button housing; a hub coupled with the crown and positioned in the channel and translatable along and rotatable about the central axis, the hub comprising one or more markings and configured to move between engaging the lower portion of the button housing and engaging a compressible dome when the hub is translated toward an interior of the earpiece housing; and a second damper positioned between the hub and the lower portion of the button housing and configured to dampen vibration when the hub engages the lower portion of the button housing.

A listening device is disclosed and includes the following: an earpiece having an earpiece housing defining an aperture; a button assembly positionable in the aperture and comprising: a button housing having an upper and a lower portion and defining a channel having a central axis; a crown axially aligned with the central axis and configured to move into engagement with the upper portion of the button housing; a hub coupled with the crown and positioned in the channel and translatable along and rotatable about the central axis, the hub comprising one or more markings and configured to engage a compressible dome when the hub is translated toward an interior of the earpiece housing; and seals positioned between the hub and the button housing, a first seal positioned adjacent to the upper portion of the button housing and configured to form a watertight seal and a second seal positioned between the hub and the compressible dome and having a variable diameter to contact the hub and the button housing with only a portion of the seal.

Headphones are disclosed and include the following: a headband assembly; and a first earpiece coupled to a first end of the headband assembly and a second earpiece coupled to a second end of the headband assembly, each of the first and second earpieces comprising an earpiece housing, an acoustic driver disposed within the earpiece housing and an earpiece cushion assembly coupled to the earpiece housing to cooperatively define a cavity sized to accommodate an ear of a user, the earpiece cushion assembly comprising: an annular earpiece cushion; and a support structure disposed between the annular earpiece cushion and the earpiece housing, the support structure comprising cantilevered support members distributed along a periphery of the cavity and protruding into the cavity.

An earpiece suitable for use with over-ear headphones is disclosed and includes the following: an earpiece housing; an earpiece cushion assembly coupled to the earpiece housing to cooperatively define a cavity sized to accommodate an ear of a user, the earpiece cushion assembly comprising an annular earpiece cushion and a support structure disposed between the annular earpiece cushion and the earpiece housing, the support structure comprising cantilevered support members distributed around the cavity and protruding into the cavity; and an acoustic driver.

Headphones are disclosed and include the following: a first earpiece and a second earpiece, each of the earpieces comprising an earpiece housing, an acoustic driver disposed within the earpiece housing, and an earpiece cushion assembly coupled to the earpiece housing, wherein each earpiece cushion assembly comprises: an annular earpiece cushion; and a support structure disposed between the annular earpiece cushion and the earpiece housing, the support structure comprising cantilevered support members distributed around and supporting the annular earpiece cushion; and a headband assembly mechanically coupling the first and second earpieces.

An earpiece for a pair of headphones is disclosed and includes the following: a conductive earpiece housing defining an interior volume having a central region and an outer region surrounding the central region, wherein the conductive earpiece housing includes a portion that defines a ground plane element for an antenna and has an elongated slot formed through the ground plane element; and a slot antenna disposed within the outer region of the interior volume and electrically coupled to the ground plane element, the slot antenna comprising a frame formed from a radio frequency transparent material and defining an enclosed interior cavity within the interior volume, wherein the frame includes a tongue having first and second opposing surfaces protruding away from the interior cavity and a distal end facing the elongated slot and extending between the first and second opposing surfaces, and wherein a distal end of the tongue allows radio frequency waves to enter the interior cavity through the elongated slot and a remainder of an exterior of the frame is plated with one or more layers of metal that prevents radio frequency waves from entering the interior cavity.

An earpiece for a pair of headphones is disclosed and includes the following: a conductive earpiece housing defining an interior volume having a central region and an outer bulbous region surrounding the central region, wherein the conductive earpiece housing includes a portion that defines a ground plane element for an antenna and has an elongated rectangular slot formed through the ground plane element; wireless circuitry disposed within the interior volume; audio processing circuitry disposed within the interior volume and operatively coupled to the wireless circuitry; a microphone disposed within the interior volume and operatively coupled to the audio processing circuitry; a speaker disposed within the central region of the interior volume and operatively coupled to the audio processing circuitry; a slot antenna disposed within the bulbous region of the interior volume and operatively coupled to the wireless circuitry, the slot antenna comprising a frame formed from a rigid radio frequency transparent material and defining an interior cavity within the interior volume, wherein the frame includes a tongue having first and second opposing surfaces protruding away from the interior cavity and a distal end facing the elongated rectangular slot and extending between the first and second opposing surfaces, and wherein a distal end of the tongue allows radio frequency waves to enter the interior cavity through the elongated slot and a remainder of an exterior of the frame is plated with one or more layers of metal that prevents radio frequency waves from entering the interior cavity; and a grounding connection between the slot antenna and the ground plane element of the conductive earpiece housing.

An earpiece for a pair of headphones is disclosed and includes the following: an earpiece housing defining an interior volume having a central region and an outer region surrounding the central region, wherein the earpiece housing includes an elongated slot and an acoustic opening proximate the elongated slot formed through the earpiece housing; a slot antenna disposed within the outer region of the interior volume and comprising a frame formed from a radio frequency transparent material and defining an enclosed interior cavity within the interior volume, wherein the frame includes a support structure extending into the interior cavity and a tongue, the tongue having first and second opposing surfaces protruding away from the interior cavity and a distal end facing the elongated slot and extending between the first and second opposing surfaces, and wherein a distal end of the tongue allows radio frequency waves to enter the interior cavity through the elongated slot and a remainder of an exterior of the frame is plated with one or more layers of metal that prevents radio frequency waves from entering the interior cavity; and an acoustic pathway at least partially defined by an acoustic vent having an opening aligned with the acoustic opening, the acoustic pathway acoustically coupling the acoustic opening with the interior volume.

An earpiece for a pair of headphones is disclosed and includes the following: an earpiece housing defining an interior volume, the earpiece housing having an interior sidewall surface extending around a central opening of the earpiece housing at a first angle and a first aperture formed through the interior sidewall surface; an earpiece cover coupled to the earpiece housing and covering the central opening, the earpiece cover having a plurality of sound openings formed through a central region of the earpiece cover, an outer sidewall surface extending around the central region and aligned with and extending over the interior sidewall surface of the earpiece housing, and a second aperture formed through the outer sidewall surface and aligned with the first aperture; an annular earpiece cushion coupled to the earpiece housing surrounding an ear-receiving region of the earpiece; a speaker disposed within the interior volume and positioned to direct acoustic energy through the plurality of sound openings in the earpiece cover into the ear-receiving region of the earpiece; a carrier coupled to the earpiece housing and disposed over the first and second apertures, the carrier having a body formed between first and second opposing major surfaces, the first major surface facing the ear-receiving region and the second major surface including a mounting portion disposed at a second angle relative to the earpiece housing different than the first angle; an optical sensor comprising an optical emitter and an optical receiver and coupled to the mounting portion of the carrier, the optical sensor aligned to emit radiation through the body of the carrier and through the first and second apertures into the ear-receiving region and receive reflected radiation back through the first and second apertures and through the body of the carrier.

An earpiece is disclosed and includes the following: an earpiece housing defining an interior volume, the earpiece housing having an interior sidewall surface extending around a central opening of the earpiece housing at a first angle and a first aperture formed through the interior sidewall surface; an annular earpiece cushion coupled to the earpiece housing surrounding an ear-receiving region of the earpiece; a speaker disposed within the interior volume and positioned to direct acoustic energy into the ear-receiving region of the earpiece; a carrier coupled to the earpiece housing and disposed over the first aperture, the carrier having a body formed between first and second opposing major surfaces, the first major surface facing the ear-receiving region and the second major surface including a mounting portion disposed at a second angle relative to the earpiece housing different than the first angle; an optical sensor comprising an optical emitter and an optical receiver and coupled to the mounting portion of the carrier, the optical sensor aligned to emit radiation through the body of the carrier and through the first aperture into the ear-receiving region and receive reflected radiation back through the first aperture and through the body of the carrier.

An earpiece is disclosed and includes the following: an earpiece housing defining an interior volume, the earpiece housing having an interior sidewall surface extending around a central opening of the earpiece housing at a first angle and a first aperture formed through the interior sidewall surface; an annular earpiece cushion coupled to the earpiece housing surrounding an ear-receiving region of the earpiece; a speaker disposed within the interior volume and positioned to direct acoustic energy into the ear-receiving region of the earpiece; an optical sensor coupled to the interior sidewall surface of the earpiece housing, the optical sensor comprising an optical emitter and an optical receiver and aligned to emit radiation through first aperture into the ear-receiving region and receive reflected radiation back through the first aperture.

A headphone earpiece is disclosed and includes the following: a housing defining an interior volume; an earpiece cover disposed in the interior volume and comprising a first magnet and a metal shunt, the metal shunt positioned between the earpiece cover and the first magnet; and an earpiece cushion assembly removably coupled to the housing and comprising an annular earpiece cushion coupled to a frame and a magnetic element disposed between the earpiece cushion and the frame, the magnetic element magnetically coupled with the first magnet when the earpiece cushion assembly is coupled to the housing, wherein the first magnet is configured to direct magnetic flux through the magnetic element to secure the earpiece cushion assembly to the housing.

An earpiece is disclosed and includes the following: a housing defining an interior volume; an earpiece cover coupled with the housing and comprising a central portion disposed in the interior volume, an annular shelf surrounding the central portion, a sidewall extending around the central opening of the earpiece cover between the central portion and the annular shelf, and a first magnet and a metal shunt positioned on the annular shelf, the metal shunt positioned between the earpiece cover and the first magnet; a speaker disposed within the interior volume and positioned to direct acoustic energy through the central portion of the earpiece cover; and an earpiece cushion assembly removably coupled to the earpiece cover and comprising a frame having a central portion, an annular surface surrounding the central portion of the frame, a sidewall extending around the central portion of the frame between the central portion and the annular surface, an earpiece cushion coupled with the annular surface of the frame, and a magnetic element disposed on the annular surface between the earpiece cushion and the frame, the magnetic element magnetically coupled with the first magnet when the earpiece cushion assembly is coupled to the housing, wherein the first magnet is configured to direct magnetic flux through the magnetic element to secure the earpiece cushion assembly to the housing.

An earpiece is disclosed and includes the following: a housing defining an interior volume; an earpiece cover coupled with the housing and comprising a central portion disposed in the interior volume, an annular shelf surrounding the central portion, a sidewall extending around the central opening of the earpiece cover between the central portion and the annular shelf, and a first magnet positioned on the annular shelf; an earpiece cushion assembly removably coupled to the earpiece cover and comprising a frame having a central portion, an annular surface surrounding the central portion of the frame, a sidewall extending around the central portion of the frame between the central portion and the annular surface, an earpiece cushion coupled with the annular surface of the frame, and a magnetic element disposed on the annular surface between the earpiece cushion and the frame, the magnetic element magnetically coupled with the first magnet when the earpiece cushion assembly is coupled to the housing, wherein the first magnet is configured to direct magnetic flux through the magnetic element to secure the earpiece cushion assembly to the housing.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which:

FIG. 17B is a simplified a cross-section of the earpiece of FIG. 17A in accordance with some embodiments;

FIG. 17C is a simplified plan view of the earpiece of FIG. 17A, in accordance with some embodiments;

FIG. 17H is a simplified cross-section of the earpiece of FIG. 17A along lines B-B' to illustrate an acoustic channel formed through the earpiece in accordance with some embodiments;

FIG. 17I is a detailed view of a portion of the cross-section of the earpiece of FIG. 17H in accordance with some embodiments;

FIG. 17J is a simplified view of a portion of the acoustic channel of FIG. 17H in accordance with some embodiments;

DETAILED DESCRIPTION

Figure 1:
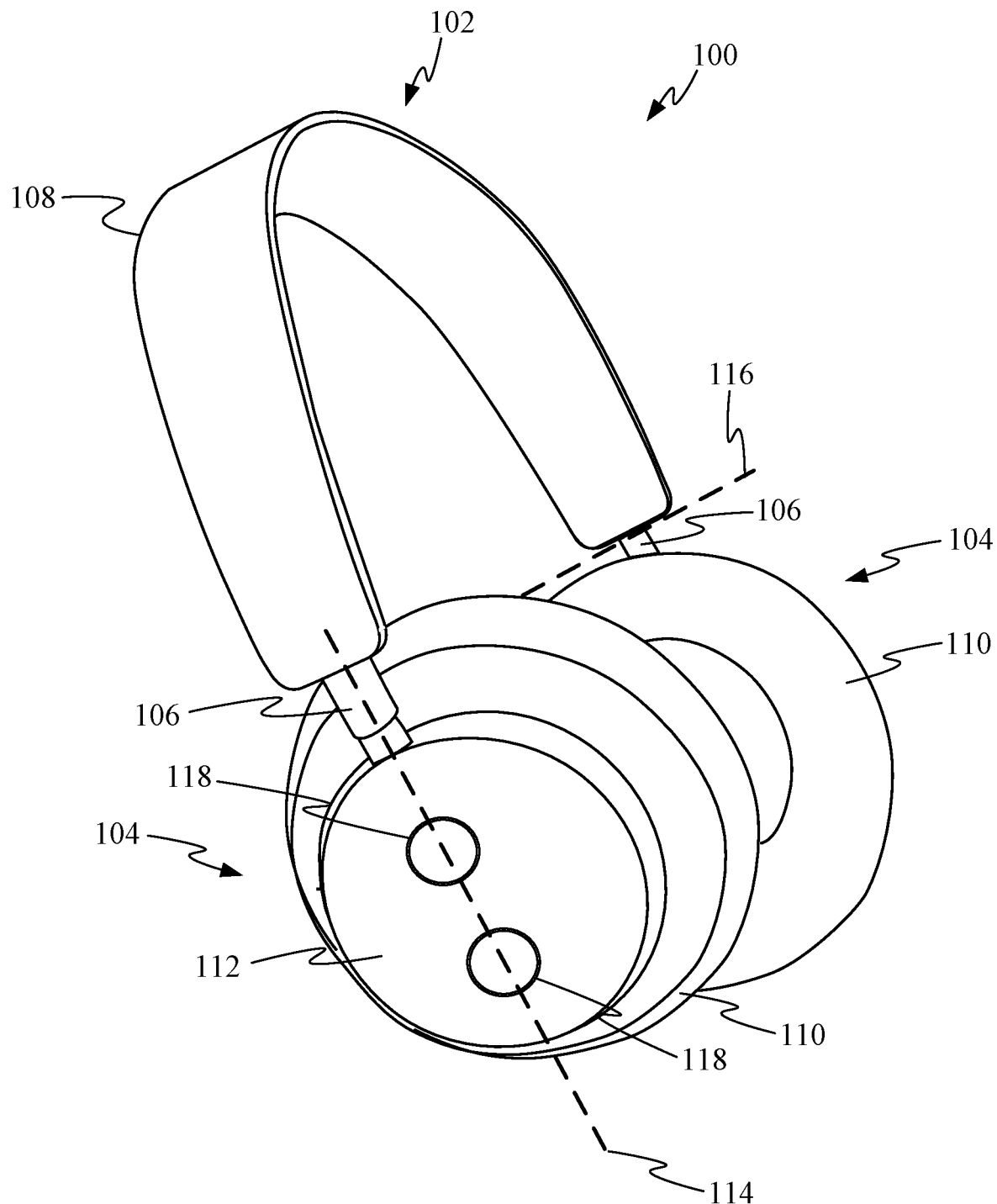
FIG. 1 shows an exemplary view of over ear or on-ear headphones.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Headphones have been in production for many years, but numerous design problems remain. For example, over ear headphones tend to be large and bulky, making their use outside of a studio or home environment less desirable. One contributor to the undesirable size and/or weight of some headphones is the earpiece pads that seal earpieces of the headphones around a user's ear to provide passive acoustic noise cancelling/isolation during use of the headphones. The earpiece pads are generally larger and/or thicker than necessary for any particular user so that the pads are able to create a robust acoustic seal for any user of the headphones. This additional padding is often necessary to allow the pads to conform to users having wide varieties of head sizes and shapes. For example, a user might have prominent protruding bones that an earpiece pad need to accommodate.

As another example, some headphones are uncomfortably heavy and/or provide a less than ideal fit for many users. The location that the headband connects to the earpieces can be part of the problem for some such headphones. For example, many traditional headphones connect the headband at a midpoint of the earpieces to allow the earpieces to pivot. However, this can cause discomfort and/or an undesirable fit for the user as one portion of each earpiece (e.g., a lower portion) may put pressure on a user's head while another portion (e.g., a top portion) may leave a gap allowing external sound to be heard.

As still another example, some headphones are susceptible to undesirable noise that can can be generated and heard during use of the headphones when a user activates an input button or similar feature to control one or more aspects of the headphones. For example, some input buttons can include metal portions that contact another metal component to activate a particular function of the headphones. The contacting of the metal components can cause them to vibrate and create a slight noise, which because the headphones are directly on a user's ear, can sometimes be heard by the user resulting in a less than ideal user experience.

As described herein, the inventors have developed solutions to address the deficiencies described above and other shortcomings of some currently available headphones. Unless stated otherwise, the various solutions described herein can be used individually or can be used collectively in any appropriate combination to improve a user's experience with headphones.

One solution devised by the inventors and described herein to reduce the weight and/or size of the headphones is to reduce the thickness of the earpiece pads and to selectively reinforce the earpiece pads with a support structure that includes multiple discrete cantilevered support members distributed around a periphery of a central opening defined by each earpiece cushion assembly. The cantilevered support members increase the stiffness of the earpiece pads and have a size and shape that allows for deflection of the cantilevered support members sufficiently to conform with contours of a user's head. The support structure allows a first region of an earpiece pad that receives only a minimal amount of force to be fully supported by one or more of the cantilevered support members, which remain in an undeflected position. This first region of the earpiece pad may correspond to a recessed or flat region of user's head. The support structure also allows a second region of the earpiece pad that receives a larger amount of force to deform by one or more cantilevered support members that deflect to accommodate movement of material making up the earpiece pad within the second region. Because each of the discrete cantilevered support members is able to deflect independently, thereby allowing for an amount of force being exerted by the support structure to change drastically between adjacent cantilevered support members. For example, almost no force could be exerted upon earpiece pad by a first cantilevered support member while an adjacent second cantilevered support member could undergo a substantial amount of deflection. In this way, the earpiece pad is able to vary its shape greatly without relying on a thick pad while maintaining a consistent amount of force against a portion of a user's head surrounding the user's ear.

One solution described herein that improves the fit of the headphones for some users includes changing the location where the headband connects to the earpieces. For example, the headband can connect with the earpieces at an upper portion of the earpieces as opposed to a central region as is done in many traditional earpieces. The earpieces can include a pivot mechanism that connects with the end of the headband and allows the earpieces to pivot at an upper portion of each earpiece. The earpieces and pivot mechanism can be further designed to apply a relatively constant pressure across the entire contact surface of user's head. The constant pressure can provide a more comfortable fit for users and create a better seal to reduce the amount of external noise that is able to enter the earpieces. Additionally, in some embodiments the pivot mechanism can couple the stems of a headband to the headphone earpieces using a spring-driven pivot mechanism that controls motion of the earpieces with respect to the band. The spring-driven pivot mechanism can be positioned near the top of the earpiece, allowing it to be incorporated within the earpiece instead of being external to the earpiece. In this way, pivoting functionality can be built into the earpieces without adding to the overall bulk of the headphones. Different types of springs can be utilized to control the motion of the earpieces with respect to the headband. Specific examples that include compression springs are described in detail below. The springs associated with each earpiece can cooperate with the headband to set an amount of force exerted on a user wearing the headphones. In some embodiments, the headband can include multiple components formed together to minimize the force variation exerted across a large spectrum of users with different head sizes.

One solution described herein to the noise that can be made by certain user input controls is to position dampening material between components that contact one another. The dampening material can lessen the noise caused by the contacting of the components.

These and other embodiments are discussed below with reference to FIGS. 1 through 31; however, those skilled in the art will readily appreciate that the detailed description given herein with respect to these figures is for explanatory purposes only and should not be construed as limiting.

FIG. 1 shows a perspective view of exemplary headphones 100 suitable for use with the described embodiments. Headphones 100 including headband assembly 102, which can be configured to mechanically and electrically couple earpieces 104. The headband assembly 102 can include a headband 108 and stems 106. The headband 108 can include multiple components and/or layers formed together into a single piece. For example, the headband 108 can include material layered around a central structure. In some embodiments, earpieces 104 can take the form of ear cups sized and shaped to fit over and/or around a user's ears (i.e., some embodiments pertain to circumaural headphones) and in other embodiments, earpieces 104 can take the form of on-ear earpieces sized and shaped to fit against a user's ears (i.e., some embodiments pertain to supra-aural headphones).

Earpieces 104 can be joined to opposing ends of headband assembly 102 by stems 106 of headband assembly 102. Stems 106 are arranged at opposing ends of headband 108 and allow earpieces 104 to be independently oriented toward a surface of a user's head. Stems 106 can rotate along one or more axes (e.g., along a yaw axis 114 and/or roll axis 116). Stems 106 of earpieces 104 also allow for earpieces 104 of headphones 100 to be folded and/or oriented in a storage position. In some embodiments, the earpieces 104 can be detached from stems 106. For example, the earpieces 104 can be detached and removed from the headband assembly 102.

Each earpiece 104 can include an earpiece housing 112 and an earpiece cushion assembly 110 coupled to the earpiece housing 112. Earpiece housing 112 defines a cavity within which electrical components such as speakers, microphones, sensors, printed circuit boards and the like are housed. In various embodiments, the earpiece housing 112 can be or include a monolithic aluminum structure. Earpiece cushion assemblies 110 can include a deformable material that is configured to deform to conform with a curvature of a user's head reducing and/or preventing the sound leaving and/or entering the earpieces 104. The deformable material can be, for example, silicone or foam and wrapped in a layer of leather or textile material providing good cosmetics and comfort to a user of headphones 100. In some embodiments each earpiece cushion assembly 110 can include multiple layers of different deformable materials and/or can include one or more portions that have varying acoustic properties as described below.

In some embodiments, a processor and wireless communication module can be disposed in one or both of earpieces 104. The wireless communication module provides more convenient cord-free use of headphones 100. Headphones 100 could also include a wired headphone jack for receiving media. the headphones 100 can receive media via the wired and/or wireless communication from one or more of a smartphone, television, computer, stereo, or any suitable media source. In addition to helping manage incoming media being received via wired or wireless receivers, the processor can also be configured to manage sensors that help to provide services such as headphones orientation determination (e.g. for determining which stereo channel to route to which earpiece 104) and active noise cancelling. In some embodiments, the processors can store the media received from the media source. For example, the processor can store media for later playback by the headphones 100.

Various embodiments of headphones 100 include user input controls 118 for controlling one or more aspects of the headphones. For example, the user input controls 118 can control playback of the media (e.g., play or pause) and/or the audio volume, answer and/or end phone calls, and other functions of headphones 100. The user input controls 118 can be or include buttons, knobs, touch sensors, or any suitable input device. While FIG. 1 illustrates two user input controls 118, the number of separate controls is not limited to any particular number and can vary from zero to four, six or more in various embodiments. Also, in some embodiments user input controls 118 can be implemented by a single input control area, such as a touch screen, that can detect a user's touch and identify gestures across a touch sensitive area formed along an outer portion of earpiece housing 112. In still other embodiments, input controls can be in the form of one or more buttons located along an outer periphery of the earpiece housing 112 as discussed with respect to some of the example embodiments discussed herein.

Pivoting Earpieces (Moment Comp)

Figure 2A:
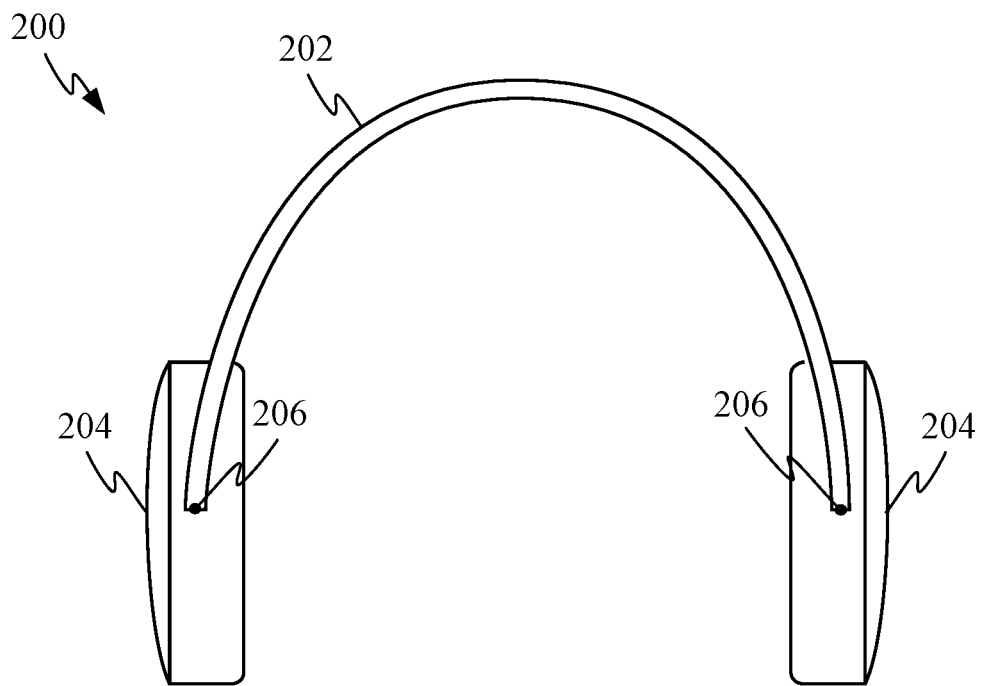
FIGS. 2A and 2B show simplified front views of an exemplary set of over ear or on-ear headphones.
Figure 2B:
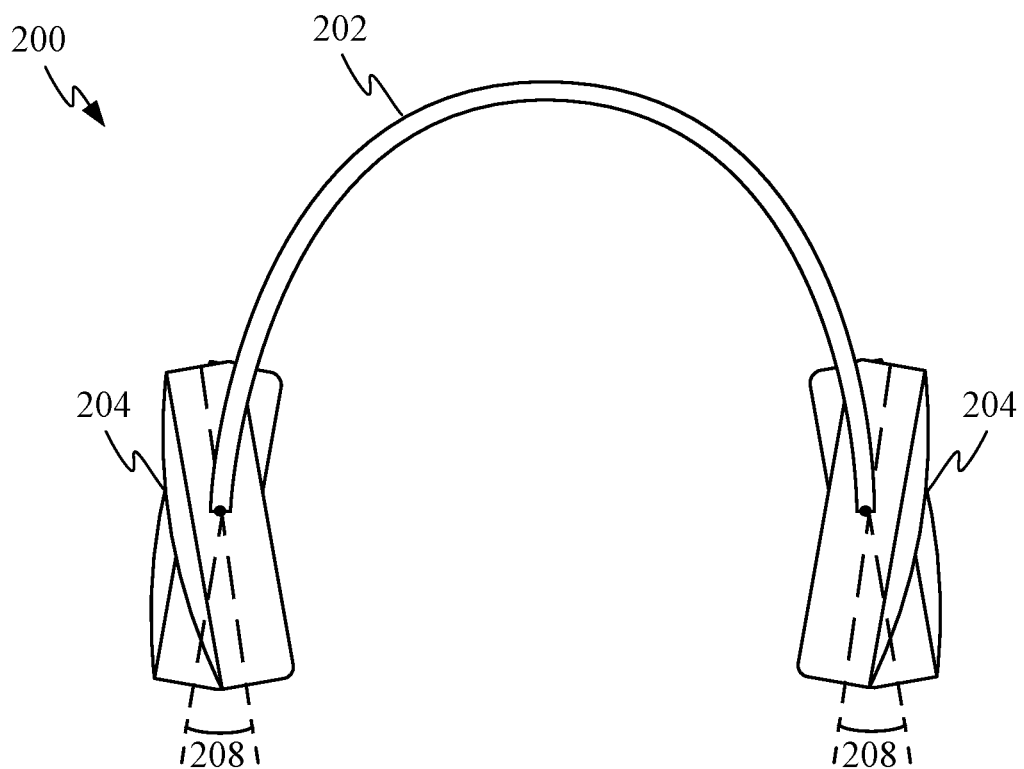

FIGS. 2A and 2B show front views of an exemplary set of previously known over-ear or on-ear headphones 200. Headphones 200 includes a headband 202 that is coupled with earpieces 204 at pivot point 206. The pivot point 206 is located at a center of earpieces 204, allowing for pivoting of the earpieces relative to the headband 202. For example, as shown in FIG. 2B the earpieces 204 can pivot in a range of motion 208. The pivot point 206 positioned at the midpoint of the earpieces 204 allows the earpieces to pivot such that the earpieces are generally positioned parallel to a surface of a user's head. Unfortunately, having a pivot point 206 at the center of the earpieces 204 requires bulky arms that extend to either side of earpiece 204, thereby substantially increasing the size and weight of earpieces 204.

Figure 3A:
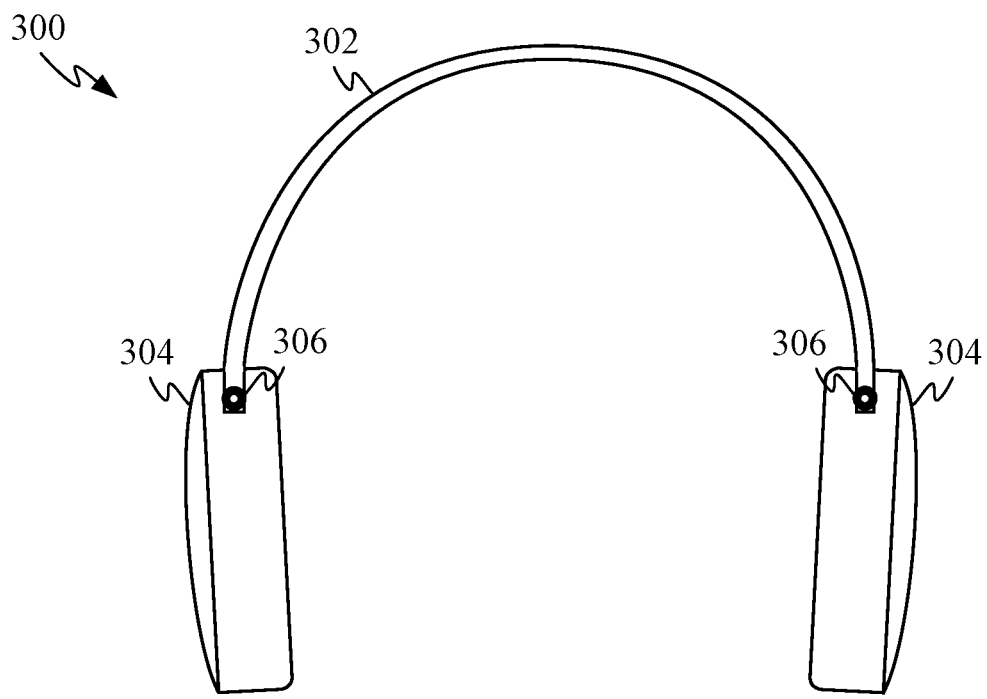
FIGS. 3A and 3B show simplified front views of headphones having off-center pivoting earpieces according to some embodiments of the disclosure.
Figure 3B:
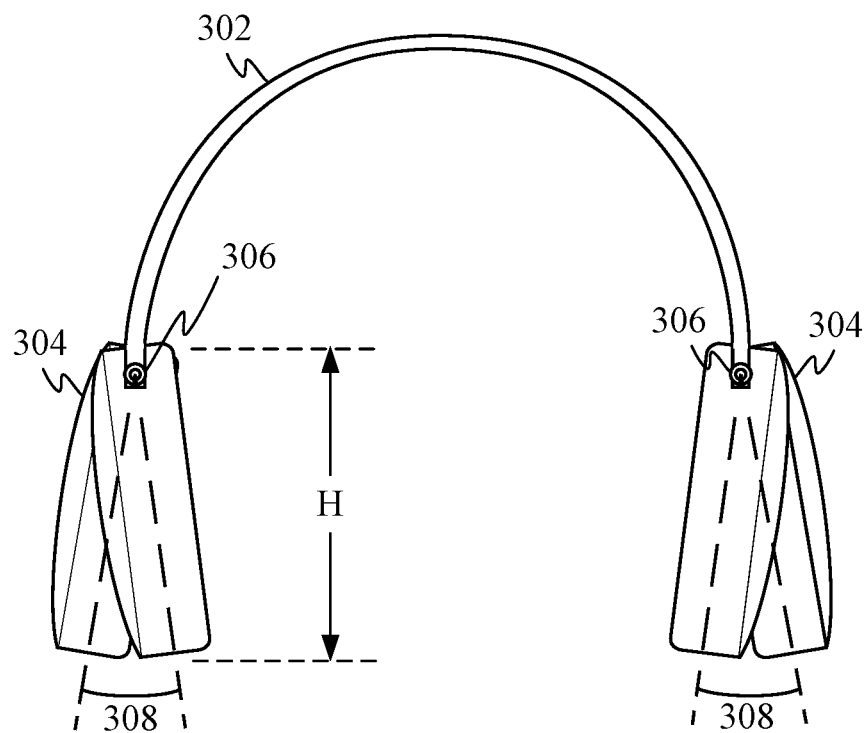

In contrast to the headphone design shown in FIGS. 2A and 2B, embodiments of the disclosure include headphones 300 having off-center pivoting earpieces. The headphones 300 can be the same as or similar to headphones 100, however, the headphones 300 can have additional and/or alternative components. FIGS. 3A and 3B show front views of headphones 300, which can include a headband assembly 302 and earpieces 304. Each end of the headband assembly 302 can be coupled to an upper portion of earpieces 304 via pivot mechanism 306. In some embodiments pivot mechanism 306 enables the earpieces 304 to be pivoted around a pivot point spaced apart from an upper periphery of each earpiece 304 by no more than 20 percent or 10 percent of the height (H) of the earpiece. This differs from the conventional headphones 200 with pivot point 206 positioned at or near the center of the earpieces 204. The earpieces 304 can pivot about pivot mechanism 306 in a range of motion 308. The range of motion 308 can be configured to accommodate a majority of users head size based on studies performed on average head size measurements.

Despite the compact configuration of headphones 300, the headphones can still perform the same functions as the more traditional configuration of headphones 200, which includes applying a force through the center of the earpiece 304 and establishing an acoustic seal. In some embodiments, the range of motion 308 can be in a range between 10 degrees and 25 degrees. In further embodiments, the range of motion 308 may not have a defined stop (e.g., a hard stop point) but instead may grow progressively harder to deform as it gets farther from a neutral position (e.g., the position where the earpieces 304 are at a minimal distance from one another). The pivot mechanism 306 can include spring elements configured to apply a retaining force to the ears of a user when the headphones 300 are in use. The spring elements can also bring earpieces back to a neutral position once the headphones 300 are no longer being worn.

Figure 4A:
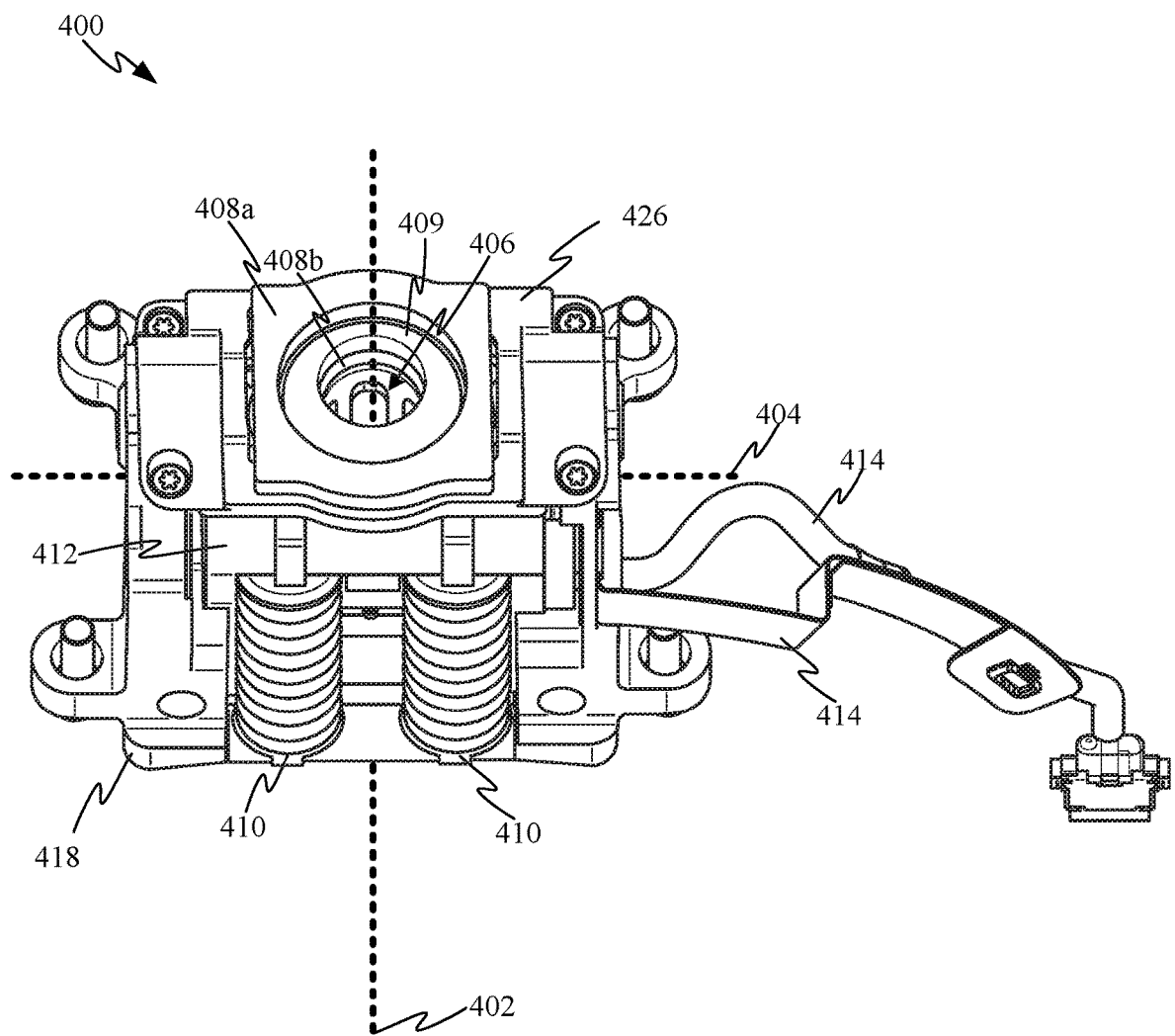
FIG. 4A is a perspective view of a pivot mechanism according to some embodiments of the disclosure.

FIG. 4A is a perspective view of a pivot mechanism 400 according to some embodiments. Pivot mechanism 400 can be representative of pivot mechanism 306 shown in FIGS. 3A, 3B and can be positioned in the upper portion of an earpiece, for example, earpiece 304 according to some embodiments. Pivot mechanism 400 can be configured to accommodate motion around multiple axes, thereby allowing adjustments to both roll and yaw for earpieces 304 with respect to headband assembly 302. For example, pivot mechanism 400 can rotate about yaw axis 402 and roll axis 404. The pivot mechanism 400 can include an aperture 406 at least partially defined by collar 409. The aperture 406 can be sized and shaped for receiving a portion of headband assembly 302. The collar 409 can receive and engage with the headband assembly 302 (e.g., via a latching component that can couple the headband assembly 302 and the collar 409). The aperture 406 can receive the headband assembly 302 (e.g., the aperture in each of the left and right earpieces can receive one of two stems, such as stems 1208 discussed below, on opposing sides of the headband) and allow for rotation of the earpieces 304 about the yaw axis 402 and/or the roll axis 404.

One or more seals 408 can be positioned to at least partially, and in some embodiments fully, surround the aperture 406 and can seal the ingress of the aperture 406 from external pollutants and/or moisture. For example, a face seal 408a can be positioned to seal a face of the pivot mechanism and an O-ring seal 408b can be positioned to seal around the portion of the headband assembly 302 that is positioned in the aperture 406. The seals 408 can be made from a compressible or similar material.

Figure 4B:
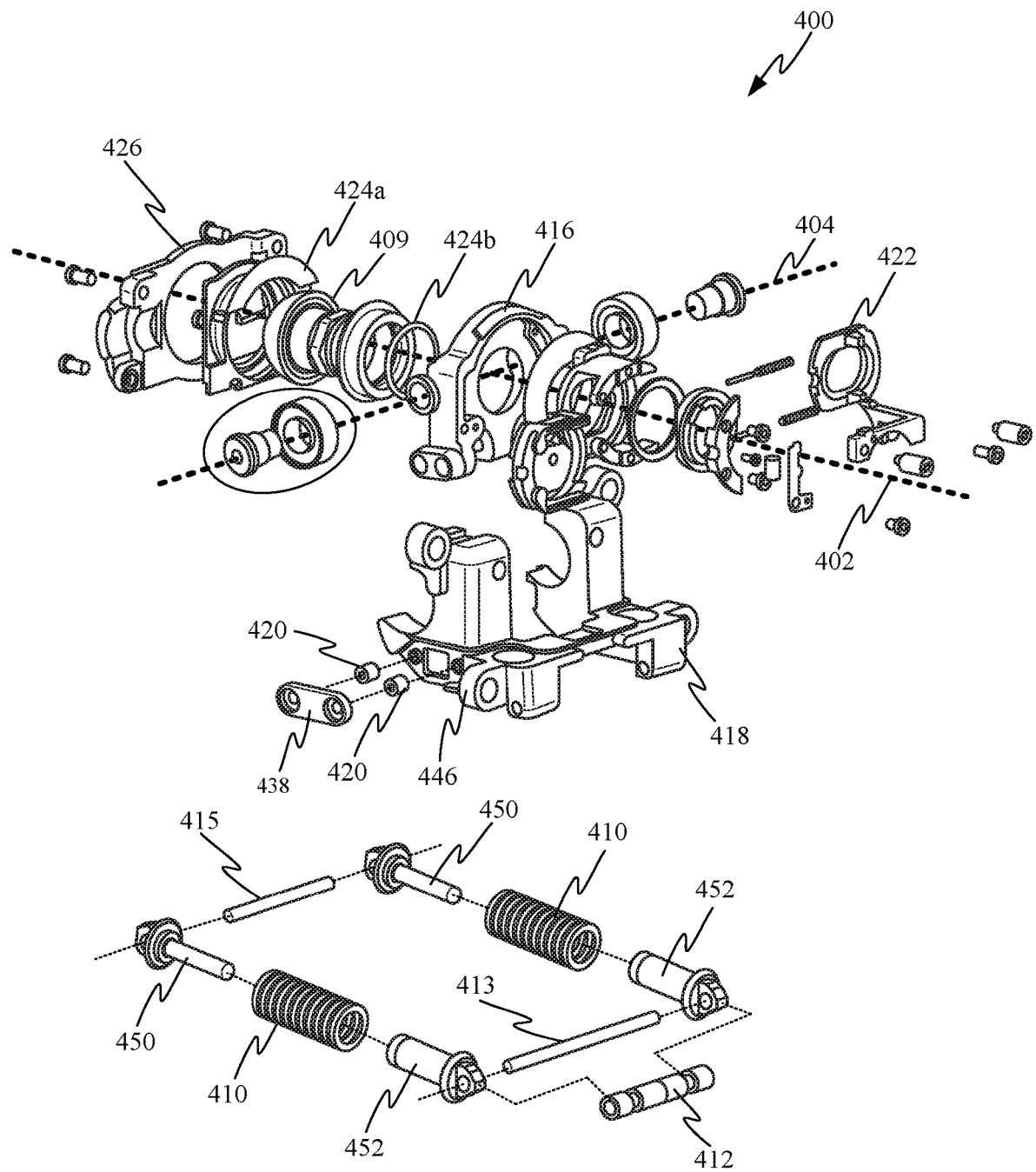
FIGS. 4B and 4C are exploded perspective views of various components of the pivot mechanism depicted in FIG. 4A.

One or more compression springs 410 can oppose rotation of the pivot mechanism 400 about the roll axis 404. The compression springs 410 can be held in place by one or more spacers 412 that can separate and prevent lateral movement of the compression springs 410. For example, as shown in FIG. 4B, the one or more spacers 412 can include multiple tubular sections that slide over a rod 413. Two compression springs 410 can be coupled to the spacer by an arrangement of pistons 450 as discussed below. Spacers 412 are not limited to the particular implementation shown in FIG. 4B. As an example, in some embodiments, spacer 412 can be a bar or similar component having two grooves formed therein at desired spaced apart locations for attachment of the springs.

In various embodiments, one or more connectors 414 can extend from the pivot mechanism 400 to electrically couple components attached to the pivot mechanism 400 with the headband assembly 302. For example, the connectors 414 can electrically couple the two earpieces 304 to one another via the headband assembly 302.

Figure 4C:
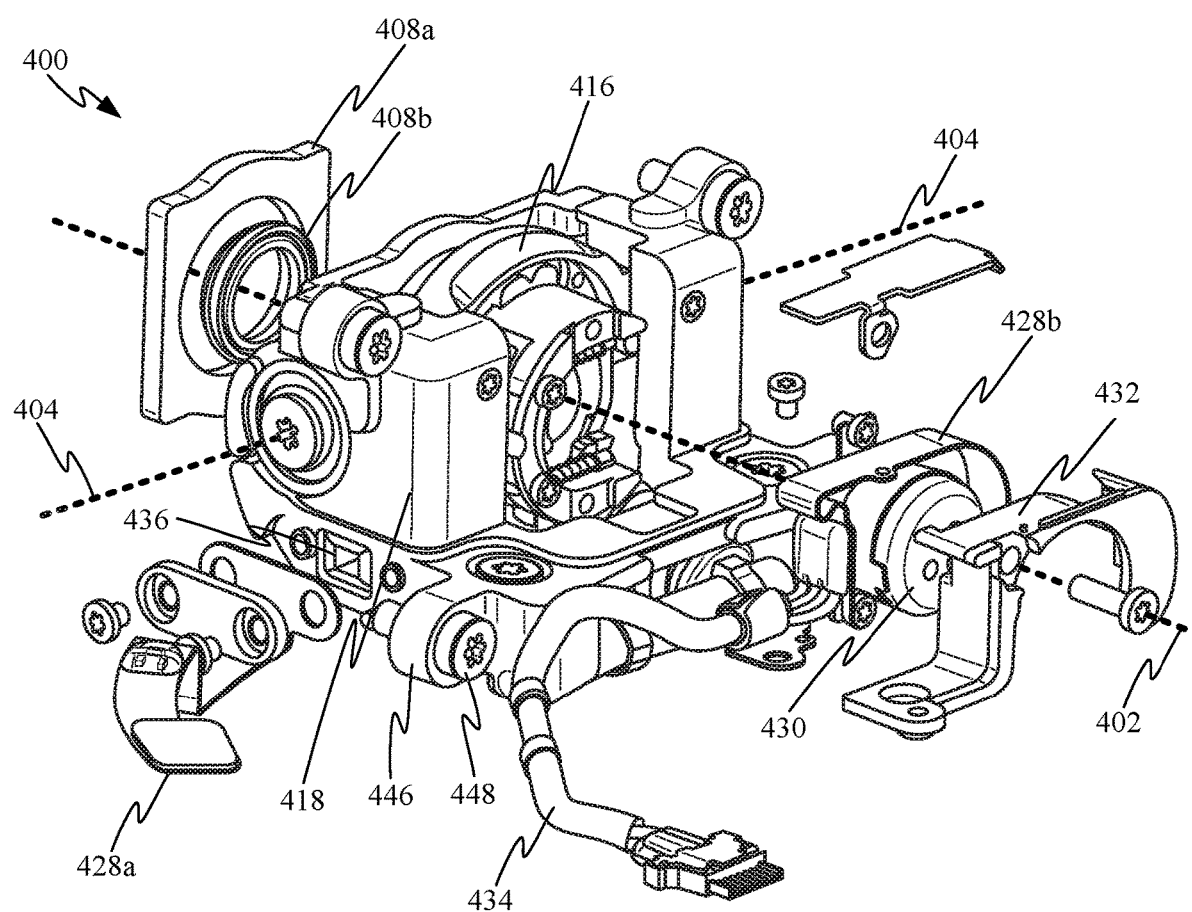

FIGS. 4B and 4C show various components of the pivot mechanism 400 in an exploded state. The pivot mechanism 400 can include a roll bar 416 and a base 418 that can act as a central hub to receive various components (base 418 is also visible in FIG. 4A). Base 418 can also include attachment portions 446 that enable pivot mechanism to be affixed to a housing of the earpiece by fasteners 448. Base 418 can receive magnets 420 that can cooperate with a sensor configured to determine whether the headphones 300 are donned or doffed (as described in more detail in reference to FIG. 4D). A latch plate 422 can also be positioned internally in the pivot mechanism 400 for securing a portion of the headband assembly 302 (as described in more detail in reference to FIGS. 5A and 5B).

Seals 424 can be positioned between the roll bar 416 and faceplate 426 (also visible in FIG. 4A) to seal the ingress of the pivot mechanism 400 from moisture and/or dust particles. For example, a dynamic seal 424a can be used to seal the ingress between the faceplate 426 and the roll bar 416. Similarly, an O-ring 424b can be positioned internally in the pivot mechanism 400 to provide an additional seal of the ingress. The dynamic seal 424a can include flexible material that allows for movement of the pivot mechanism, for example, movement about the roll axis 404. The seals 424a, 424b (collectively referred to herein as "seals 424") can be or include an elastomeric seal (e.g., silicone) and/or any suitable material for sealing the ingress against external particles and/or moisture.

FIG. 4C shows various electronic connectors that can be included in some embodiments of pivot mechanism 400. Various flex connectors 428 can be used for connecting various sensors in the pivot mechanism 400 with processing components. For example, flex connector 428a can be used to connect a Hall effect sensors with a processing component (as described in more detail in reference to FIG. 4D). Flex connector 428b can be used to connect a headband receptacle 430 with a processing component. Flex connector 428b can be a dynamic flex connector that can move in response to rotation of the pivot mechanism 400 (e.g., movement about the yaw axis 402). Flex connector shield 432 can be positioned within the pivot mechanism 400 to guide and/or protect the flex connector 420b during movement of the flex connector 420b. The flex connector 420b can be electrically coupled with a cable 434 that can allow for movement of the pivot mechanism 400 about the roll axis 404. For example, the cable 434 can have a length that allows the cable 434 to extend from a starting position as the pivot mechanism 400 moves about the roll axis 404.

Figure 4D:
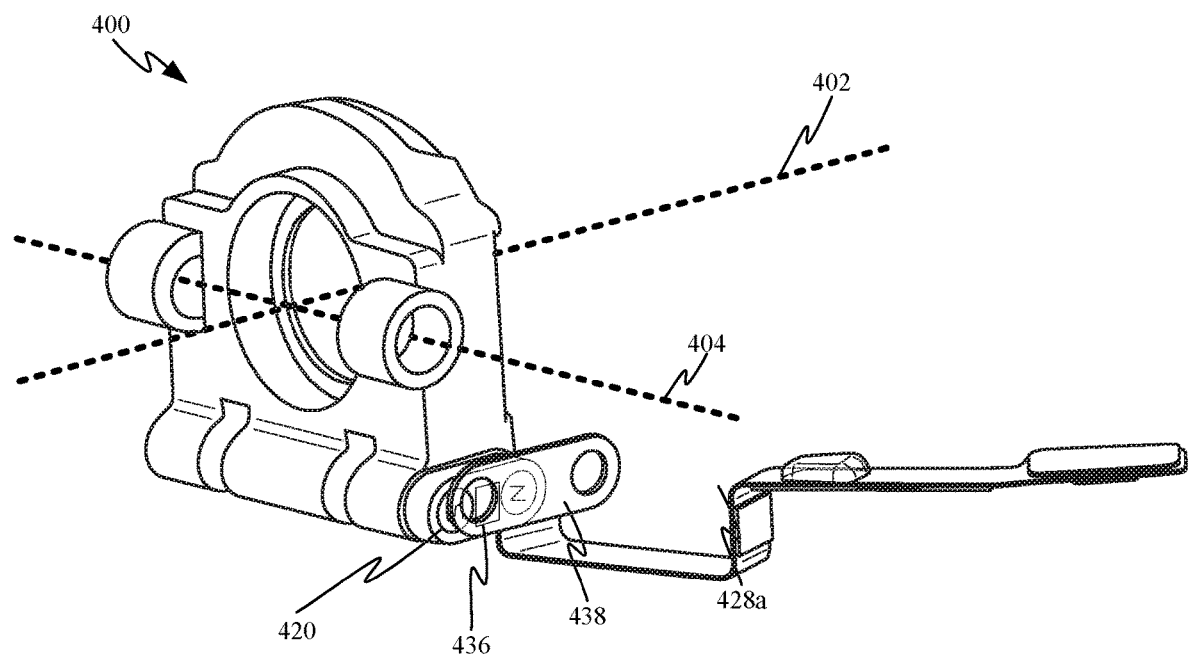
FIG. 4D shows a portion of the pivot mechanism depicted in FIG. 4A.

FIG. 4D shows the magnets 420 and a sensor 436 positioned in the pivot mechanism 400. The magnets 420 can be positioned with opposing orientations (e.g., a first magnet has the north pole oriented outward from the pivot mechanism 400 and a second magnet has the south pole oriented outward from the pivot mechanism 400). The opposing poles of the magnets 420 can create magnet flux that travels between the two magnets. The sensor 436 can be or include a Hall effect sensor and/or a sensor that can detect a change in the magnet flux generated by the magnets 420. The magnets 420 can rotate about the roll axis 404 (e.g. as the pivot mechanism 400 rotates about the roll axis 404) which can cause a change in the magnetic flux generated by the magnets 420. The sensor 436 can detect the change in the magnetic flux which can be used to determine that the pivot mechanism 400 is rotating about the roll axis 404. The sensor 436 can detect a change in the magnetic flux to determine when the headphones 300 are being donned or doffed by a user based on the pivot mechanism 400 rotating about the roll axis 404. For example, the user can cause the pivot mechanism 400 to rotate about the roll axis 404 when the earpieces 304 are being pulled apart from one another. Pulling the earpieces 304 apart from one another can indicate that the headphones 300 are being donned or doffed. A flux shield 438 can be positioned over the magnets 420 (e.g., between the magnets 420 and surrounding environment) to reduce or prevent the magnetic flux from exiting the pivot mechanism 400. For example, the flux shield 438 can reduce or prevent the magnetic flux from leaving the pivot mechanism 400 and interfering with electronic components positioned within the earpieces 304.

Figure 4E:
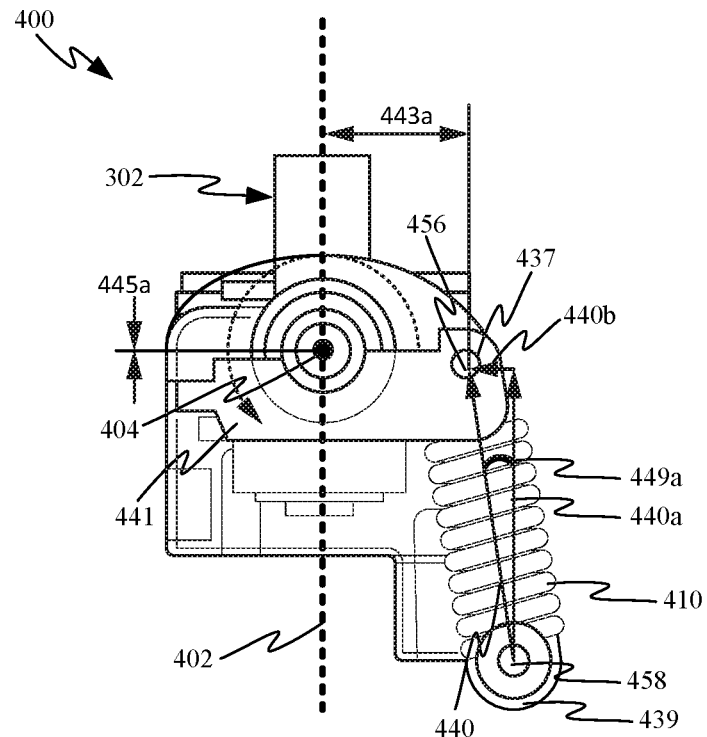
FIGS. 4E through 4G show cross-section views of the pivot mechanism depicted in FIG. 4A.
Figure 4F:
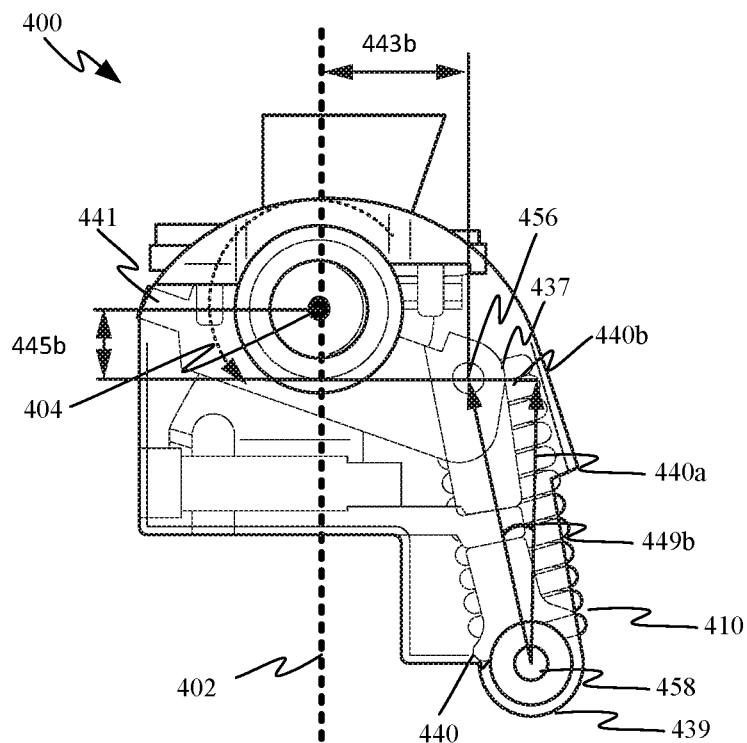

FIGS. 4E and 4F show a cross-sectional view of the pivot mechanism 400. FIG. 4E shows the pivot mechanism 400 in a relaxed position (e.g., a state where no torque is being applied to the pivot mechanism 400). For example, the pivot mechanism 400 can be in the relaxed state when the headphones 300 are doffed and/or when the headphones 300 are in a storage configuration. FIG. 4F shows the pivot mechanism 400 in a rotated position (e.g., a state where torque is applied to the pivot mechanism 400 and/or the headphones 300 are donned). For example, the pivot mechanism 400 can be in the rotated position when the earpieces 304 are being pulled apart from one another and/or when the headphones 300 are positioned on a user's head. Traditionally, the force needed to pivot the pivot mechanism 400 would continuously increase the further the pivot mechanism 400 pivoted away from the relaxed state (i.e., it is relatively easy to start rotation of the earpieces 304 but gets harder to rotate the earpieces 304 the further the earpieces 304 are rotated). In various embodiments described herein, the compression springs 410 can be mounted at an angle 449 relative to the yaw axis 402 that can allow the force needed to pivot the pivot mechanism 400 to remain relatively constant as the pivot mechanism is pivoted away from the relaxed state (i.e., the same force can be used to rotate the earpieces 304 regardless of their rotation position). The pivot force remaining relatively constant can enhance user comfort by having the same force applied to the user's head by the earpieces 304 for a variety of head sizes. For example, the force the earpieces 304 apply to a user with a large head will be the same as or similar to the force the earpieces 304 apply to a user with a smaller head.

The one or more compression springs 410 can be positioned to allow for rotation of the pivot mechanism 400 about the roll axis 404. As shown in FIGS. 4E and 4F, the roll axis 404 extends out of the page pointing straight at the viewer and is represented as a dot. The compression springs 410 can be preloaded with a force and positioned at an angle relative to the yaw axis 402. The force 440 from the compression springs 410 can be broken down into a vertical force vector 440a (i.e., the force in vertical direction) and 440b (i.e., the force in the horizontal direction).

The compression springs 410 can be attached at a first end 437 to a rotation beam 441 at a first pivot point 456. The first end 437 of the compression springs 410 can be attached to the rotation beam 441 at a horizontal distance 443 and a vertical distance 445 away from the roll axis 404. a second end 439 of the compression springs 410 can be attached to the base 418 at a second pivot point 458 (i.e., the compression springs 410 can span between the first pivot point 456 and the second pivot point 458). The compression springs 410 can be mounted at the first and second pivot points 456, 458 such that they are at an angle 449 relative to the yaw axis 402. The angle 449 can be in a range between 10 degrees and 80 degrees (e.g., 10 degrees, 20 degrees, 30 degrees, 40 degrees, 50 degrees, 60 degrees, 70 degrees, or 80 degrees).

For example, the angle 449 can be in a range between 15 degrees and 60 degrees. In various embodiments, the compression springs 410 can be preloaded with a force before being mounted to the first and second pivot points 456, 458.

When the pivot mechanism 400 is in a relaxed position, the compression springs 410 can be in a position shown by FIG. 4E. For example, with the compression springs 410 having a first end 437 a horizontal distance 443*a* and a vertical distance 445*a* away from the roll axis 404 and at an angle 449*a* relative to the yaw axis 402. The torque generated by the compression springs 410 is the result of the vertical force vector 440*a* multiplied by the horizontal distance 443 and the horizontal force vector 440*b* multiplied by the vertical distance 445. In various embodiments, the horizontal force vector 440*b* can be approximately in line with the roll axis 404 (i.e., the vertical distance 445 is approximately zero) and the resulting torque can be approximately zero. The vertical force vector 440*a* multiplied by the horizontal distance 443*a* can result in a resistance torque that can resist movement of the pivot mechanism 400.

Torque can be applied to the pivot mechanism 400, causing the pivot mechanism 400 to rotate about the roll axis 404 causing rotation of the roll bar 416. The rotation beam 441 can be attached to the roll bar 416 such that rotation of the roll bar 416 about the roll axis 404 causes rotation of the rotation beam 441 about the roll axis 404. In various embodiments, the rotation beam 441 and the roll bar 416 can rotate in a range of approximately 10 degrees to approximately 30 degrees about the roll axis 404. For example, the rotation beam 441 and the roll bar 416 can rotate approximately 20 degrees about the roll axis 404.

As the rotation beam 441 rotates about the roll axis 404, the first end 437 of the compression springs 410 can move a vertical distance away from the roll axis 404. In the resulting rotated position, as shown in FIG. 4F, the compression springs 410 can have the first end at a horizontal distance 443*b* and a vertical distance 445*b* away from the roll axis 404 and at an angle 449*b* relative to the yaw axis 402. The compressions springs 410 can generate a greater force opposing rotation due to the increased compression of the compression springs 410. The horizontal force vector 440*b* can be positioned a vertical distance 445*b* away from the roll axis 404 which can result in a torque that opposes (i.e., subtracts from) the increased torque caused by the compression of the compression springs 410. In various embodiments, the torque generated by the horizontal force vector 440*b* being positioned a vertical distance 445*b* away from the roll axis is approximately equal to the increased force from the compression of the compression springs 410. The force needed to rotate the pivot mechanism 400 about roll axis 404 can remain approximately the same regardless of the pivot position of the pivot mechanism 400 (i.e., the force used to rotate the pivot mechanism 400 about the roll axis 404 does not need to significantly increase as the pivot mechanism 400 moves away from the relaxed state).

Figure 4G:
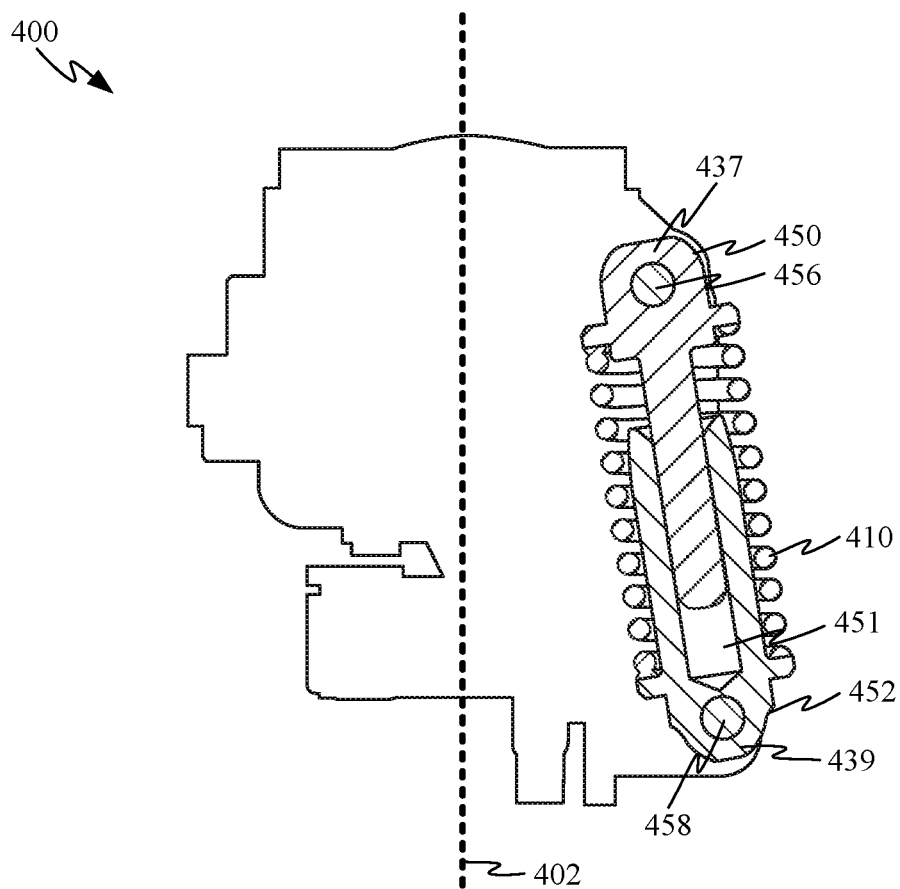
Figure 4H:
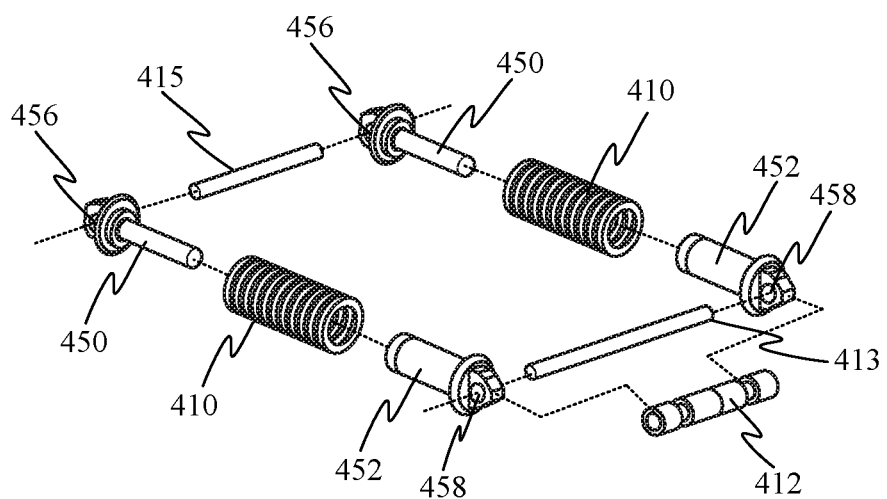
FIG. 4H is an exploded perspective view of various components of the pivot mechanism depicted in FIG. 4A

FIG. 4G shows a cross-sectional view of a compression spring 410 and FIG. 4H shows an exploded view of the compression spring 410. The compression spring 410 can include a piston 450 that fits within a channel 451 of cylinder 452. Both piston 450 and cylinder 452 are at least partially surrounded by compression spring 410 (e.g., a portion of the piston 450 and the cylinder 452 extend past the length of the compression spring 410). The piston 450 and cylinder 452 can each be attached to pivot mechanism 400 at respective pivot points 456 and 458. The piston 450 can engage with the cylinder 452 (e.g., the piston 450 can fit within the channel 451 of cylinder 452) and slide relative to the cylinder 452 as the pivot mechanism 400 rotates. The piston 450 engaged with the cylinder 452 can reduce or prevent the compression springs 410 from shifting laterally as the compression springs 410 compress in response to the pivot mechanism 400 rotating. For example, the piston 450 engaged with the cylinder 452 can prevent the compression springs 410 from bending and/or bowing in a lateral direction. In some embodiments, the piston 450 can engage with the cylinder 452 to provide additional resistance to the rotation of the pivot mechanism 400. For example, the cylinder 452 can provide resistance to the sliding of the piston 450.

Each pivot point 456 and 458 can be or include a bar (e.g., rod 415 or rod 413) that allows for rotation of the piston 450 and cylinder 452 around the respective pivot point. For example, first pivot point 456 can be or include rod 415 while second pivot point 458 can be or include rod 413. The piston 450 can slide into and out of the cylinder 452 as the pivot mechanism 400 pivots and can prevent the compression spring 410 from bowing (e.g., bending) during compression.

Figure 4I:
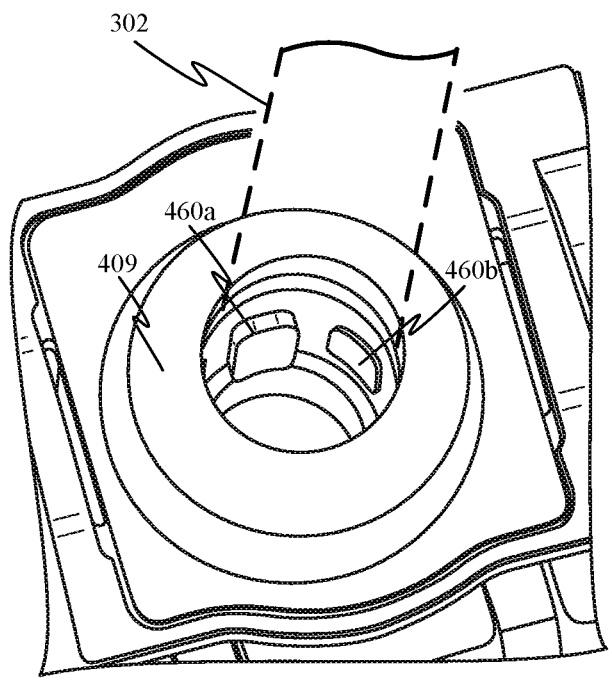
FIG. 4I is a perspective view of a portion of the pivot mechanism depicted in FIG. 4A.

The pivot mechanisms 400 can attach to headband assembly 302 via collar 409. FIG. 4I shows the pivot mechanism 400 with the headband assembly 302 positioned in collar 409. The collar 409 can define the aperture 406 that can receive the headband assembly 302. The collar 409 and/or the headband assembly 302 can include orientation elements 460 that can orient the headband assembly 302 and prevent rotation of the headband assembly 302 relative to the collar 409 when the headband assembly 302 is inserted into the collar 409. The orientation elements 460 can be positioned on an inner surface of the collar 409 and extend into the aperture 406. The orientation elements 460 can engage with the headband assembly 302 to position the headband assembly 302 in the collar 409 (e.g., generally align the headband assembly 302 coaxially with the collar 409 and/or orient the headband assembly 302 relative to the collar 409). The orientation elements 460 can be or include metal, rubber, or a similar suitable material.

Figure 4J:
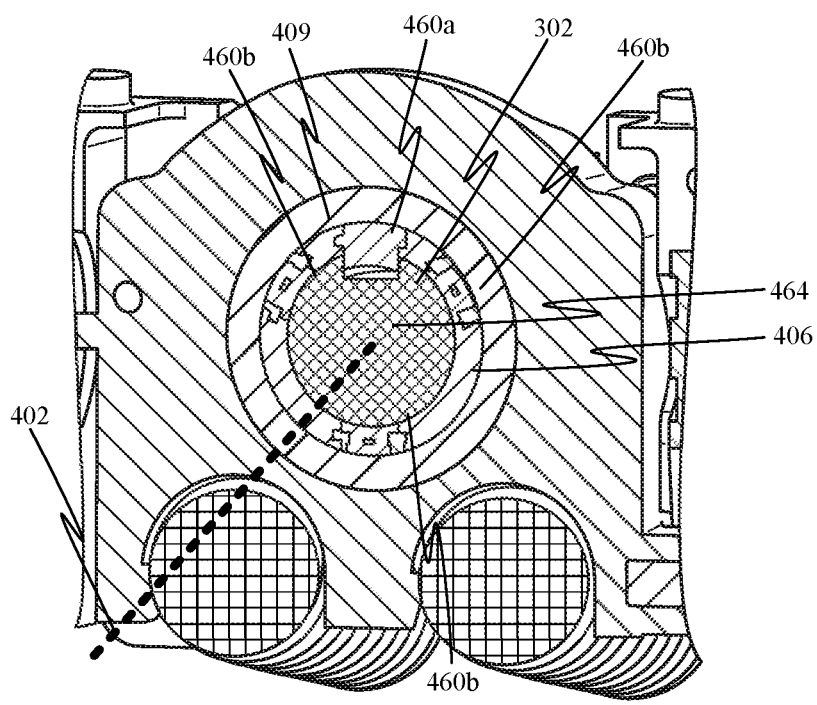
FIG. 4J is a cross-section of a portion of the pivot mechanism depicted in FIG. 4A.

FIG. 4J shows a cross-section of the pivot mechanism 400 with the headband assembly 302 positioned in the collar 409 of FIG. 4I. In various embodiments, the orientation elements 460 can be or include a keyway 460*a* and/or one or more bumpers 460*b*. The keyway 460*a* can engage with a notch 462 in the headband assembly 302. The keyway 460*a* can orient the headband assembly 302 relative to the collar 409 and prevent the headband assembly 302 from rotating relative to the collar 409. The keyway 460*a* can allow the headband assembly 302 to be inserted into the collar 409 in only one orientation (e.g., with the notch 462 aligned with the keyway 460*a*). The notch 462 engaged with the keyway 460*a* can prevent the headband assembly 302 from rotating relative to the collar 409. The bumpers 460*b* can aid in positioning the headband assembly 302 in the collar 409. For example, the bumpers 460*b* can generally align the center of the inserted portion 464 of the headband assembly 302 with a central axis of the collar 409 (i.e., yaw axis 402).

Removable Earpieces

In various embodiments, the earpieces 304 can be removably attached to the headband assembly 302. For example, a user may want to have two or more sets of earpieces 304 of different colors or different designs. As another example, a user may want to have earpieces with audio components particularly designed or calibrated for different types of music (e.g., classical music versus electronic music genre)

or other uses. As still another example, a user may want to remove the earpieces for a more compact storage option for the headphones.

Figure 5A:
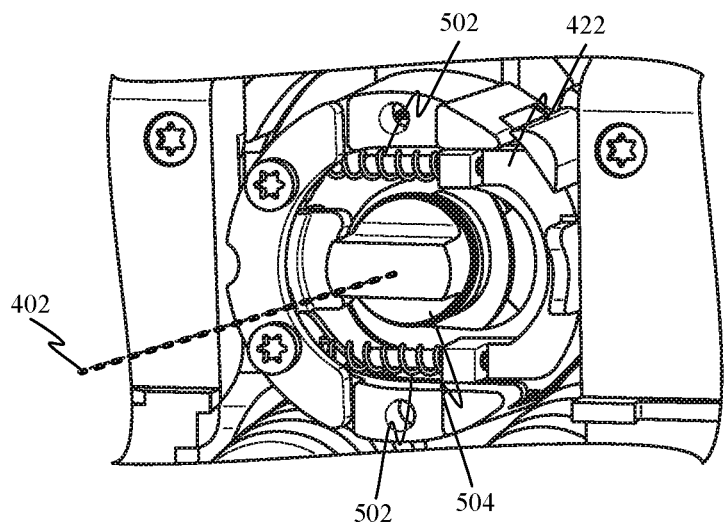
FIGS. 5A through 5D show a locking mechanism for attaching earpieces to a headband stem in accordance with some embodiments.
Figure 5B:
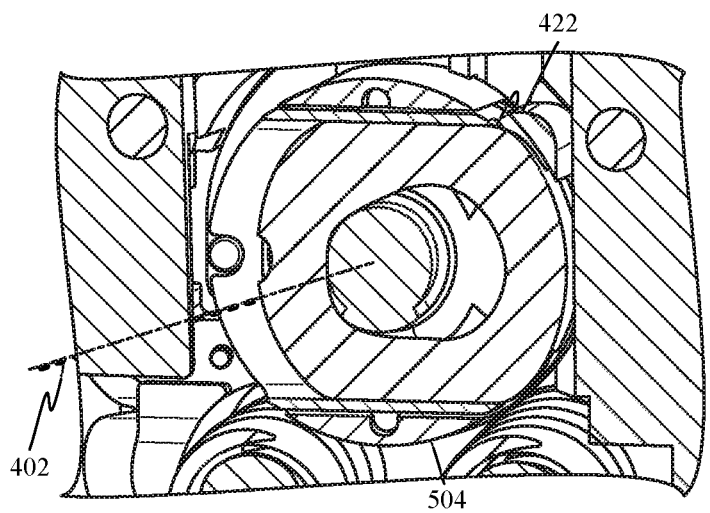

Some embodiments enable earpieces 304 to be removed by a user for storage and/or to be replaced with another set of earpieces. In some embodiments, the earpieces 304 can be attached using a latching mechanism that is somewhat difficult for a user to unlatch such that the earpieces are unlikely to become detached accidentally. For example, the latch plate 422 (shown in FIG. 5C) can be used to connect headband assembly 302 to pivot mechanism 400. FIG. 5A shows the latch plate 422 in the latched position. In the latched position, latch plate 422 can be held in position with compression springs 502, and can prevent the stems 504 of headband assembly 102 from being removed from the pivot mechanism 400. As shown in FIG. 5D, the stems 504 can include a notched portion 506 with a smaller diameter that engages with the latch plate 422 when the latch plate 422 is in the latched position.

Figure 5C:
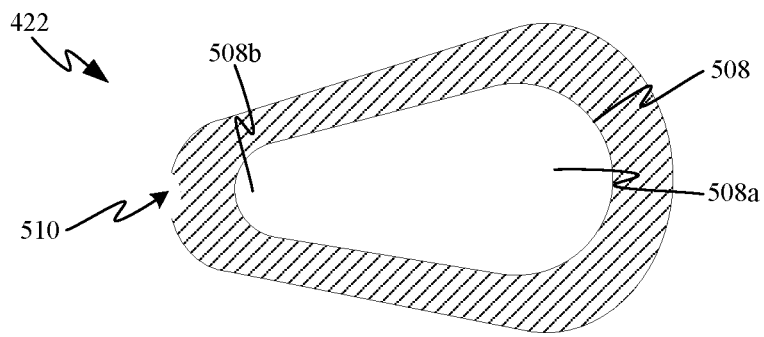
Figure 5D:
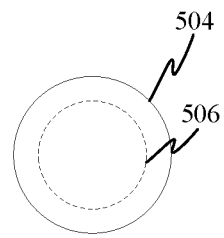

As shown in FIG. 5C, the latch plate 422 can include an opening 508 (e.g., an asymmetrical opening) that is wider than the diameter of the stems 504 on a first end 508a and approximately the same diameter as the notched portion of the stems 504 on a second end 508b (i.e., the second end 508b can have a diameter that is smaller than the diameter of the un-notched portion of the stems 504). In various embodiments, the latch plate 422 can engage with and hold the stems 504 in position by positioning the latch plate 422 to allow the stems 504 to be inserted through the first end 508a of the opening. The latch plate 422 and/or the stems 504 can be moved in a lateral direction until the stems 504 are positioned at the second end 504b of the opening (e.g., until a portion of the latch plate 422 is engaged with the notched portion 506 of the stems 504). The stems 504 can be held in place by the latch plate 422 because the diameter of the stems 504 are too large to fit through the second end 508b of the opening (e.g., the stems 504 can't be pulled through the second end 508b of the opening of the latch plate 422). In some embodiments, the latch plate 422 is moved to position the stems 504 at the send end of the opening by compression springs 502. The compression springs 502 can apply a constant force to the latch plate 422 to hold the latch plate 422 in place (e.g., prevent the latch plate 422 from moving to a position that allows the stems 504 to removed).

FIG. 5B shows the stems 504 unlatched from the latch plate 422. The stems 504 can be unlatched (i.e., removed) from the latch plate 422 by moving the latch plate 422 in a lateral direction until the stem 504 is positioned at the first end 504a. The stems 504 can then be removed from the opening 508 (e.g., by pulling the stems out of the opening 508). Unlatching the stems 504 from the latch plate 422 can allow the stems 504 to be removed from the pivot mechanism 400 and/or the earpieces 304. In various embodiments, the latch plate 422 can include an engagement point 510 for engaging with a pivot tool. The pivot tool can be used to move the latch plate 422 in a lateral direction from the latched position to the unlatched position. The pivot tool can be or include a tool that is external to the earpieces 304. For example, the external pivot tool can engage with the engagement point 510 via an opening in the earpieces 304. However, the pivot tool can be or include an internal mechanism that engages with the latch plate 422.

FIGS. 6A through 6D show another example latching mechanism 600 that can be used to connect headband assembly 302 to pivot mechanism 400. Latching mechanism 600 can create an essentially permanent coupling between an earpiece and stem such that the earpiece cannot be readily removed by a user. Advantageously, however, latching mechanism 600 allows a manufacturer to, for example, assemble headbands and earpieces separately, test the earpieces using appropriate equipment before attaching them to a headband, and then, if a given earpiece meets the manufacturer's requirements, attach the earpiece in an essentially permanent manner to the headphones.

In some embodiments the latching mechanism 600 can be a semi-circular piece of material that can be expanded and return to its original shape (i.e., the latching mechanism 600 can be deformed and return to its original shape). The latching mechanism 600 can be or include steel, plastic, aluminum, or any suitable material that allows it to return to a relaxed state after being compressed. The latching mechanism 600 can have a relaxed diameter that is smaller than the diameter of the stem 604 and can be expanded to have a diameter approximately equal to the diameter of the stem 604. The latching mechanism 600 can be inserted into aperture 406 defined by collar 602 prior to the stem 604 being inserted into the aperture 406. Collar 602 can be representative of collar 409 shown in FIGS. 4A, 4B The stem 604 can engage with the latching mechanism 600 and move (e.g., push) the latching mechanism down the collar 602. The stem 604 can include a tapered edge 606 that can engage with the latching mechanism 600 to push the latching mechanism 600 down the collar 602. The stem 604 can also include a notch 608 with a diameter that is smaller than the diameter of the stem 604. In various embodiments, the notch 608 can have a diameter that is approximately the same as the diameter of the latching mechanism 600 in the relaxed state.

Figure 6A:
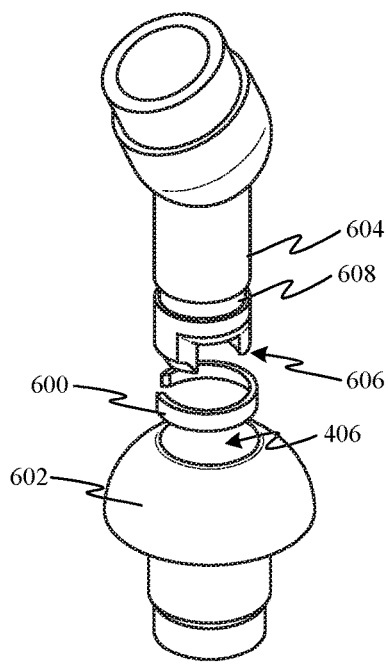
FIGS. 6A through 6D show another locking mechanism for attaching earpieces to a headband stem in accordance with some embodiments.
Figure 6B:
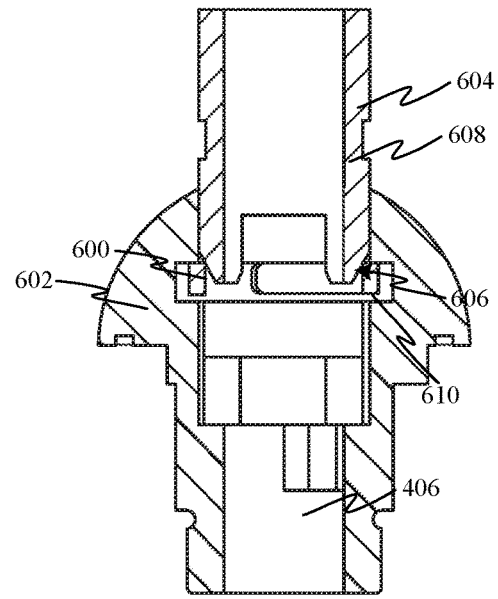
Figure 6C:
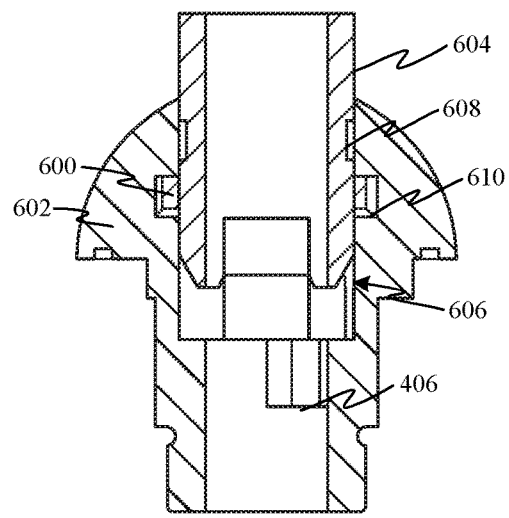
Figure 6D:
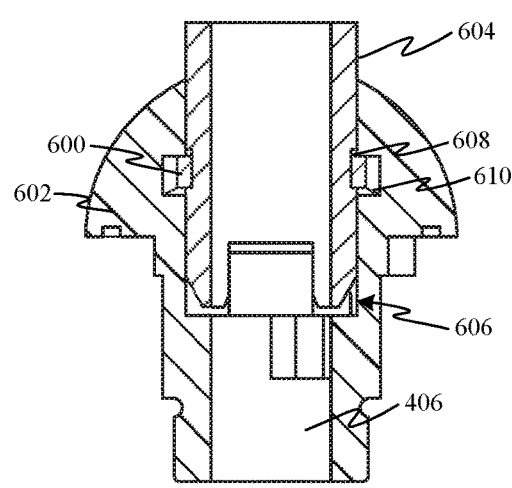

FIGS. 6B through 6D show a cross-section view of the latching mechanism 600 and stem 604 inserted into collar 602. The latching mechanism 600 can be moved down the collar 602 until it reaches a recess 610 in the collar 602. FIG. 6C shows the latching mechanism 600 expanded into the recess 610. The tapered edge 606 can expand the latching mechanism 600 into the recess 610 as the stem 604 is moved down the collar 602. The latching mechanism 600 can remain expanded in the recess 610 by the stem 604 which has a diameter larger than the relaxed diameter of the latching mechanism 600. The stem 604 can continue to move down the collar 602 while the latching mechanism 600 remains in the recess 610 until the stem 604 is seated into the collar 602 and/or the notch 608 is generally aligned with the latching mechanism 600. FIG. 6D shows the latching mechanism 600 secured in place on the notch 608. The latching mechanism 600 can contract and engage the notch 608 when the notch 608 has been moved down the collar 602 and aligned with the latching mechanism 600. The latching mechanism 600 can extend into recess 610 when engaged with the notch 608 and prevent the stem 604 from being removed from the collar 602 or make removal by a user extremely difficult. For example, removal of the stem 604 from the collar 602 can require sheering the latching mechanism 600. In various embodiments, a tool can be inserted into the aperture 406 and used to disengage the latching mechanism 600 from the notch 608 and expand the latching mechanism 600 into the recess 610. The stem 604 can then be removed from the collar 602.

Cantilevered Support Member for Earpads

Figure 7:
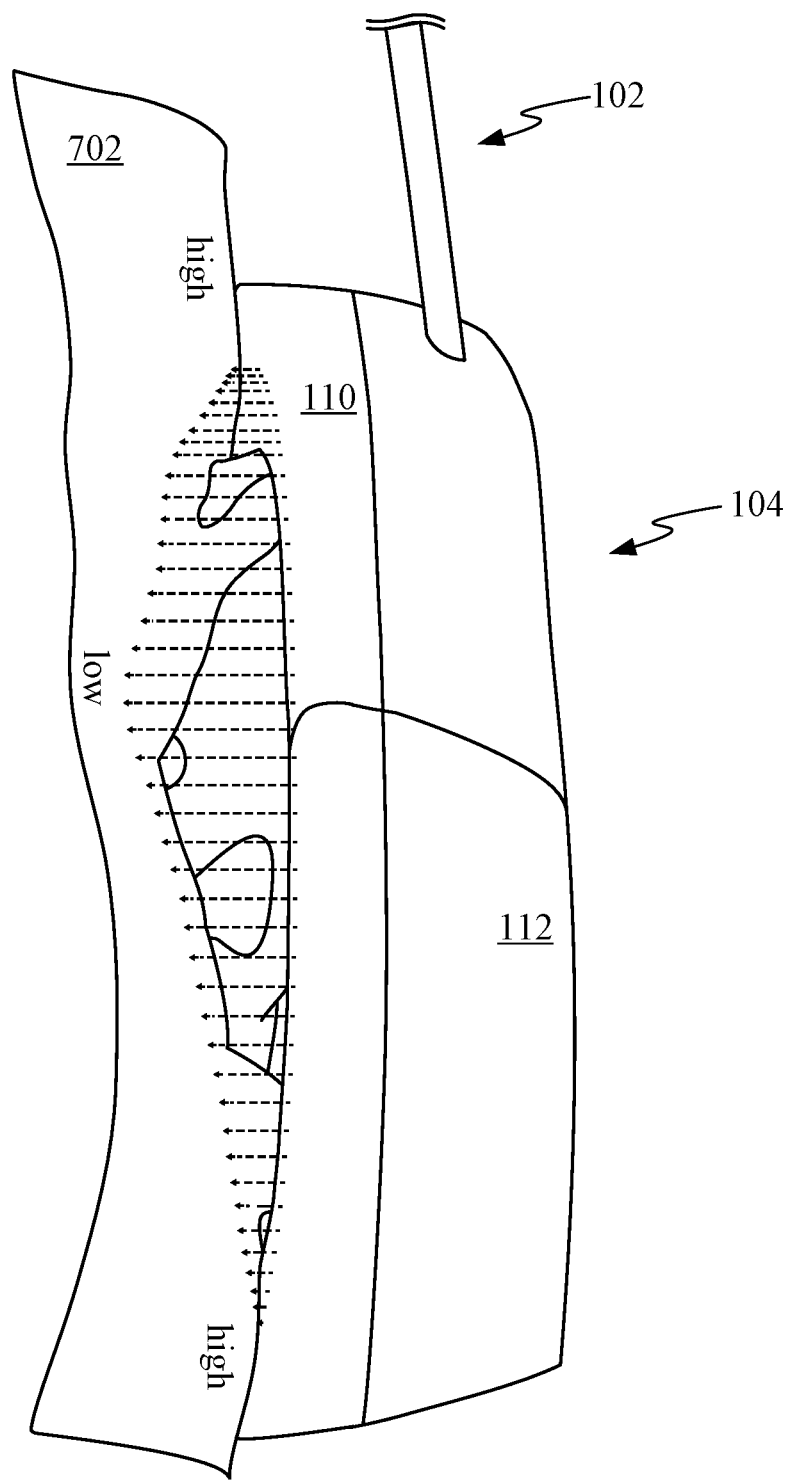
FIG. 7 shows a perspective view of an earpiece contacting the side of a user's head.

FIG. 7 shows a perspective view of an earpiece 104 contacting the side of a user's head 702. This figure illustrates how the side of the user's head 702 can vary greatly. One reason earpiece cushion assemblies tend to be robust in thickness is to accommodate large varieties of cranial contours commonly found on the side of the user's head.

Dashed lines depicted in FIG. 7 illustrate the variance in distance earpiece cushion assemblies 110 need to overcome to conform with the cranial contours so that audio waves can be prevented from entering or leaving an area immediately adjacent to the user's ear. The conventional solution to this is to make earpiece cushion assembly 110 thick enough to accommodate the depicted variance for a majority of user's. It should be noted that while FIG. 7 illustrates a gradual change in contour, some cranial contours could be much more abrupt. For example, some users can have protruding bones that create rapid changes in a curvature of an exterior surface of a user's head.

Figure 8A:
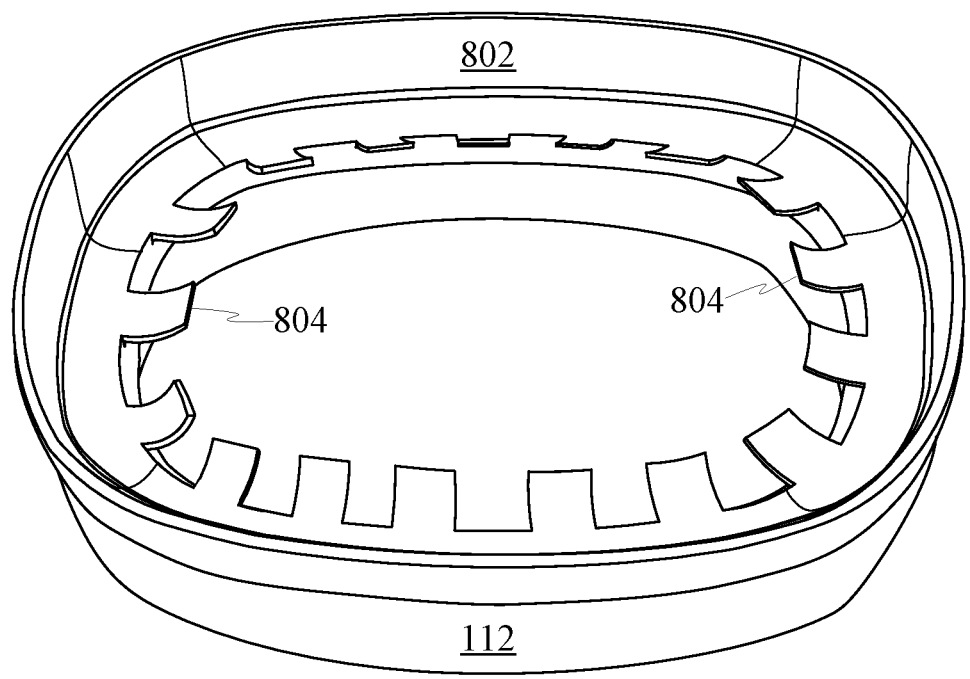
FIG. 8A shows a perspective view of an earpiece housing and cushion frame configured to support an earpiece cushion according to some embodiments of the disclosure.

FIG. 8A shows a perspective view of an earpiece housing 112 and cushion frame 802 configured to support an earpiece cushion according to some embodiments. Cushion frame 802 can include a support structure that includes multiple radially distributed cantilevered support members 804 protruding toward a central region of cushion frame 802 and capable of moving independently from adjacent ones of cantilevered support members 804. A curvature of cantilevered support members 804 can be curved upward and away from earpiece housing 112 to match a curvature of an earpiece cushion. Cantilevered support members 804 can be particularly helpful in reinforcing portions of the earpiece cushion positioned closer to the central region of cushion frame 802.

While cantilevered support members are shown separated from adjacent cantilevered support members by in some cases as much as their own width, it should be appreciated that in some configurations cantilevered support members can be much closer. For example, cantilevered support members 804 could be separated by a space just large enough to prevent interference between adjacent cantilevered support members during deflection of one or more of cantilevered support members 804.

Figure 8B:
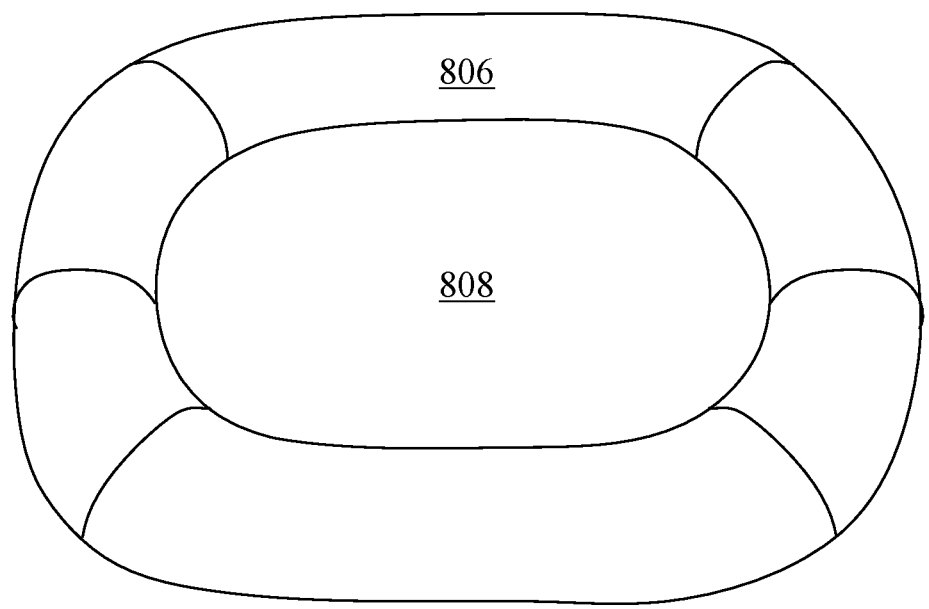
FIG. 8B shows a perspective view of an earpiece cushion suitable for use with the earpiece housing and cushion frame depicted in FIG. 8A.

FIG. 8B shows a perspective view of earpiece cushion 806 suitable for use with the earpiece housing 112 and cushion frame 802 depicted in FIG. 8A. As depicted, earpiece cushion 806 has an annular geometry that defines a central opening 808 sized to receive a user's ear. In some embodiments, earpiece cushion 806 can be formed by performing a subtractive machining operation on a block of open cell foam. Alternatively, earpiece cushion 806 can be formed by an injection molding operation. It should be noted that other elastic materials aside from foam can be used to form earpiece cushion 806, including for example, latex and silicon materials. A resulting thickness of earpiece cushion 806 can be between about a quarter and half an inch.

Figure 8C:
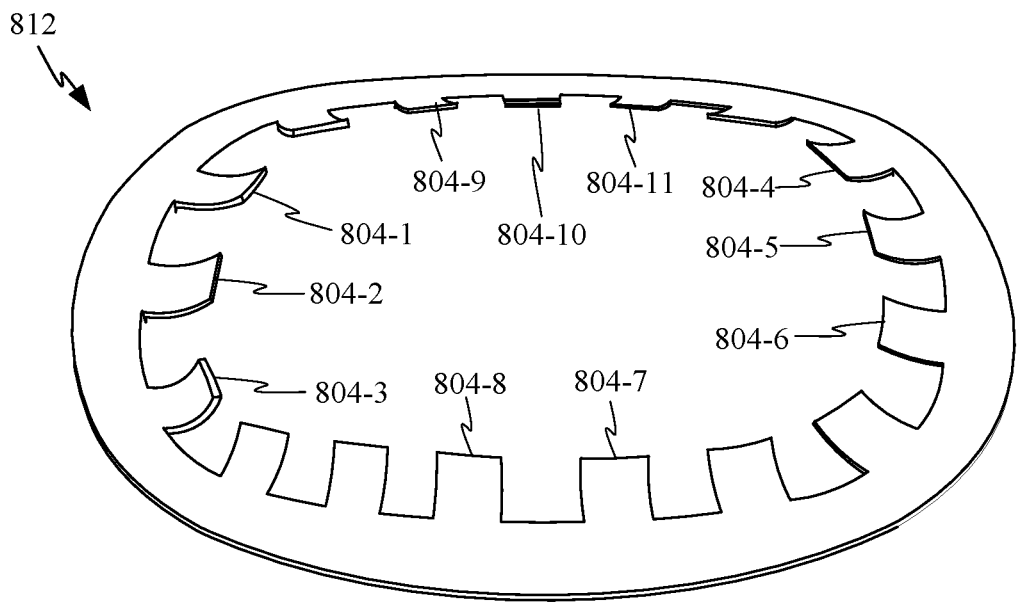
FIG. 8C shows an embodiment in which a support structure that can take the form of an insert that is not integrally formed with a cushion frame as depicted in FIG. 8A.

FIG. 8C shows a discrete support structure 812 that can take the form of an insert and is not integrally formed with cushion frame 802 as was shown in FIG. 8A. Instead, support structure 812 can sit atop or could be adhered to cushion frame 802. In some embodiments, cantilevered support members 804 can vary in length and/or thickness. A thickening or thinning of particular ones of cantilevered support members 804 could be performed in order to customize a response of support structure 812 for a particular user or class of users. Making support structure 812 in the form of an insert makes user customization much more feasible as support structure 812 could be 3D printed from a polymer or other deformable material after measuring a user's head to achieve a custom fit. For a user with cranial contours similar to those shown in FIG. 7, cantilevered support members 804-1 to 804-6 could include less reinforcement as these cantilevered support members 804 could be expected to undergo larger than normal amounts of bending due to the larger cranial contours immediately above and below an ear of a user. Cantilevered support members 804-7 to 804-11 could include more reinforcement as these cantilevered support members 804 could be expected to undergo a much lower amount of bending due to those cantilevered support members 804 being positioned over a more recessed portion of the user's head.

Figure 8D:
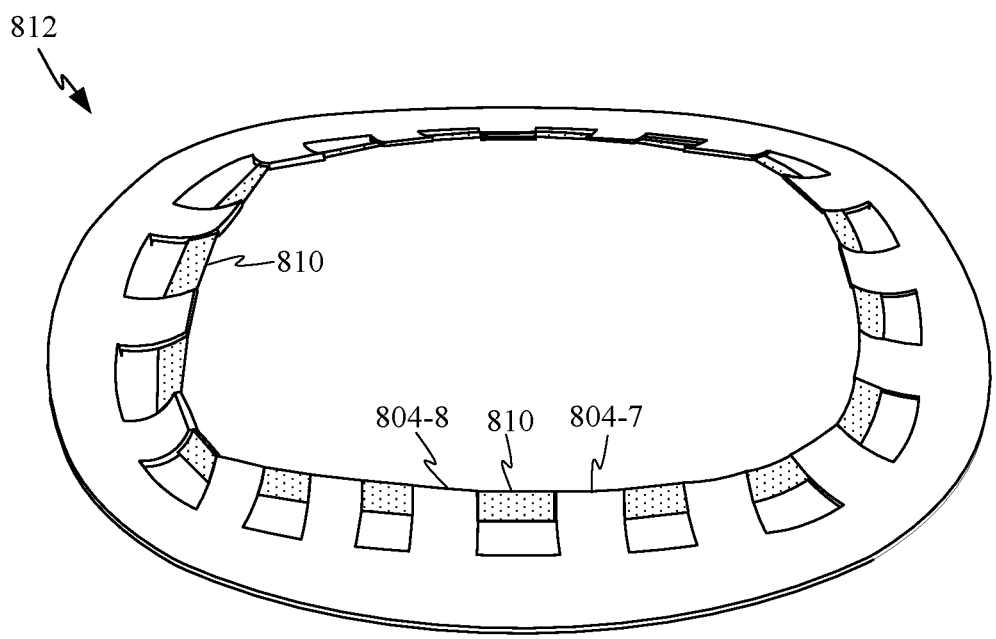
FIG. 8D shows how the support structure depicted in FIG. 8C can include webbing that creates a loose mechanical coupling between adjacent cantilevered support members.

FIG. 8D shows how in some embodiments support structure 812 can include webbing 810 that creates a loose mechanical coupling between adjacent cantilevered support members 804. In particular, webbing 810 is shown stretching between adjacent cantilevered support members 804-7 and 804-8. This allows for a curvature of earpiece cushion assembly 110 to be partially constrained. For example, when cantilevered support member 804-7 undergoes a substantial amount of deflection to accommodate a particularly prominent cranial contour but cantilevered support member 804-8 does not contact that particular cranial contour, webbing 810 can distribute a portion of the force being localized on cantilevered support member 804-7 to cantilevered support member 804-8. By distributing the force in this manner, excessive shearing forces that could result in fatigue or fracture of earpiece cushion 806 or other components adjacent to support structure 812 can be avoided.

A strength and/or stiffness of the material used to form webbing 810 can be selected to achieve a desired amount of force transfer between adjacent cantilevered support members 804. In general, the webbing 810 will be more compliant than the material used to form cantilevered support members 804. Examples of possible stretchy materials for linking adjacent cantilevered support members 804 include woven polyester, spandex and the like. In some embodiments, webbing 810 can be made up of a more rigid material/fabric but a desired amount of slack can be left between adjacent cantilevered support members, thereby only distributing forces to adjacent cantilevered support members 804 once a threshold amount of deflection is experienced. In other embodiments, webbing could take the form of an elastic cord running through openings in each of cantilevered support members 804 or having a discrete cord between each of cantilevered support members 804. Webbing 810 can include pockets that fit over the end of each of cantilevered support members 804 to help couple cantilevered support members 804 together. Alternatively, webbing 810 can be adhesively coupled to adjacent cantilevered support members 804. In some embodiments, webbing 810 can only be positioned between select ones of cantilevered support members 804. For example, cantilevered support members 804 on a lateral side of earpiece 104 could all be connected but webbing could be omitted from cantilevered support members 804 on a top side of earpiece 104. In some embodiments, webbing 810 can include padding that helps mask the presence of discrete cantilevered support members 804 when an owner of headphones 100 runs a finger along an inside edge of earpiece cushion assembly 110.

Figure 9A:
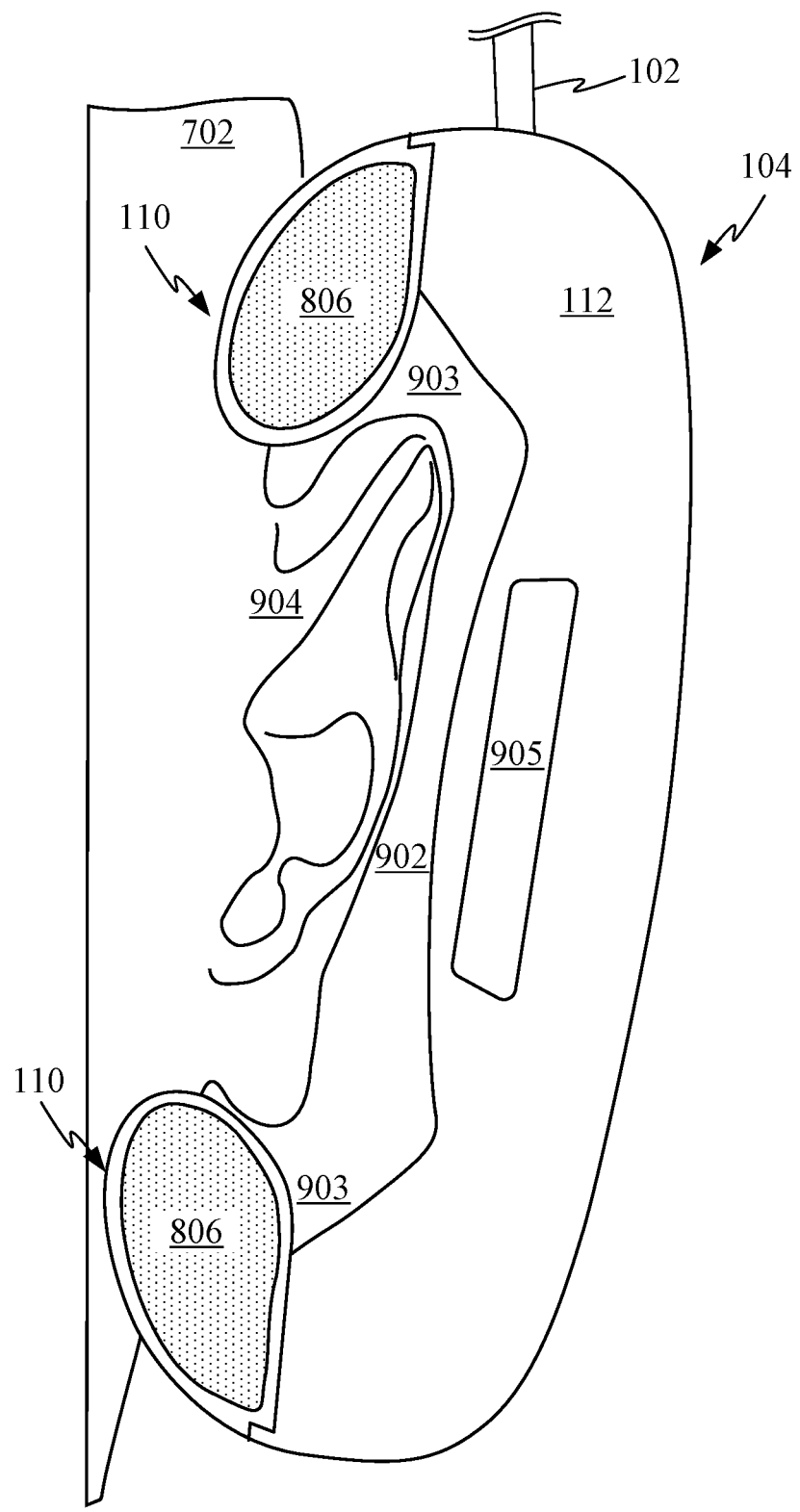
FIG. 9A shows a simplified cross-sectional view illustrating how an earpiece defines a cavity sized to receive an ear of a user.

FIG. 9A shows a simplified cross-sectional view illustrating how earpiece 104 defines a cavity 902 sized to receive an ear 904 of user 702. An interior facing surface of earpiece cushion assembly and an adjacent interior surface of earpiece housing 112 operate to form an undercut 903 sized to accommodate a helix and lobule of ear 904 of user 702. Headband assembly 102 typically includes a spring (e.g. a leaf spring) tuned to impart enough force to compress earpiece 104 sufficiently for earpiece cushion assembly to form an acoustic seal with an exterior surface of the head of user 702. Cavity 902 is cooperatively defined by earpiece housing 112 and earpiece cushion assembly 110. As depicted, an undercut 903 of cavity 902 accommodates and leaves ample space for the helix and lobule of ear 904 of user 702. This undercut increases an amount of area of earpiece cushion assembly 110 contacting user 702 without unduly increasing an overall size of earpiece 104. The larger surface area of earpiece cushion assembly helps to evenly distribute the force exerted upon user 702 by headband assembly 102 through earpiece 104, thereby increasing the comfort of headphones 100. FIG. 9A also shows a location of acoustic driver 905 (i.e. speaker) within earpiece housing 112 and how it can be directed into cavity 902 and subsequently a canal of ear 904.

Figure 9B:
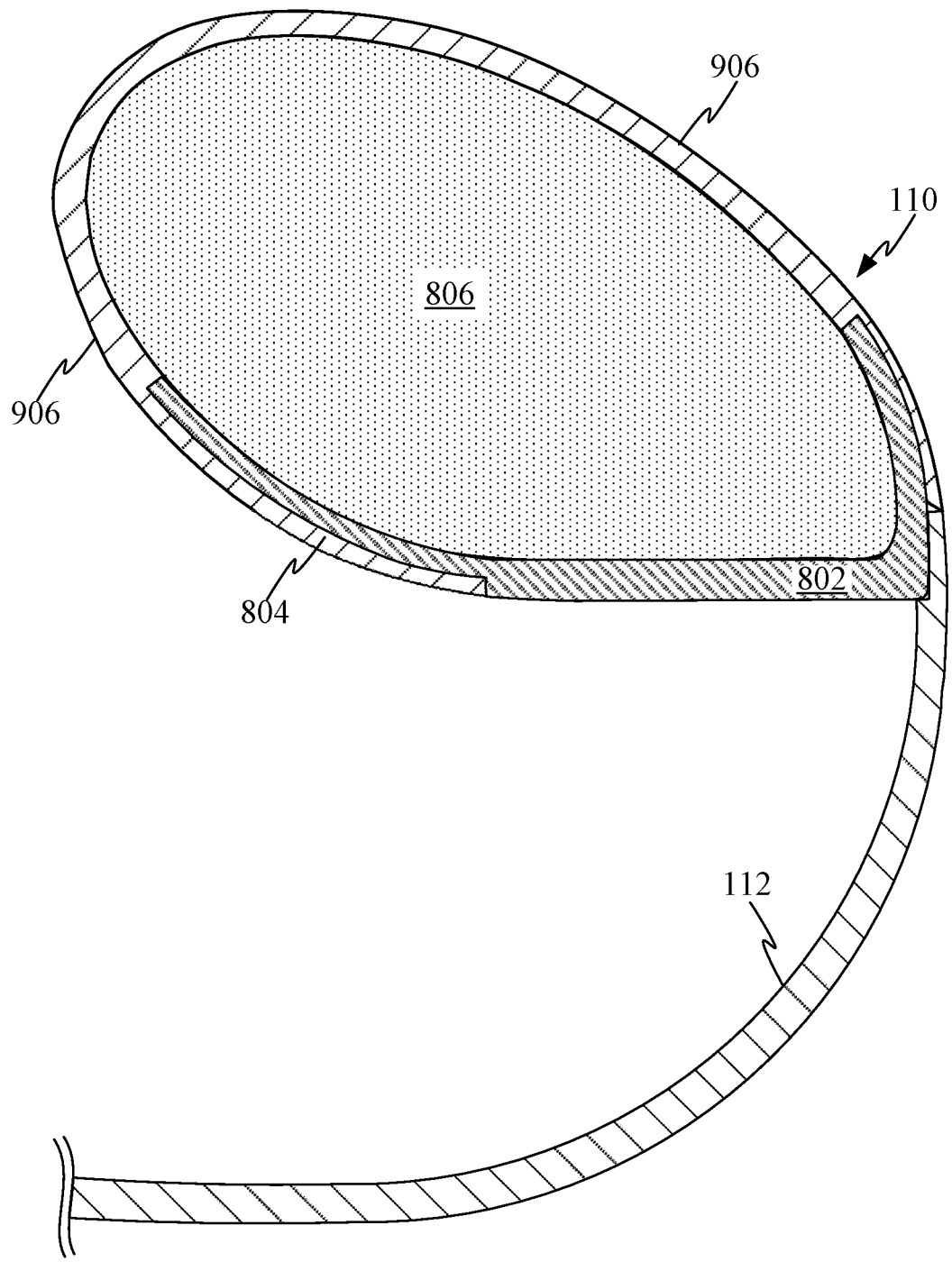
FIG. 9B shows a cross-sectional view of a portion of an earpiece that depicts one of cantilevered support members that is integrally formed with a cushion frame in accordance with some embodiments.

FIG. 9B shows a cross-sectional view of a portion of earpiece 104 that depicts one of cantilevered support members 804 that is integrally formed with cushion frame 802. Cushion frame 802 provides a channel within which earpiece cushion 806 is able to rest and be supported. Cantilevered support member 804 in particular helps to support is shown conforming to a downward facing surface of earpiece cushion 806 of earpiece cushion assembly 110. Earpiece cushion assembly 110 also includes a protective cover 906 wrapped around earpiece cushion 806 and can be formed from one or more layers of textile or leather. In addition to providing a luxurious and comfortable feel for earpiece cushion assembly 110, protective cover 906 also helps to mask the presence of cantilevered support members 804. Cantilevered support members 804 can have a resistance to deflection that results in earpiece cushion 806 being compressed prior to any of cantilevered support members 804 when earpiece 104 is initially pressed against the side of a user's head. In locations where earpiece cushion assembly 110 contacts a recessed portion of a user's head, one or more cantilevered support members 804 located proximate that recess may not move at all. This occurs since an amount of compression experienced by earpiece cushion 806 is insufficient for a resistance to compression of that portion of earpiece cushion 806 to exceed a resistance to initial deflection of a corresponding cantilevered support member 804. In locations or regions where earpiece cushion assembly 110 contacts a raised region of the user's head, cantilevered support members 804 would begin to deflect once a portion of earpiece cushion 806 exceeds a threshold amount of compression, thereby making deflection of those cantilevered support members 804 equivalent to further compression of earpiece cushion 806. This results in both compression and deflection occurring until earpiece cushion assembly 110 conforms to the various contours of a user's head and creates a robust acoustic seal around the user's ear.

FIG. 9B also shows how earpiece cushion assembly 110 is engaged by earpiece housing 112. In some embodiments, earpiece housing 112 can include recesses that are engaged by snaps on cushion frame 802 that help secure cushion frame 802 to earpiece housing 112. It should be noted that while no components are shown being positioned within earpiece housing 112 that part of this space would be filled by electronics supporting one or more acoustic drivers, media processing and other sensors supporting headphones 100.

Figure 9C:
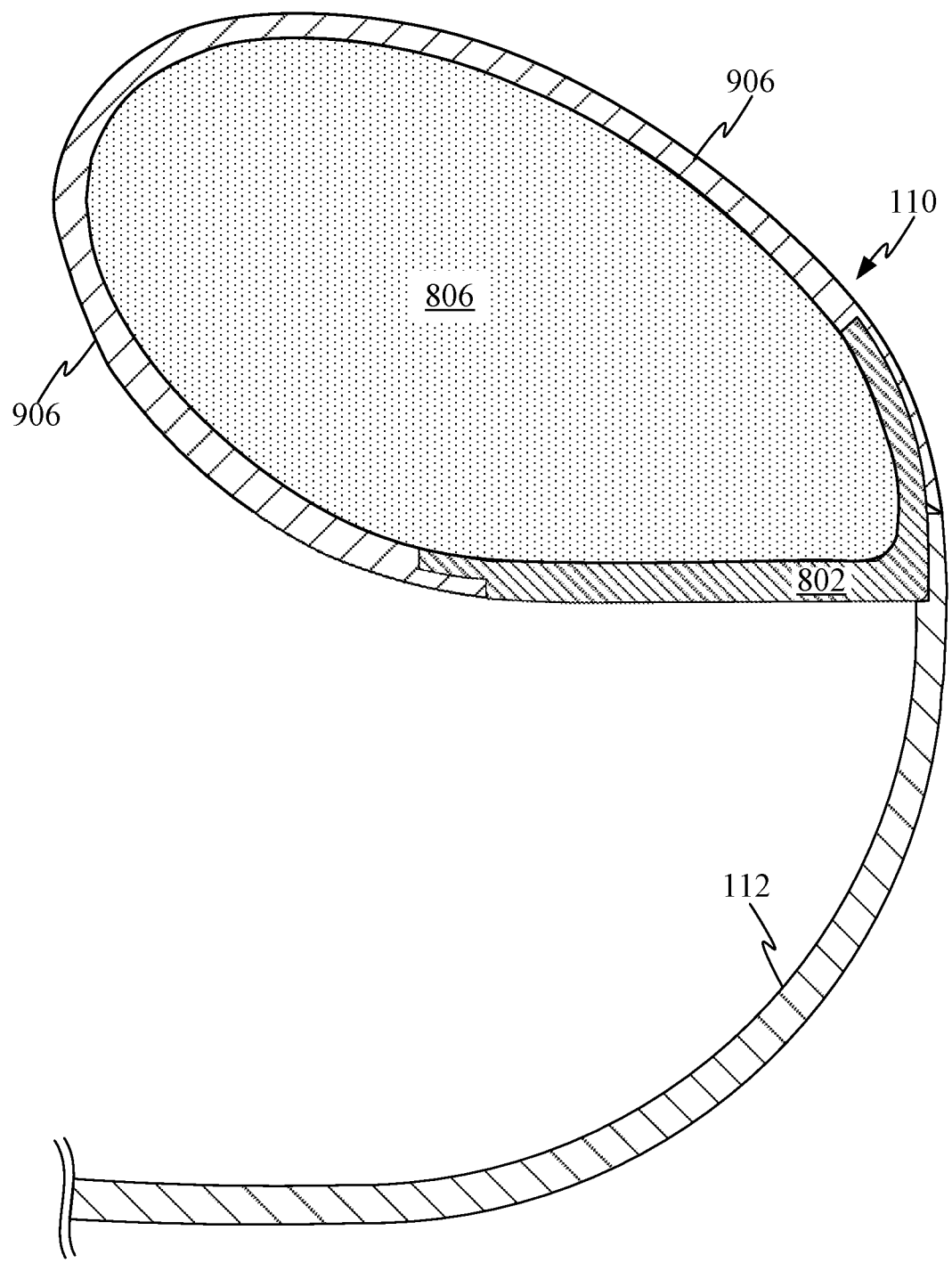
FIG. 9C shows a cross-sectional view of a portion of an earpiece that does not include one of cantilevered support members in accordance with some embodiments.

FIG. 9C shows a cross-sectional view of a portion of earpiece 104 that does not include one of cantilevered support members 804. This leaves a large amount of earpiece cushion 806 unsupported. For this reason, the spacing between cantilevered support members 804 is important as the size of the gaps between cantilevered support members 804 as well as the size and shape of cantilevered support members 804 can both be tuned to achieve a desired overall stiffness of earpiece cushion assembly 110.

Figure 10A:
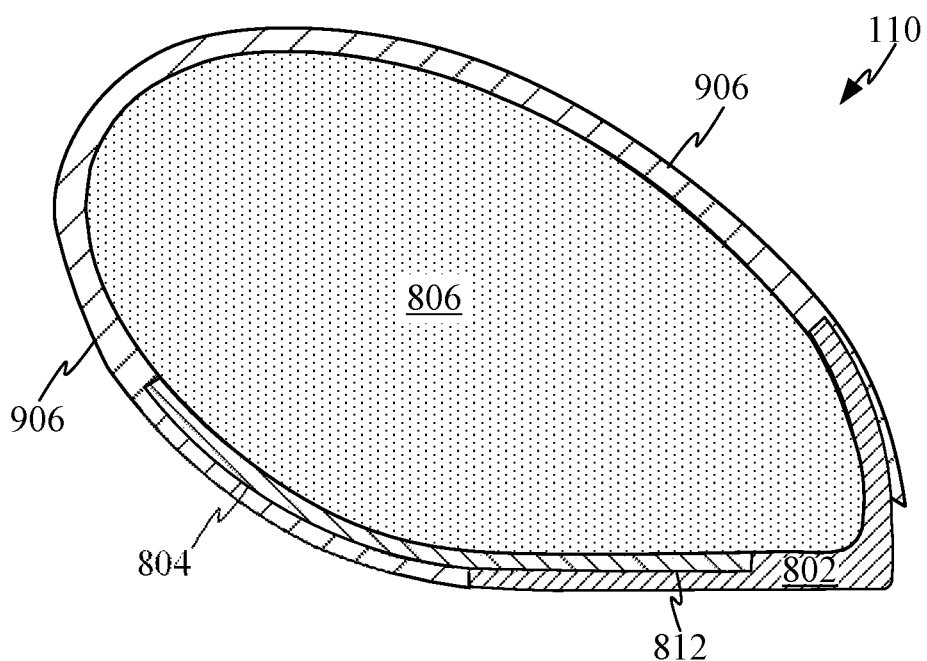
FIGS. 10A-10B show cross-sectional views of an alternative configuration of earpiece cushion assembly according to some embodiments that utilizes the support structure depicted in FIG. 8C.
Figure 10B:
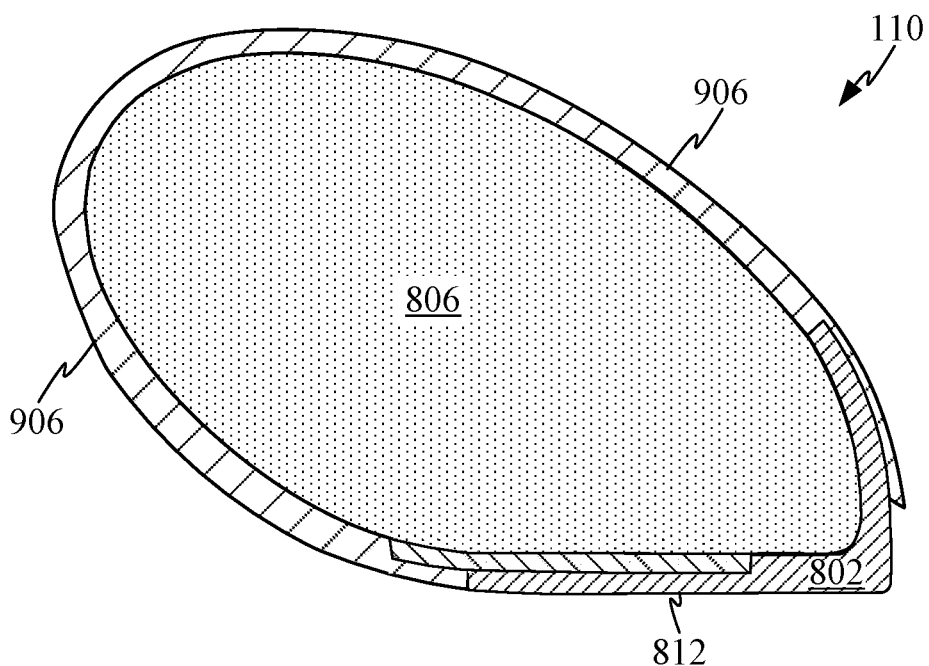

FIGS. 10A and 10B show cross-sectional views of an alternative configuration of earpiece cushion assembly 110 that utilizes discrete support structure 812 (see FIG. 8C). In particular, support structure 812 and one of cantilevered support members 804 is shown being positioned atop cushion frame 802. In some embodiments, support structure 812 can be adhesively coupled to cushion frame 802. In some embodiments, cushion frame 802 can include an alignment feature such as a slightly recessed area to position support structure 812. Once protective cover is secured to opposing sides of cushion frame 802, support structure 812 is locked in place on account of being compressed between protective cover 906 and earpiece cushion 806.

Figure 11:
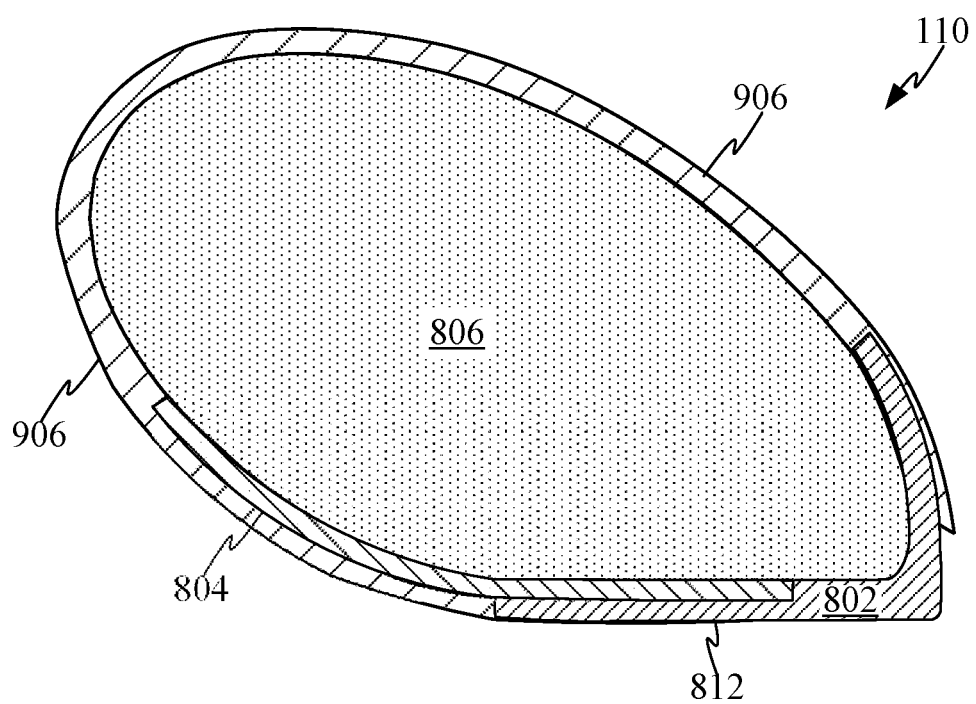
FIG. 11 shows a cross-sectional view of one side of an earpiece cushion assembly having a support structure embedded within a protective cover in accordance with some embodiments.

FIG. 11 shows a cross-sectional view of one side of earpiece cushion assembly 110 having support structure 812 embedded within protective cover 906. Incorporating or embedding support structure 812 within protective cover 906 can be accomplished when protective cover 906 is formed from a knitted material, thereby allowing cantilevered support members 804 to be incorporated within a weave of the knitted material. In some embodiments, incorporation of support structure 812 within protective cover 906 could involve the use of a higher strength material such as stainless steel or titanium having a thickness of about 0.5-2 millimeters. This profile thickness would allow for support structure 812 to maintain a desired level of stiffness while not overtly interrupting a weave pattern of protective cover 906. Incorporation of the protective cover and support structure 812 could reduce a time taken for final assembly of headphones 100 to be completed. Final assembly time is reduced because the two parts become a single part making handling easier and because coupling protective cover to cushion frame 802 also results in attachment of support structure 812. The incorporation of multiple parts in this manner can also improve part alignment since successfully coupling one part to cushion frame 802 also results in the other part being successfully coupled.

Mesh Canopy Headband

Figure 12:
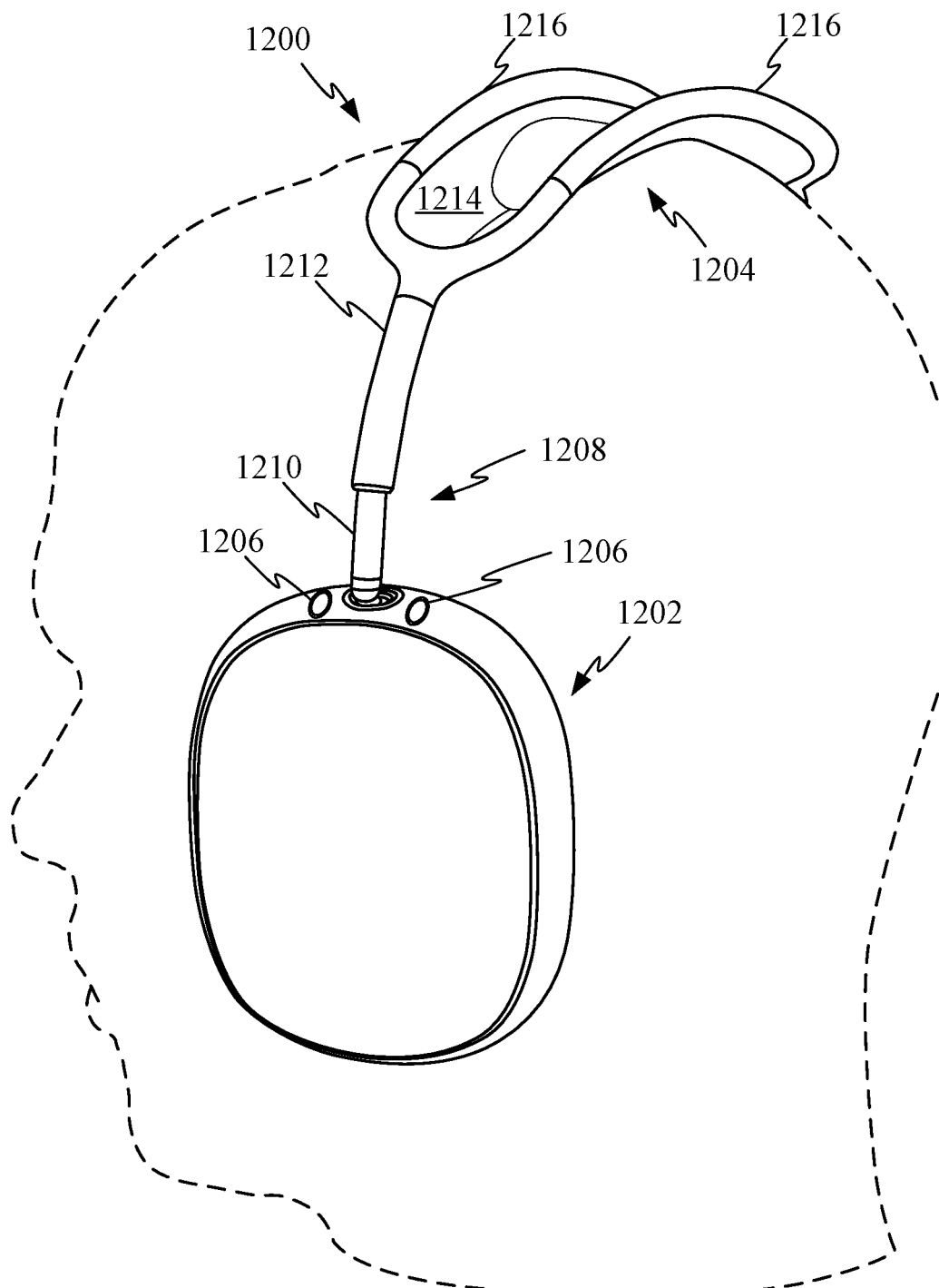
FIG. 12 shows a perspective view of headphones according to some embodiments of the disclosure being worn by a user.

FIG. 12 shows a perspective view of headphones 1200 being worn by a user. Headphones 1200 can include the same or similar components as headphones 100, however, headphones 1200 may include additional and/or alternative components not included in headphones 100. Headphones 1200 can include earpieces 1202 joined together by headband 1204. Headband 1204 can include stems 1208, which couple headband 1204 to earpieces 1202. Stems 1208 include a telescoping member 1210 that telescopes into and out of headband housing 1212 in order to resize headphones 1200 based on the size of a user's head. In some embodiments, telescoping member 1210 can be configured to be translated a distance in a range between about 10 mm and 50 mm. For example, telescoping member 1210 can be translated a distance of 34 mm.

Headband housing 1212 can define a central opening configured to accommodate a layer of conformable mesh assembly 1214 configured to distribute pressure evenly across the user's head. The central opening can be defined by two headband arms 1216 of headband housing 1212. In some embodiments, headband arms 1216 can have a substantially circular cross-sectional shape and accommodate routing of electrically conductive pathways configured to synchronize operation of earpieces 1202. Headband arms can also include spring members configured to hold a shape of headband arms 1216 and help to keep headphones 1200 securely attached to a user's head.

Earpieces 1202 can also include a user interface 1206 positioned on the exterior of one or more of the earpieces

1202. In some embodiments, the user interface 1206 can be configured to allow a user to manipulate settings and the playback of media. For example, user interface 1206 could be or include buttons configured to receive user input and cause changes in volume, next/previous track, pause, stop, etc. In further embodiments, the user interface 1206 can be positioned on each side of stem 1208. The user interface 1206 can be positioned on the earpieces 1202 to allow a user to determine which interface they are interacting with based on the position of the user interface 1206 relative to the stem 1208. For example, a first button of the user interface 1206 may be positioned on the side of the stem 1208 that is closer to the users face and controls the playback of audio. In some embodiments, user interface 1206 can include a crown assembly and an elongated button identical to or similar to input 1808 and input 1806 described below with respect to FIGS. 18-22.

Figure 13A:
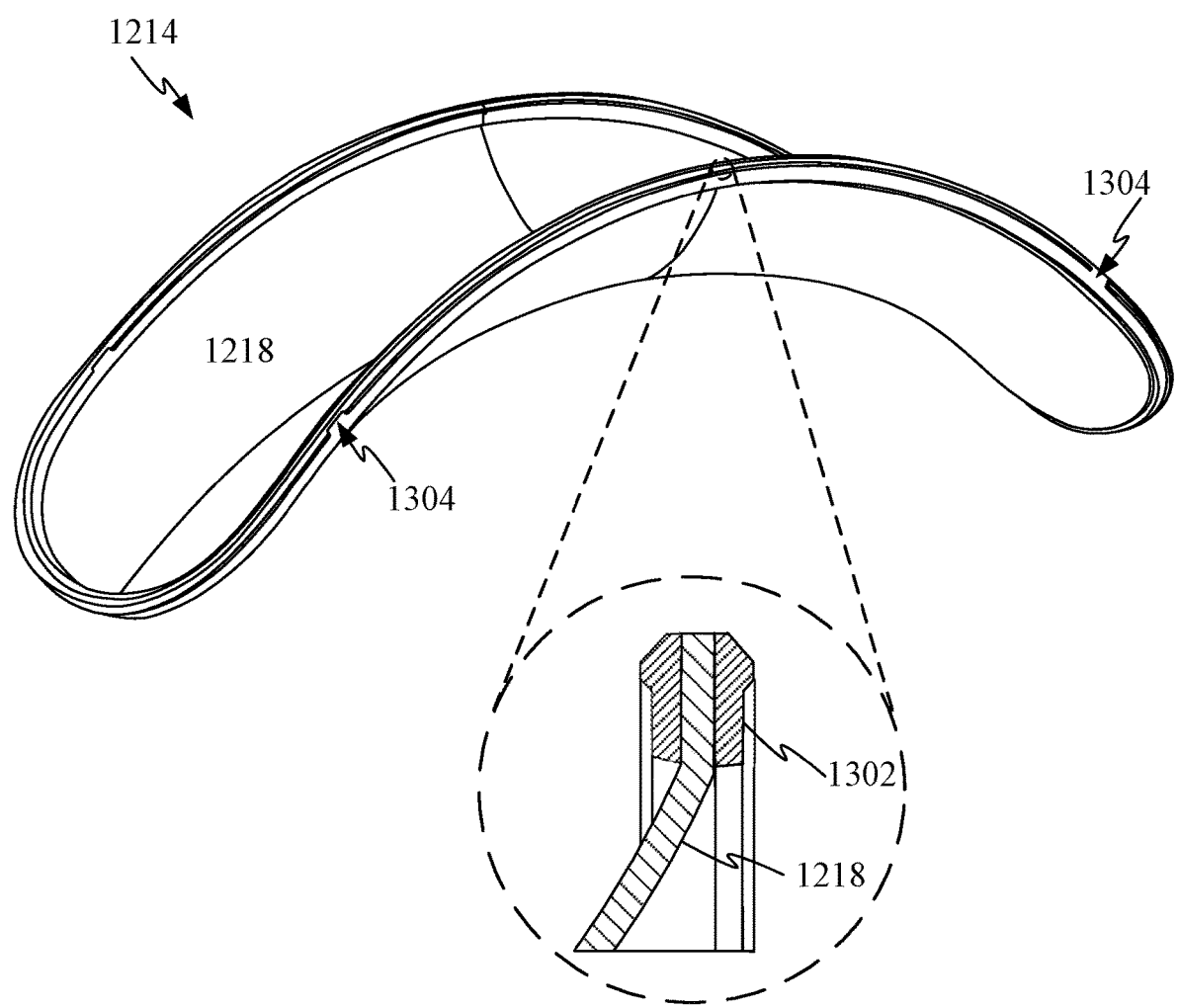
FIGS. 13A-13D show perspective views of various embodiments of components making up the canopy structure of the headphones depicted in FIG. 12.

FIGS. 13A-13E show perspective views of various embodiments of components making up the canopy structure of the headphones 1200 depicted in FIG. 12. FIG. 13A shows a perspective view of conformable mesh assembly 1214 and a close up view showing a cross-sectional view of a portion of the periphery of conformable mesh assembly 1214. As depicted, the periphery of conformable mesh assembly 1214 includes a locking feature 1302 overmolded around an edge of mesh material 1218. Mesh material 1218 can be formed from nylon, PET, monoelastic or bielastic woven fabrics, or polyether-polyurea copolymer having a thickness of about 0.6 mm. Locking feature 1302 can be formed from a durable and flexible thermoplastic material such as TR90 and in some instances extend through openings in mesh material 1218. In some embodiments, locking feature 1302 can define alignment features taking the form of notches 1304, helping confirm correct alignment of conformable mesh assembly 1214 with the central opening.

Figure 13B:
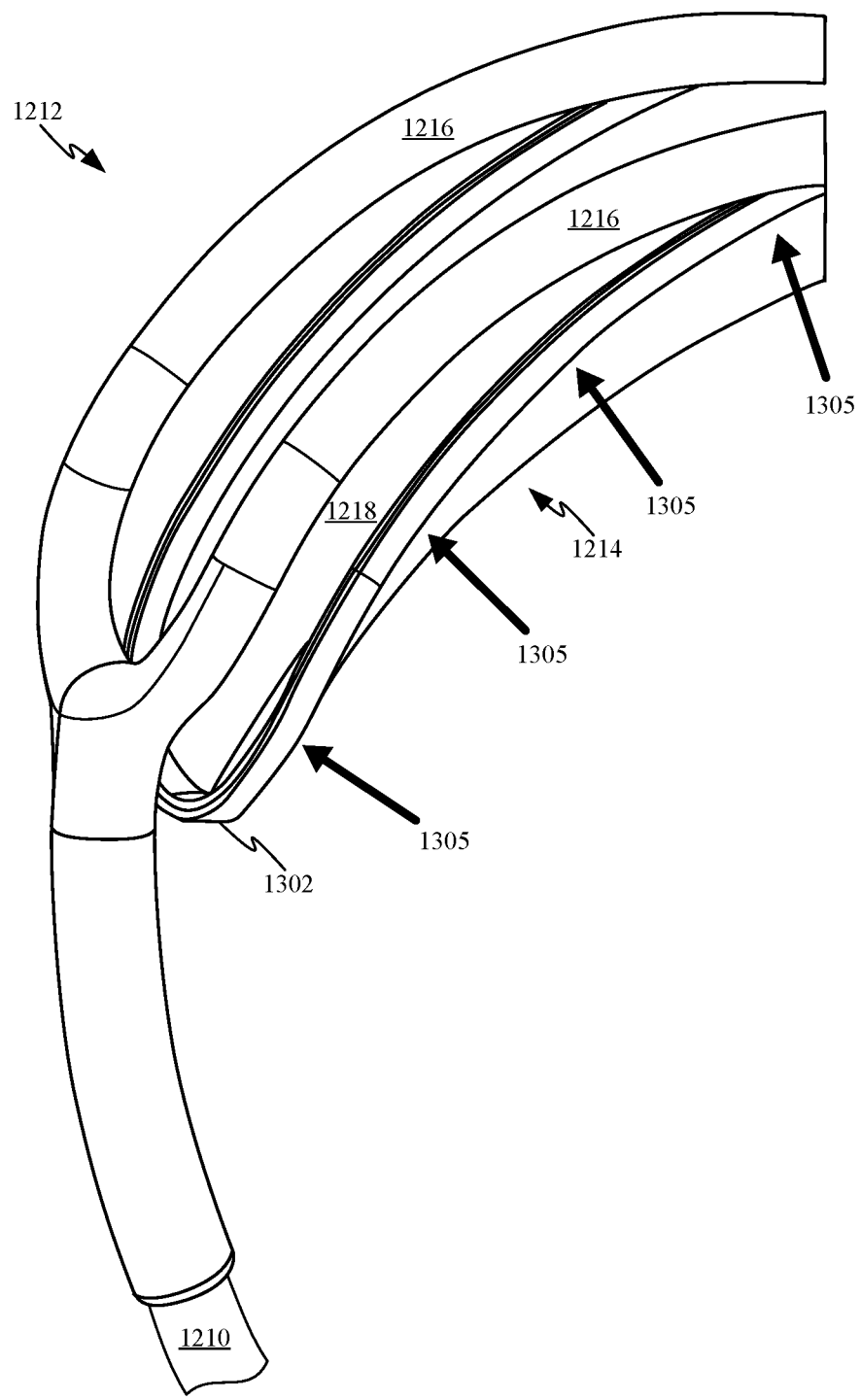
Figure 13C:
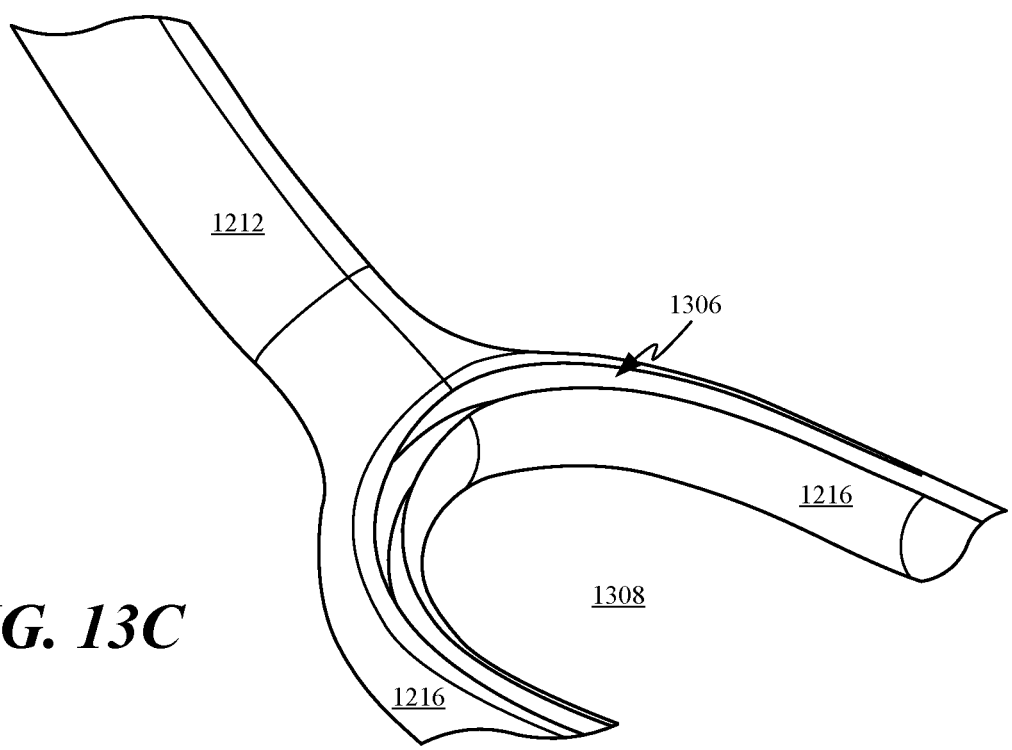
Figure 13D:
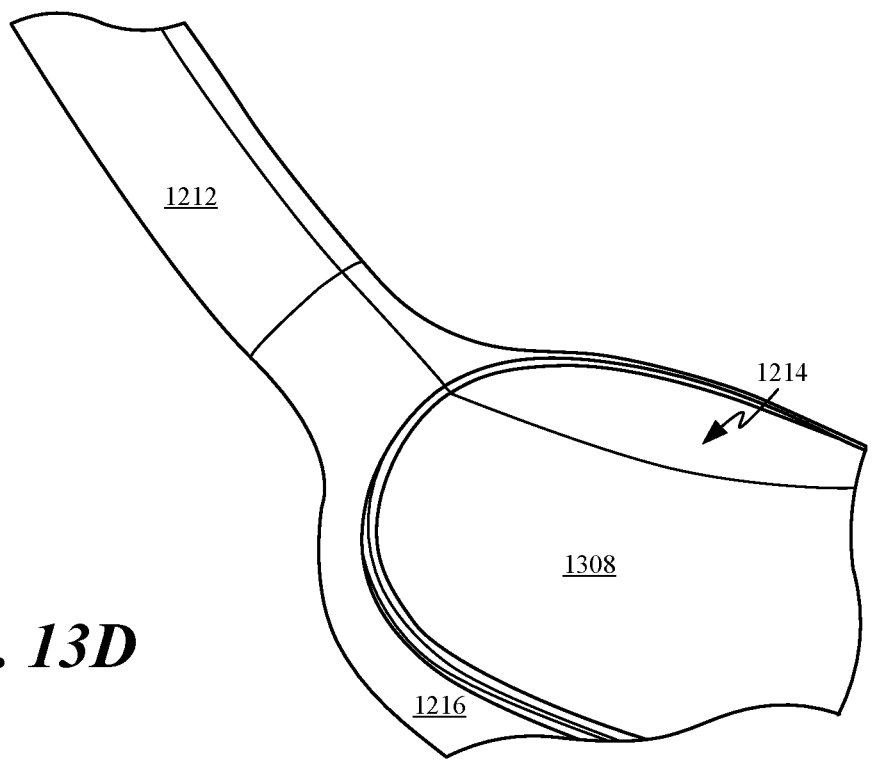

FIG. 13B shows headband housing 1212 and how locking feature 1302 of conformable mesh assembly 1214 can be aligned with a channel defined by headband arms 1216 of headband housing 1212 prior to pressure 1305 being applied to conformable mesh assembly 1214 to engage locking feature 1302 within the channel. FIG. 13C shows a channel 1306 defined by headband arms 1216 as well as central opening 1308 defined by headband arms 1216. Channel 1306 can have an internal t-shaped geometry configured to receive and retain locking feature 1302 of conformable mesh assembly 1214. FIG. 13D shows conformable mesh assembly 1214 positioned within central opening 1308.

Figure 13E:
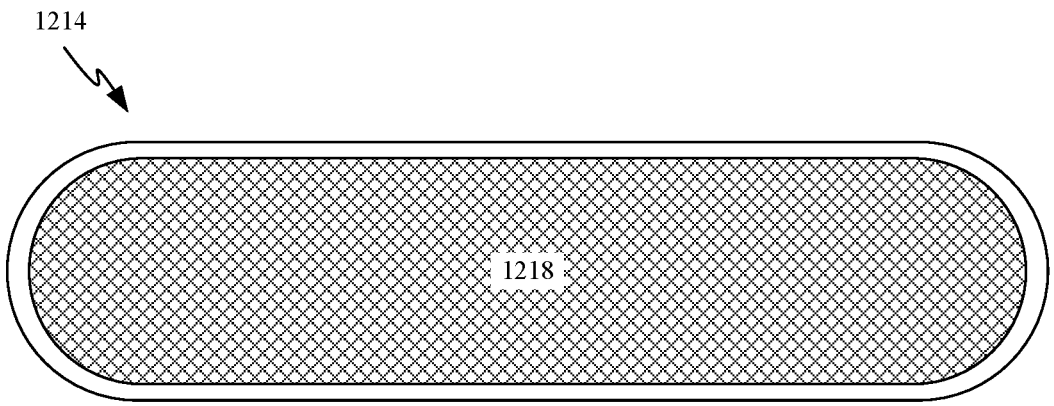
FIGS. 13E-13G are simplified illustrations of mesh assemblies that can be incorporated into a headband in accordance with some embodiments.
Figure 13F:
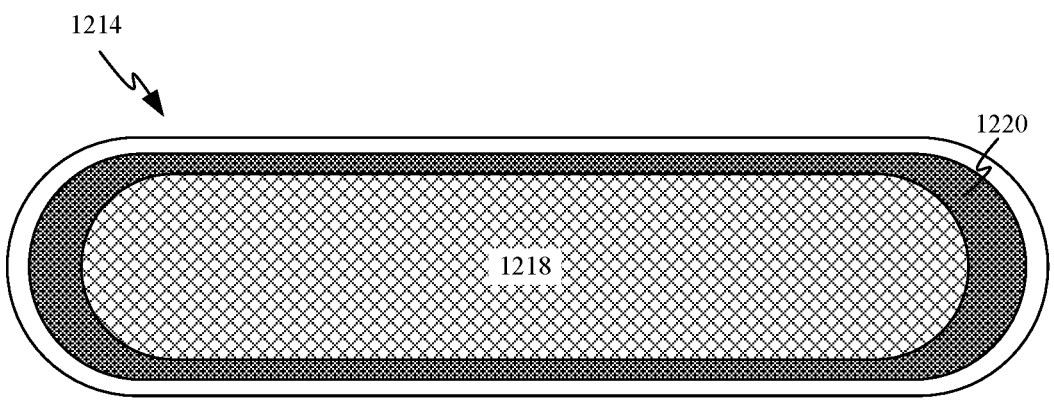

FIG. 13E shows how a mesh material 1218 forming a majority of the conformable mesh assembly 1214 can have a substantially uniform consistency/mesh pattern. Mesh material 1218 can be flexible so as to prevent undue amounts of force to be applied to a user's head. FIG. 13F shows an alternative embodiment in which conformable mesh assembly 1214 includes a first mesh material 1218 extending across a central portion of conformable mesh assembly 1214 and a second mesh material 1230 extending across a peripheral portion of conformable mesh assembly 1214. First mesh material 1218 can be formed from a more flexible/compliant material than second mesh material 1230 allowing for the central portion of conformable mesh assembly 1214 to deform substantially more than the peripheral portion of conformable mesh assembly 1214. This also allows the peripheral portion of conformable mesh assembly to be stronger and less likely to tear or be damaged.

Figure 13G:
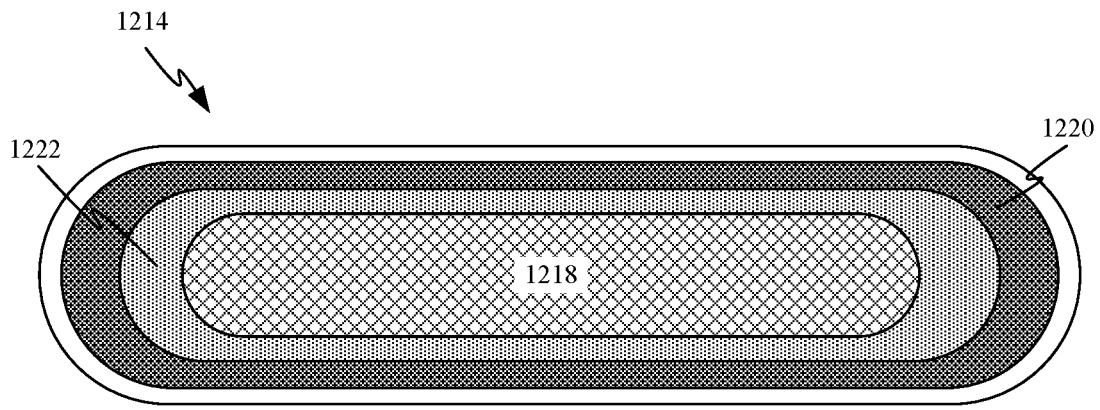

FIG. 13G shows how conformable mesh assembly 1214 can include three different types of mesh material 1218, 1230, and 1222, thereby allowing for the conformable portion to become gradually stiffer toward the periphery. In some embodiments, a stiffness of conformable mesh assembly 1214 can vary even more gradually across its area. In particular, the mesh can include mesh of gradually changing mesh sizes so that a central portion of conformable mesh assembly 1214 can have a substantially lower spring rate than a periphery of conformable mesh assembly 1214. In this way, portions of the mesh material likely to undergo the greatest amount of displacement can have the lowest spring rate, thereby substantially increasing comfort by reducing the likelihood of force being concentrated at a particular point or region of a user's head. In some embodiments, an arrangement of reinforcing members can be used in combination with mesh material 1218 to vary the amount of force transferred to a user by the mesh material making up conformable mesh assembly 1214. In some embodiments, voids can be left in a central region of mesh material 1218 to reduce force in a central region of mesh material 1218.

Multi-Component Headband

Figure 14A:
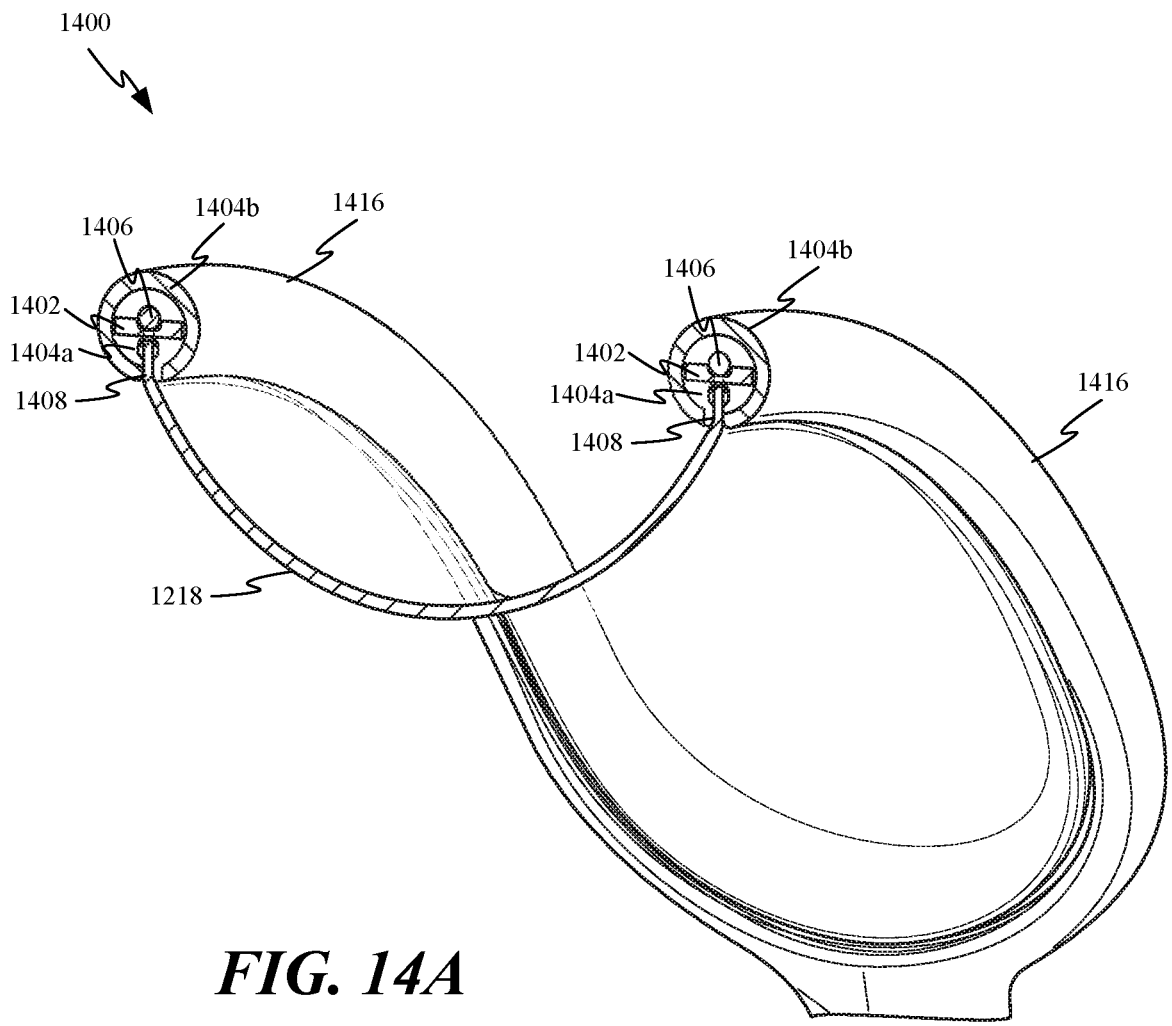
FIGS. 14A and 14B show cross-section views of a multi-component headband in accordance with some embodiments.
Figure 14B:
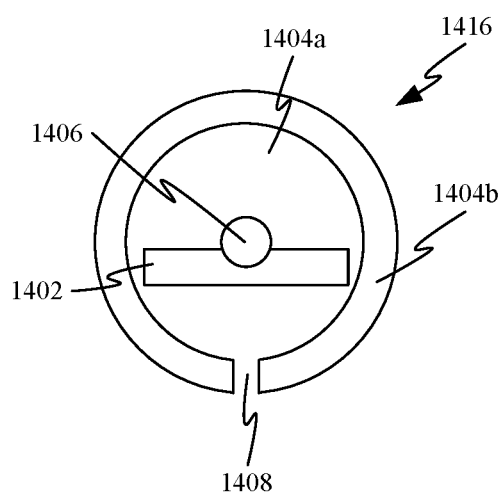

FIG. 14A shows a cross-sectional view of a multicomponent headband 1400 that includes two arms 1416. The multicomponent headband 1400 can be used with earpieces 104 to form headphones 100. The multicomponent headband 1400 can include a spring 1402 (e.g., a central spring) surrounded by one or more layers of material. For example, as shown in FIG. 14A and FIG. 14B, which is a simplified cross-sectional view of one of arms 1416, the multicomponent headband 1400 can include a spring 1402 made of metal and surrounded by multiple layers of material 1404 (e.g., plastic). In various embodiments, different materials are used for each layer. For example, a first layer 1404*a* can be or include a hard plastic material, a second layer 1404*b* can be or include a soft plastic layer, and a third layer can be or include plastic with cosmetic properties. A channel 1406 can be formed in the spring 1402 and/or the material 1404. A notch 1408 can be formed in the layers of material 1404 for receiving material. For example, the notch 1408 can receive the mesh described in reference to FIGS. 13A-13E.

In various embodiments, the multicomponent headband 1400 can be tuned to have a clamp force in a desired range. In various embodiments, the clamp force is in a range between approximately 4 Newtons and approximately 6 Newtons. For example, the clamp force can be between 4.8 Newtons and 5.4 Newtons. The clamp force can provide enhanced comfort for a user and improve acoustic sealing of the earpieces over traditional headbands. Tuning of the multicomponent headband 1400 can also prevent the multicomponent headband 1400 from relaxing over time, resulting in the clamp force of the multicomponent headband 1400 to fall outside the desired range. The multicomponent headband 1400 can be tuned by heating and cooling the headband for one or more cycles. The heating cycles can cause the multicomponent headband 1400 to relax, which can prevents or reduce relaxation of the headband in the future. For example, the multicomponent headband 1400 can have a clamp force that is above the desired range and can undergo heat cycles until the clamp force is within the desired range.

Figure 14C:
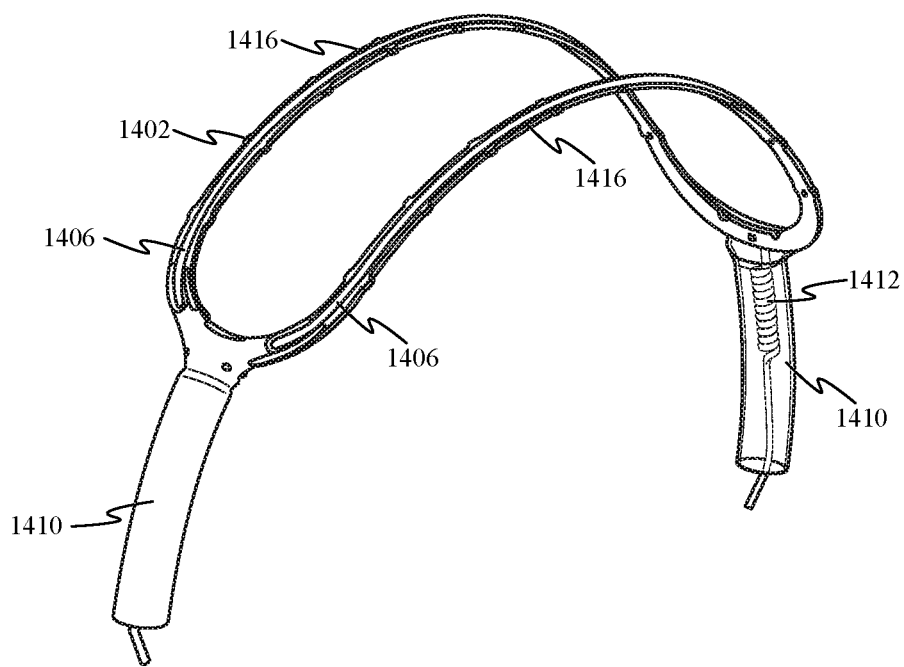
FIGS. 14C and 14D show additional views of the multi-component headband of FIG. 14A.
Figure 14D:
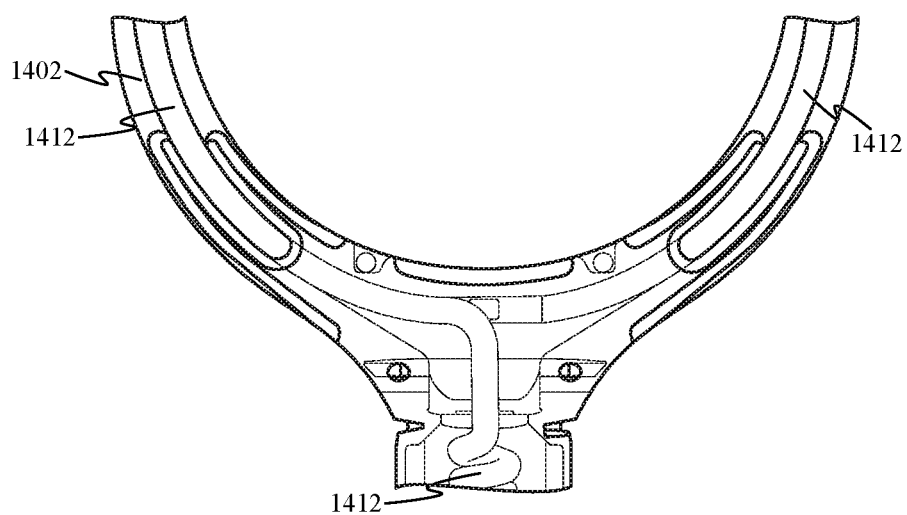

FIGS. 14C and 14D show multiple pieces that can be joined to form the multicomponent headband 1400. The multicomponent headband 1400 can include the spring 1402 connected to two yokes 1410. The yokes 1410 can be welded to the spring 1402 on opposing ends of the spring 1402. The yokes 1410 can each receive arms that are connected to earpieces 104. The spring 1402 can include channel 1406 along the length of arms 1416. The channel 1406 can receive a cable 1412 for transmitting electronic signals between the earpieces 104. In various embodiments, a portion of the cable 1412 can include a dummy cable that does not transmit electronic signals. The cable 1412 can be coiled in a portion of the yokes 1410 to allow for movement of the earpieces relative to the multicomponent headband 1400. For example, the coiled cable 1412 can allow the arms positioned in the yoke 1410 to extend away from the multicomponent headband 1400.

Vibration Dampener

Figure 15A:
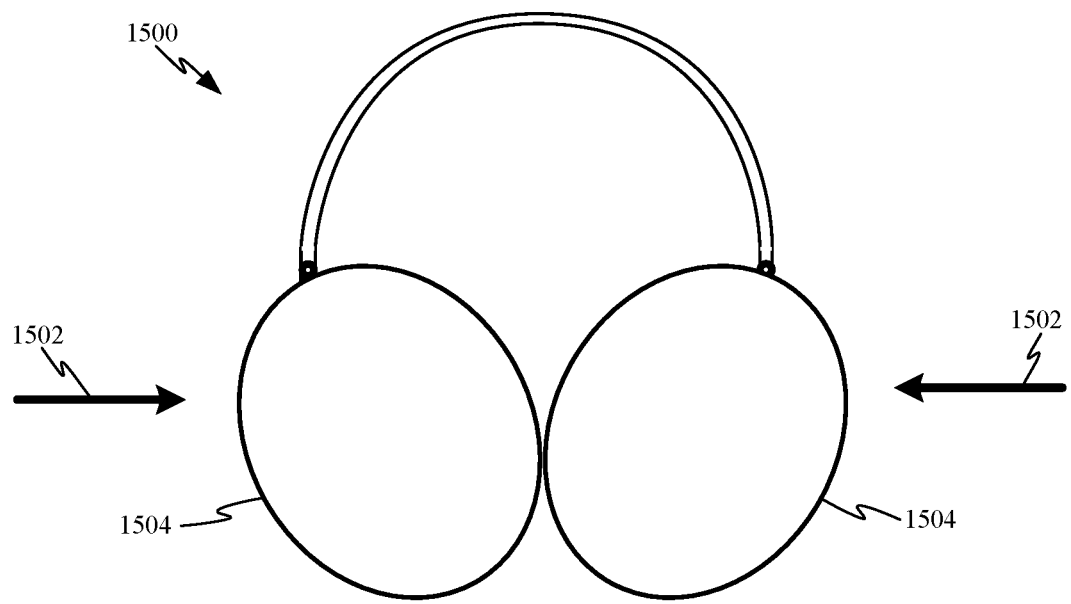
FIGS. 15A through 15C show a vibration dampening device according to some embodiments.

Some embodiments of the disclosure pertain to headphones that include rigid materials that are lightweight and provide a comfortable fit for the wearer. For example, the earpieces, such as earpieces 104, can include a rigid material (e.g., a metallic material). FIG. 15A is a simplified illustration of a pair of headphones 1500 according to some embodiments. Headphones 1500 can be representative of headphones 100 as well as other embodiments of headphones according to the disclosure and described herein. As shown in FIG. 15A, headphones 1500 include earpieces 1504 can contact one another when a force 1502 is applied to one or both of the earpieces 1504. The force 1502 can cause the earpieces 1504 to come into contact with one another. When the earpieces 1504 are made from rigid material (e.g., metal) the components inside the earpieces can experience a shock from the sudden deceleration caused by the earpieces 1504 contacting.

Figure 15B:
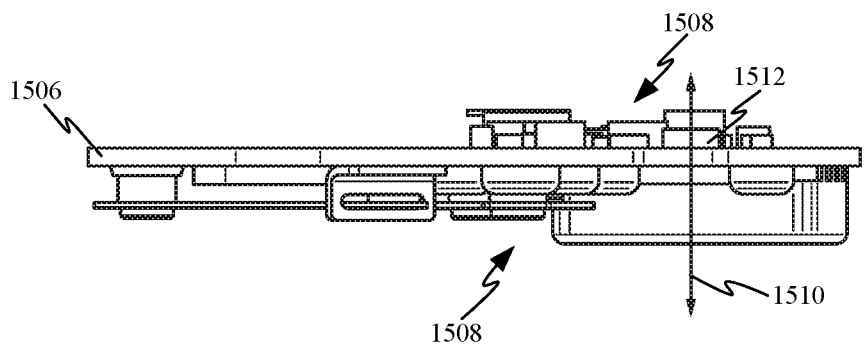

As shown in FIG. 15B, one or more of the components can be mounted on a board 1506 (e.g., a main logic board (MLB)) made of semi-rigid material. The board 1506 can flex in response to the shock caused by the earpieces 1504 contacting one another. The shock can cause the components 1508 mounted on the board 1506 to move. For example, flexing of the board 1506 can cause the components 1508 to move along direction 1510. The movement of the components 1508 can damage the components 1508 (e.g., cause calibration errors or failure). For components 1508 (e.g., sensitive electronic components) repeated movement (e.g., over thousands of times) caused by the flexing of the board 1506 can result in failure.

In various embodiments, the effects of the shock caused by the contacting of the earpieces 1504 can be reduced using one or more masses 1512 positioned on the board 1506. The masses 1512 can be positioned to reduce the acceleration of the board 1506 caused by the shock caused when the earpieces 1504 contact one another. Reducing the acceleration of the board 1506 can reduce the flexing of the board 1506 and movement of components 1508. The mass 1512 can be or include a dense material (e.g., tungston) that is mounted on the board. The mass 1512 can be a static mass or a dynamic mass that can move in response to movement of the board 1506.

Figure 15C:
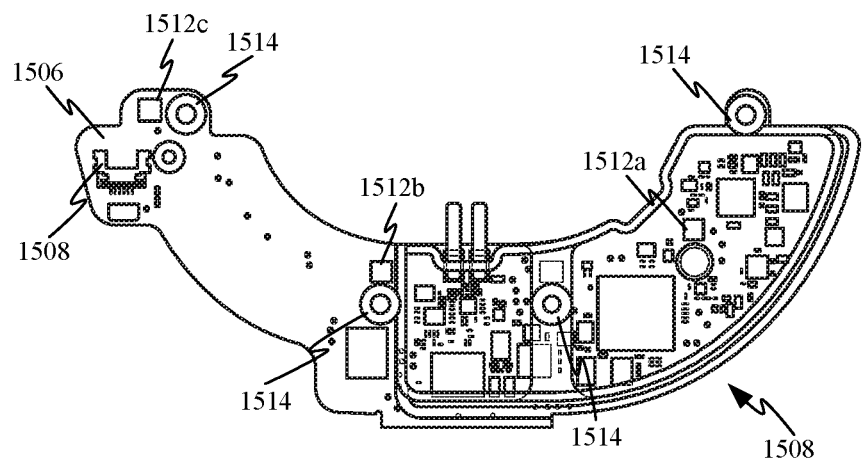

FIG. 15C shows various mounting positions for the masses 1512 on the board 1506. In some embodiments, the masses 1512 and/or the components 1508 can be mounted at optimized locations on the board 1506 to reduce the flexing of the board 1506. For example, the masses 1512*a*, 1512*b*, and 1512*c* can be mounted at various locations on the board 1506 based on the components 1508 mounted on the board and/or the sensitivity of the components 1508. For example, the locations of the masses 1512 can be optimized to reducing flexing of the board at a location where a component 1508 (e.g., a sensitive electronic component such as an accelerometer or the like) is mounted. In various embodiments, the materials of the board 1506 can additionally or alternatively be optimized to reduce the stiffness of the board 1506 which in turn can reduce the flexing of the board 1506.

In some embodiments, the board 1506 can be mounted using shock absorbing material 1514. For example, shock absorbing material 1514 can be mounted between the board 1506 and the component the board 1506 is mounted to. The shock absorbing material 1514 can additionally or alternatively be mounted between a fastener and the board 1506. The shock absorbing material 1514 can absorb some of the force caused by flexing of the board 1506. Reducing the flexing of the board 1506 can in turn reduce movement of the components 1508 mounted to the board 1506.

Earpiece Assembly

Figure 16A:
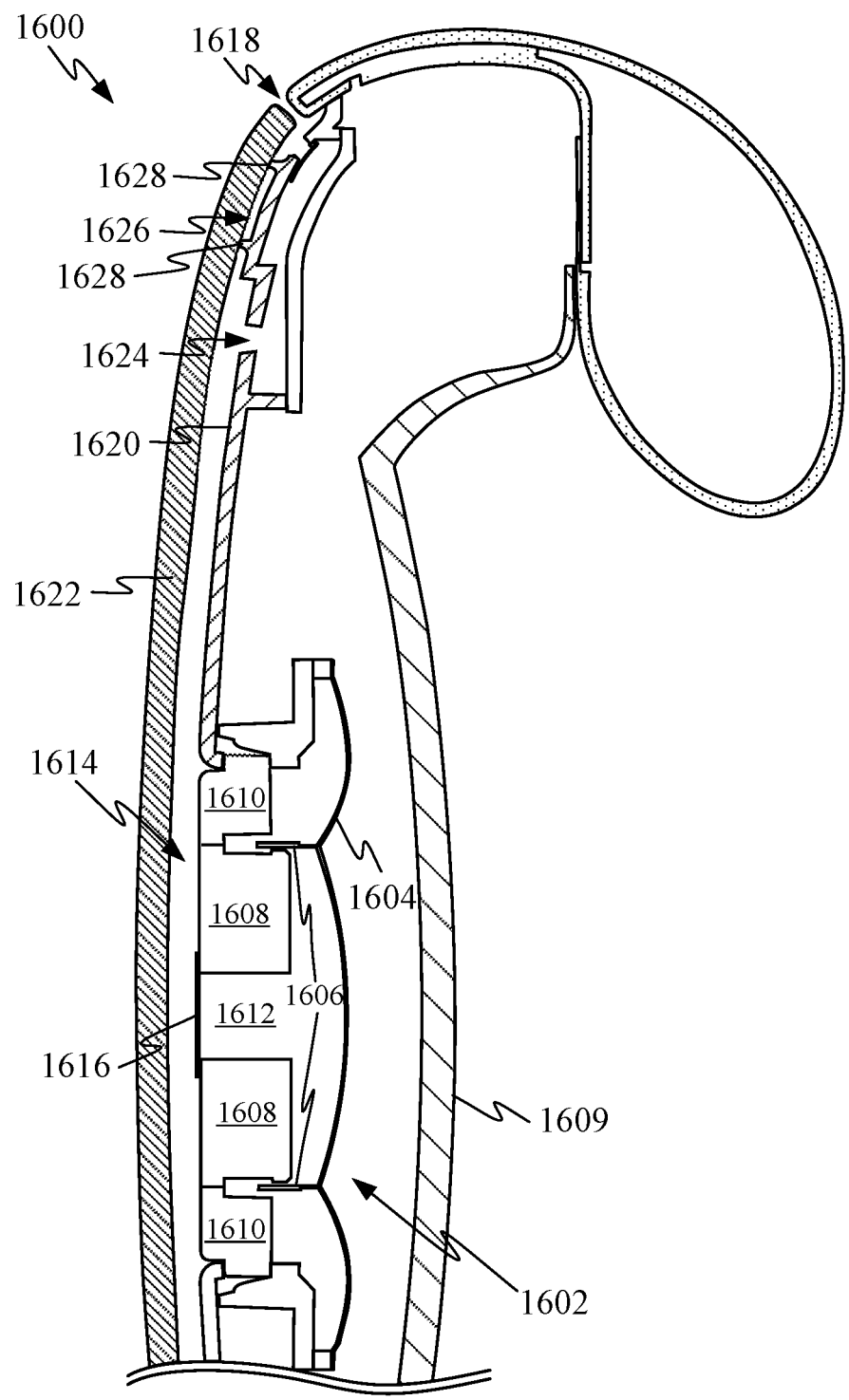
FIG. 16A shows a cross-sectional side view of an exemplary acoustic configuration within an earpiece in accordance with some embodiments that could be applied with many of the previously described earpieces.

FIG. 16A shows a cross-sectional side view of an exemplary acoustic configuration within earpiece 1600 that could be applied with any of the previously described earpieces. The acoustic configuration can include speaker assembly 1602, which in turn can include diaphragm 1604 and electrically conductive coil 1606. The conductive coil 1606 can be configured to receive electrical current for generating a shifting magnetic field that interacts with a magnetic field emitted by permanent magnets 1608 and 1610. The interaction between the magnetic fields can cause diaphragm 1604 to oscillate and generate audio waves that exit earpiece assembly, for example, through perforated wall 1609. In some embodiments, the perforated wall 1609 can include one or more openings, for example, to allow one or more sensors to detect objects adjacent to the perforated wall 1609. A hole can be drilled through a central region of permanent magnet 1608 to define an opening 1612 that puts a rear volume of air behind diaphragm 1604 in fluid communication with interior volume 1614 through mesh layer 1616, thereby increasing the effective size of the back volume of speaker assembly 1602. Interior volume 1614 extends all the way to air vent 1618. Air vent 1618 can be configured to further increase an effective size of the rear volume of speaker assembly 1602. The rear volume of speaker assembly 1602 can be further defined by speaker frame member 1620 and housing 1622. In some embodiments, housing 1622 can be separated from speaker frame member 1620 by about 1 mm. Speaker frame member 1620 defines an opening 1624 that allows audio waves to travel beneath glue channel 1626 that is defined by protrusions 1628 of speaker frame member 1620. In various embodiments, housing 1622 can be positioned with at least a portion protruding from earpiece 1600. For example, the housing 1622 can be or include a button that is positioned for interaction with a user.

Figure 16B:
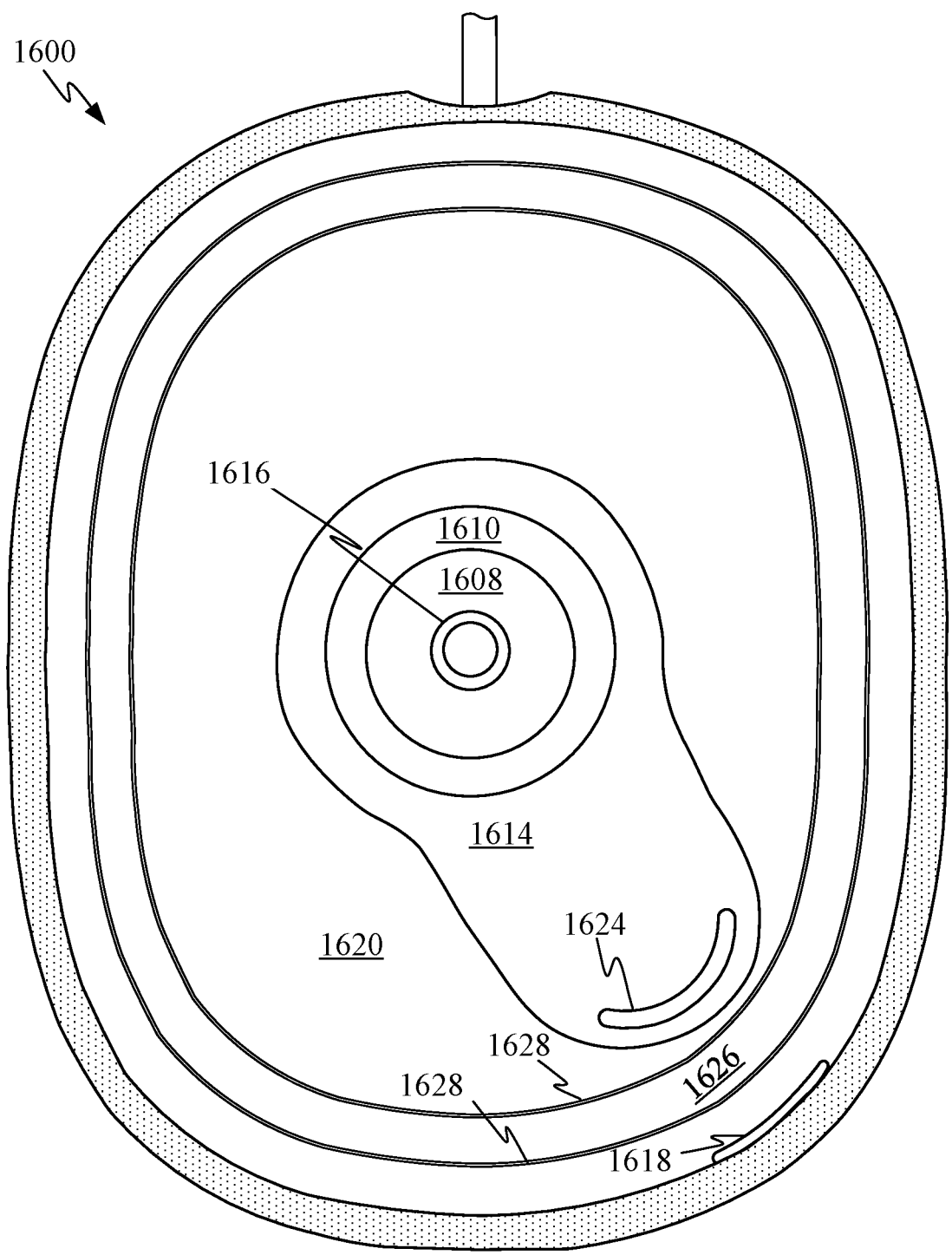
FIG. 16B shows an exterior of the earpiece shown in FIG. 16A with an input panel removed to illustrate the shape and size of an interior volume associated with a speaker assembly.

FIG. 16B shows an exterior of earpiece 1600 with housing 1622 removed to illustrate the shape and size of the interior volume associated with speaker assembly 1602. As depicted, a central portion of earpiece 1600 includes permanent magnets 1608 and 1610. Speaker frame member 1620 includes a recessed region that defines interior volume 1614. Interior volume 1614 can have a width of about 20 mm and a height of about 1 mm as depicted in FIG. 16A. At the end of interior volume 1614 is opening 1624 defined by speaker frame member 1620, which is configured to allow the back volume to continue beneath glue channel 1626 and extend to air vent 1618, which leads out of earpiece 1600.

Figure 16C:
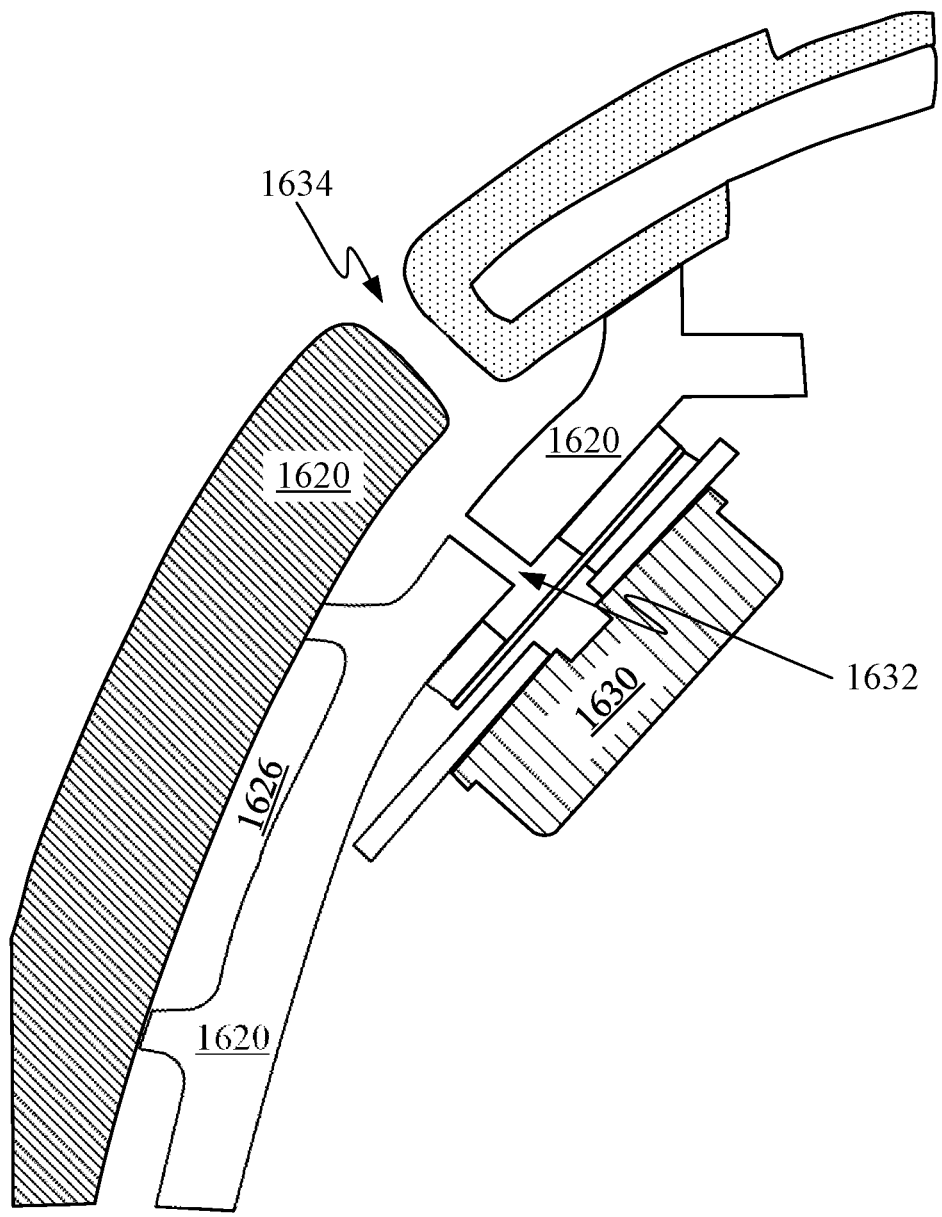
FIG. 16C shows a microphone mounted within an earpiece, in accordance with some embodiments.

FIG. 16C shows a cross-sectional view of a microphone mounted within earpiece 1600. In some embodiments, microphone 1630 is secured across an opening 1632 defined by speaker frame member 1620. Opening 1632 is offset from microphone intake vent 1634, preventing a user from seeing opening 1632 from the exterior of earpiece 1600. In addition to providing a cosmetic improvement, this offset opening configuration also tends to reduce the occurrence of microphone 1630 picking up noise from air passing quickly by microphone intake vent 1634.

Slot Antenna

In some embodiments the earpieces 104 can include a housing made from material that impedes and/or blocks radio frequency (RF) emissions. For example, the earpieces 104 can include aluminum and/or a similar metal that insulates the earpieces against RF emissions. However, when a RF antenna is positioned inside the earpieces, the RF emissions need a way to travel through the housing.

Figure 17A:
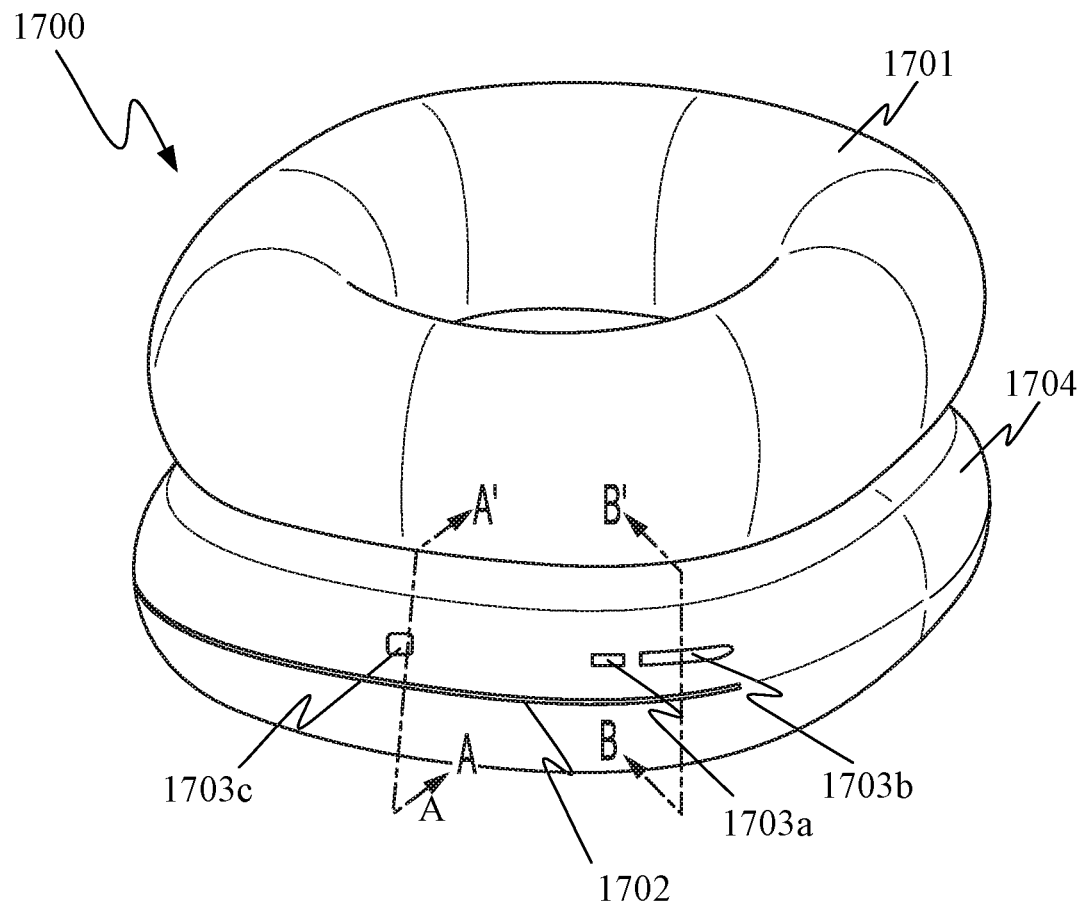
FIG. 17A shows an earpiece including a slot antenna in accordance with some embodiments.

Some embodiments form one or more slots 1702 (i.e., openings or apertures) through the earpiece housing to allow for the RF emissions to travel into and/or out of the housing. The slots 1702 can include an elongated slot 1702 formed in the housing 1704. FIG. 17A is a simplified perspective view of an earpiece 1700 that includes an elongated slot 1702 formed in the housing 1704 having an earpiece cushion 1701 attached to the housing. Earpiece 1700 can be representative of one or both of the earpieces 104 shown in FIG. 1. A slot antenna (shown in FIG. 17B as RF antenna 1706) can be formed within housing 1704. For example, the housing can define a ground plane element for the slot antenna and elongated slot 1702 can be formed through the ground plane element portion of the housing forming part of the antenna. In some embodiments, earpiece housing 1704 has a curvature along an outer portion of its thickness and elongated slot 1702 can be formed through the apex of the curvature (i.e, through the widest portion of the housing).

FIG. 17B is a simplified cross-section of the earpiece 1700 taken along its length. As shown in FIG. 17B, housing 1704 forms an interior volume that includes a central region 1705a and an annular bulbous regions 1705b that surrounds the central region. For example, the annular bulbous region 1705b can extend 360 degrees around the central region 1705a. As a matter of convenience, the combined interior volume of central region 1705a and annular bulbous region 1705b is sometimes referred to herein as "interior volume 1705". The housing 1704 can be made of and/or include a conductive material (e.g. aluminum), and can be or include a rigid or semi-rigid structure that forms the interior volume 1705. An RF antenna 1706, which in some embodiments can be a slot antenna, can be positioned within the annular bulbous region 1705b of the interior volume 1705.

Housing 1704 can have an opening on a front side of the housing that enables components, such as an acoustic driver 1708, to be placed within the housing. A cover 1707 can be attached to the housing in the area of the opening and, for example, positioned over the central region 1705a to complete the enclosure of interior volume 1705. Cover 1707 can include one or more apertures 1707a that allow sound waves produced by acoustic driver 1708 to leave the housing 1704. In some embodiments, cover 1707 can be made from plastic or a similar rigid material.

Various components of the earpiece 1700 can be positioned in the interior volume 1705. For example, an acoustic driver 1708 (e.g., a speaker) and/or electronic components 1709 (e.g., wireless circuitry, audio processing circuitry, and/or components that can be electrically coupled with a main logic board (MLB)) can be positioned in the central region 1705a of the interior volume 1705. The acoustic driver 1708 can be electrically coupled with the electronic components 1709, for example, to generate sounds from audio data wirelessly received through RF antenna 1706 and processed by electronic components 1709 for output over the acoustic driver.

An earpiece cushion 1701 can be coupled to housing 1704 at the outer annular portion of the housing 1704. The shape and structure of earpiece 1700, including the earpiece cushion 1701 and housing 1704, enables the acoustic driver 1708 to be recessed somewhat from the earpiece cushion 1701 and outer annular portion of housing 1704 to enable the earpiece to accommodate a user's ear. The area between the acoustic driver 1708 and the earpiece cushion 1701 can be a front volume 1717. The front volume 1717 can be fully or partially sealed when the headphones are donned and the earpiece cushion 1701 is compressed against the head of a user which can cause the front volume 1717 to become pressurized. The front volume 1717 can be fluidly coupled with a relief port (e.g., aperture 1703a) that allows the pressure to be relieved from the front volume 1717. A back volume 1719 can increase the efficiency of the system at certain frequencies (e.g., low frequencies) and/or allows for tuning of the acoustic driver. The back volume 1719 can be fluidly coupled with one or more outputs (e.g., aperture 1703b), for example, via an acoustic channel.

In some embodiments, RF antenna 1706 can receive RF emissions and/or to direct the RF emissions out of the housing 1704 through the slot 1702. The slot 1702 can be formed through the housing 1704. For example, the slot 1702 can be formed through the housing 1704 at a bottom portion of the housing (i.e., the portion of the housing on the opposite of the earpiece from where the stem is coupled to the earpiece). A position along the bottom portion of the housing is advantageous since, when the earpieces 1700 are positioned on a user's head, RF emissions can be received or sent through the slot to and from a host electronic device (e.g., a smart phone that streams music to the headphones) such that the radiation vectors for the antenna are pointed towards the host electronic device when the host device is in a user's pant pockets (a common scenario).

Figure 17D:
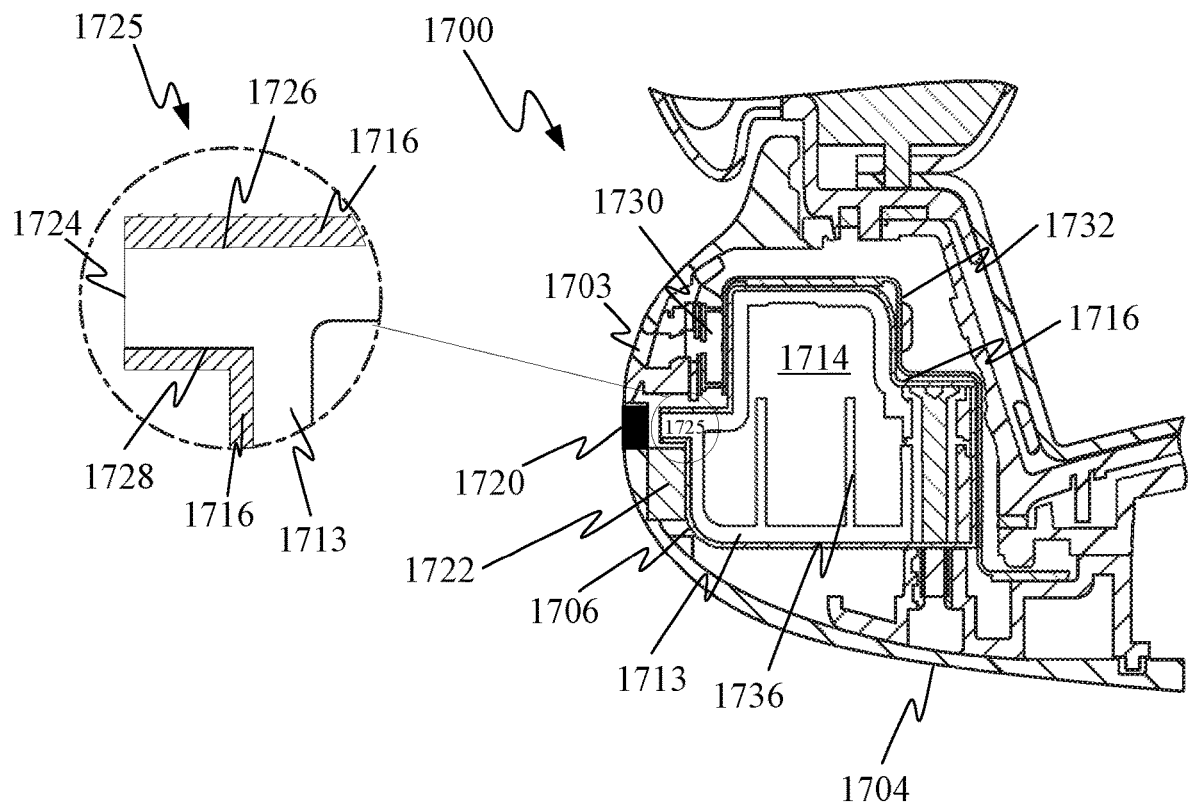
FIG. 17D is a simplified cross-section of the earpiece of FIG. 17A taken along lines A-A' in accordance with some embodiments.

FIG. 17D is a simplified cross-sectional view of a portion of earpiece 1700 taken through lines A-A' and thus through a portion of the RF antenna 1706. As shown in FIG. 17D, the RF antenna 1706 can include a frame 1713 that defines a cavity 1714. The frame 1713 can be or include radio frequency transparent material (e.g., rigid plastic made from an injection molded process) and can be formed in any suitable shape to define the cavity 1714. Frame 1713 can be plated with one or more layers of backing 1716 to form RF antenna 1706. In some embodiments, an end surface of a tongue 1725 adjacent to and extending along much of the length of the slot 1712 can be or include material that allows RF emissions to enter and/or exit the RF antenna 1706 through the tongue 1725 and metal plating can substantially surround the cavity 1714. For example, as shown in the expanded view portion of FIG. 17D, tongue 1725 can include first 1726 and second 1728 opposing surfaces protruding away from the cavity 1714 and an end surface 1724 extending between the first and second opposing surfaces and facing the slot 1702. The cavity 1714 can direct the RF emissions through tongue 1725 and out of the slot 1702. The tongue 1725 can be or include radio transparent and/or radio opaque material. For example, the end surface 1724 can be or include radio transparent material that allows RF emissions to enter and/or exit the tongue 1725. The cavity 1714 can be a void (e.g., filled with air) to provide the least RF energy loss to the RF emissions.

In various embodiments, the slot 1702 can act as an antenna for the earpiece 1700. For example, coax cables can be electrically coupled with the housing 1704 and receive/emit RF emissions through the slot 1702. In such embodiments, a slot antenna 1706 may not need to be positioned in the earpiece 1700. However, an antenna 1706 can be positioned in the earpieces 1700 and the coax cable can be electrically coupled with the housing 1704 and one or both can receive/emit the RF emissions. The slot 1702 can direct RF emissions into the interior of the earpiece, for example, into cavity 1714. In further embodiments, the RF emissions can be received into cavity 1714 without needing to pass through tongue 1725 (e.g., the RF emissions may not need to pass through end surface 1724).

In some embodiments, backing 1716 (e.g., metal plating) can include multiple separate layers of metallic plating. The backing 1716 can reflect the RF emissions that would otherwise be directed into the earpiece, out of the housing 1704 (e.g., via slot 1702) forming a cavity back slot antenna. Reflecting the RF emissions out of the housing 1704 can decrease latency by increasing the efficiency of the RF antenna 1706. For example, in one particular embodiment the RF antenna can have a 3 db improvement with the backing 1716.

The thickness of the backing 1716 and/or the materials used in the backing 1716 can be optimized for different RF frequency bands. For example, the thickness of the backing 1716 can be optimized for 2.4 GHz. However, the backing 1716 can be optimized for any suitable radio frequency (e.g., 5 GHz). The backing 1716 can be or include a layer of Copper, a layer of Nickel, and/or a layer of Gold. Each of the layers may have the same thickness or different layers may have different thicknesses. For example, the backing 1716 can include a first layer of Copper with a thickness between approximately 15 um and 30 um, a second layer of Nickle with a thickness of approximately 5 um, and a third layer of gold with a thickness less than 5 um.

In various embodiments, the slot 1702 can be sealed from external elements by seal 1720. Seal 1720 can seal some or all of the slot 1702 and prevent or reduce moisture and/or dust from entering the housing 1704 while still allowing RF emissions from exiting through the slot 1702. The seal 1720 can also prevent the slot 1702 from widening due to force on the housing 1704. For example, the seal 1720 can keep the slot 1702 at the same approximate width when a force is being applied to the housing 1704. The seal 1720 can be or include epoxy or a similar material suitable for sealing the slot 1702. In some embodiments, the portion of the seal 1720 facing towards the exterior of the housing 1704 can be co-finished with the housing 1704. Co-finishing of the seal 1720 and the housing 1704 can allow the seal 1720 and the housing 1704 to have a minimal or no gap and present an aesthetically pleasing design.

In various embodiments, the frame 1713 can include one or more stabilizing structures. For example, the frame 1713 can include ribs 1736 that extend into the cavity 1714 to provide additional structure and/or support to the RF antenna 1706.

In various embodiments, the RF antenna 1706 can be used as a connection point (e.g., mechanical and/or electrical) for one or more components. For example, the RF antenna 1706 can be positioned in the housing 1704 and act as a mechanical coupling point for a microphone 1730. The microphone 1730 can be positioned between the housing 1704 and the RF antenna 1706 and operatively coupled to receive sound through microphone aperture 1703c formed through housing 1704. The RF antenna 1706 can act as a backstop to hold the microphone 1730 in place. The RF antenna 1706 can additionally or alternatively at as an electrical connection point for components in the earpieces 1700. For example, the RF antenna 1706 can be connected to a common ground shared by the housing 1704 via a foam 1722 positioned against the housing 1704. The RF antenna 1706 acting as a common ground can provide a grounding connection to other components in the earpiece 1700. In various embodiments an electrical circuit 1732 (e.g., a flexible or flex circuit) can be coupled with the microphone 1730. The electrical circuit 1732 can be routed around the RF antenna (e.g., over the top of the antenna) for connection with audio processing or other components in the earpiece 1700.

In various embodiments, the earpieces 1700 can communicate with one another to coordinate use of RF antennas 1706, for example, to reduce latency between a device and the earpieces 1700. The earpieces 1700 may communicate with one another via a wired and/or a wireless connection. In various embodiments, the earpieces 1700 can each have an RF antenna 1706 and each receive some or all of the data from the device to avoid data loss. In some embodiments one earpiece 1700 can have an RF antenna 1706 to receive data and send that data (e.g., audio data) to the other earpiece 1700 via a wired connection. In further embodiments, the earpieces 1700 can communicate to determine which earpiece 1700 has a better connection with a host device, such as a smart phone or other electronic device that transmits data to one or both of the earpieces 1700. The earpiece 1700 that has the better connection with the device can receive the data from the device.

RF antenna 1706 can be designed to allow the antenna to send and/or receive RF emissions across one or more RF bands. The elongated slot 1702 can have a length dimension and a width dimensions that determine the operating wavelength of the antenna. In some embodiments, the slot 1702 can have a width in the range of 1 mm to 5 mm and a length in a range between 60 mm and 90 mm. For example, the slot 1702 can have a width 1740 of approximately 1.2 mm and a length 1748 of approximately 80 mm. In various embodiments, the slot 1702 can be sized and shaped for RF emissions at specific frequency bands. For example, in some embodiments the slot 1702 can be sized and shaped to allow RF emissions to travel through the housing 1704 at 2.4 GHz. In other embodiments, the slot 1702 and/or transceiver 1715 can be sized and shaped to allow the RF emissions to travel through the housing 1704 at 5 GHz or at any suitable radio frequency.

Figure 17E:
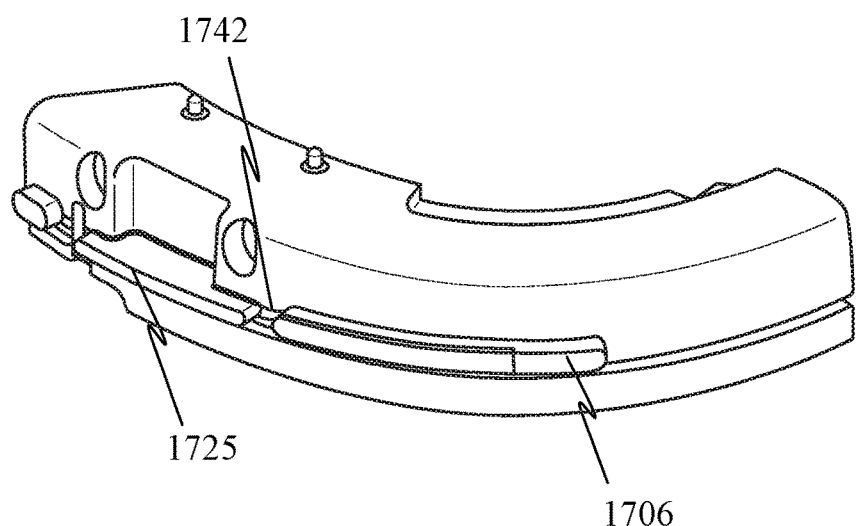
FIG. 17E is a perspective view of a slot antenna according to some embodiments without the earpiece being shown.
Figure 17F:
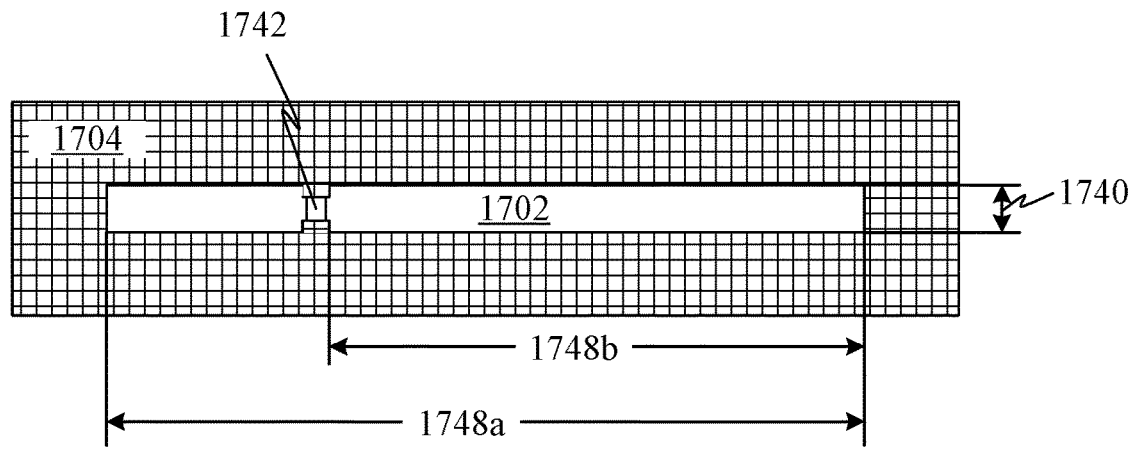
FIG. 17F shows a view of the slot antenna of FIG. 17A, in accordance with some embodiments.

Since physics dictates that the size of the radiating elements in RF antenna 1706 are a function of the required resonance, some embodiments add a passive element to the antenna pattern to effectively shift the tuning of the antenna to a particular frequency. For example, slot 1702 can be divided into two or more segments for tuning of the RF antenna 1706 to one or more radio frequencies as shown in FIG. 17E. The segments can be defined by one or more tuning components 1742 (e.g., passive components, capacitive components and/or surface mount technology (SMT) pads) positioned in the antenna pattern defined by slot 1702 and tongue 1725. For example, FIG. 17E shows the slot 1702 of RF antenna 1706 broken into two segments by tuning component 1742. The different segments can allow the RF antenna 1706 to have multiple antenna resonance frequencies. The multiple antenna resonance frequencies can allow for RF emissions at multiple frequency bands. For example, as shown in FIG. 17F, the tuning component 1742 can split the slot antenna into two segments with length 1748a being used to produce an RF band at a first frequency (e.g., 2.4 GHz) and length 1748b being used to produce an RF band at a second frequency (e.g., 5 GHz). The frequencies can be produced simultaneously by the RF antenna 1706 (e.g., the RF antenna 1706 can produce RF emissions at 2.4 GHz and 5 GHz simultaneously) or the frequencies can be produced one at a time.

Figure 17G:
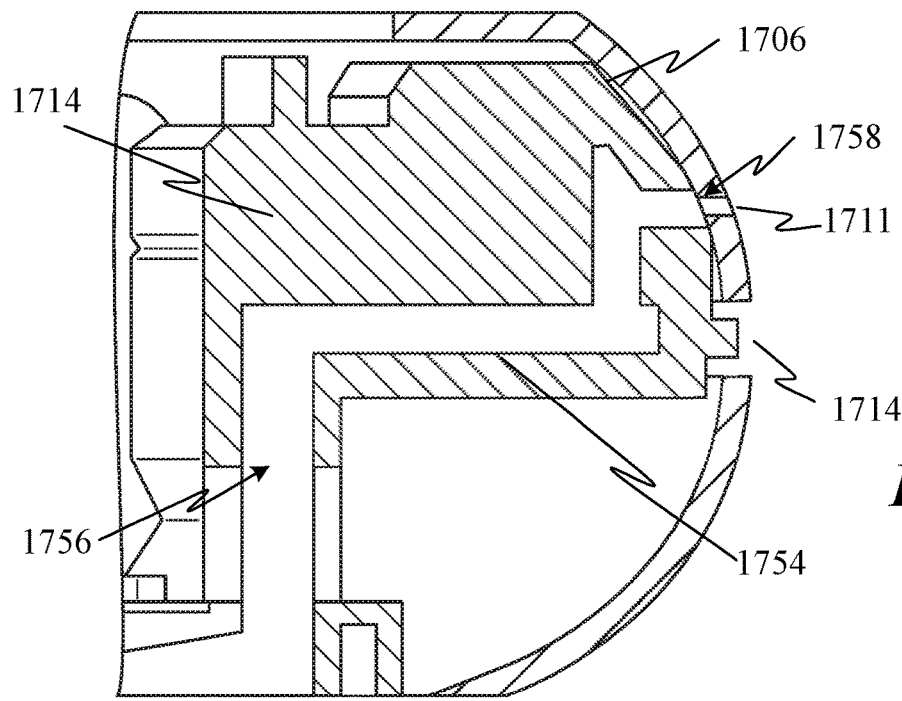
FIG. 17G is a simplified cross-section of the earpiece of FIG. 17A along lines B-B' to illustrate an acoustic channel formed through the earpiece in accordance with some embodiments.

For an efficient antenna design, the size of cavity 1714 should be large and hollow. In some embodiments, cavity 1714 can efficiently double as an acoustic volume to port the bass response and the as a pressure relief vent for the front volume. FIG. 17G is a simplified cross-sectional view of a portion of earpiece 1700 taken through line B-B'. As shown in FIG. 17G, an acoustic channel 1754 can be formed through cavity 1714 and the backing 1716 in a portion of the RF antenna 1706. The acoustic channel 1754 can form a channel between the interior of the housing 1704 and an aperture 1711. The acoustic channel 1754 can be made by forming openings 1756 and 1758 in the RF antenna 1706. The openings 1756 and 1758 can be sized to be less than the diameter of the RF wavelength, allowing for the passage of air while preventing RF energy from passing through. In some embodiments the openings 1756 and 1758 have a diameter of 3 mm or less. The acoustic channel 1754 can be used as a pressure release for the air that is being displaced by an acoustic driver. The acoustic channel 1754 can additionally or alternatively provide a channel for air to reach the microphone 1730.

In various embodiments, an acoustic channel to the front volume 1717 and/or the back volume 1719 can be formed separate from the cavity 1714. FIG. 17H is a simplified cross-sectional view of a portion of earpiece 1700 taken through line B-B' showing an alternative acoustic channel 1760 and FIG. 17I is a callout portion of FIG. 17H. The acoustic channel 1760 can acoustically couple the front volume 1717 with the an aperture (e.g., aperture 1703) in the housing 1704. In various embodiments, the acoustic channel 1760 can be defined by a hollow fastener 1762 (e.g., a hollow screw), a frame 1764, and/or a vent 1766 that allows air to flow from the front volume 1717 and/or from the back volume 1719 out of the housing 1704 (e.g., via aperture 1703).

FIG. 17J shows a top view of the front volume 1717 including the acoustic driver 1708, the hollow fastener 1762, and fasteners 1768. The front volume 1717 can be defined by seal 1770 that can prevent air from traveling out of the front volume 1717. The hollow fastener 1762 can allow for air to leave the front volume 1717, for example, to relieve the increased pressure that can occur when the earpiece 1700 has been donned by a user. The hollow fastener 1762 and fasteners 1768 can couple the acoustic driver 1708 to the frame 1764. The frame 1764 can hold the acoustic driver 1708 in position within the earpiece 1700 (e.g., keep the acoustic driver 1708 centered relative to housing 1704).

Figure 17K:
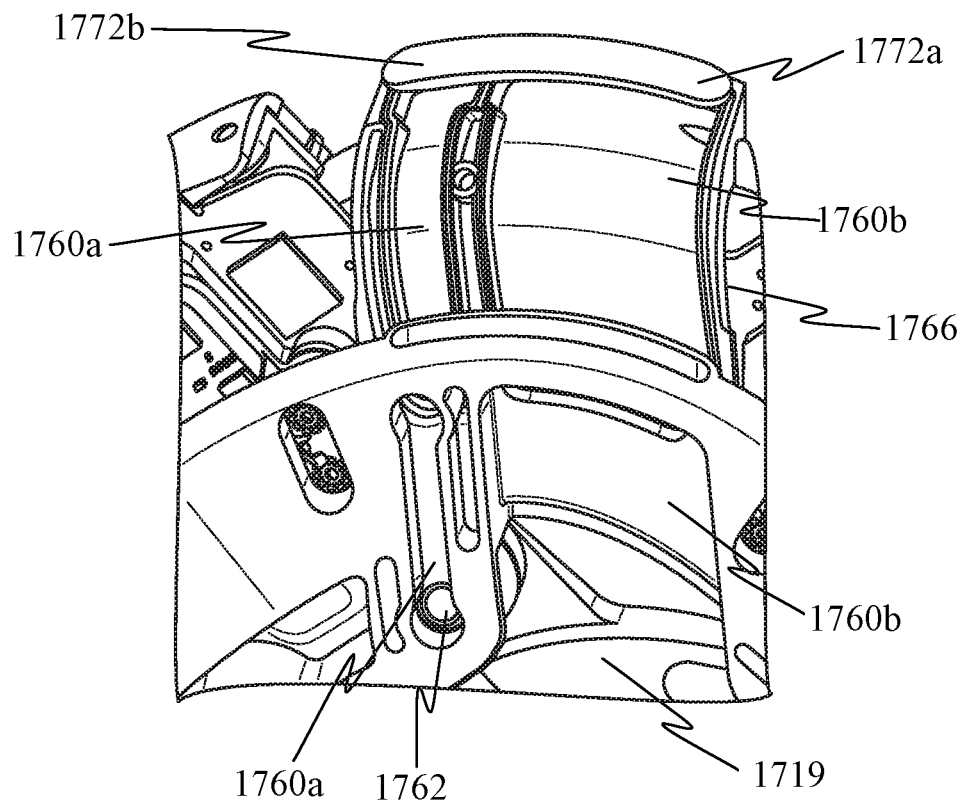
FIG. 17K is another portion of the acoustic channel of FIG. 17I in accordance with some embodiments.
Figure 17L:
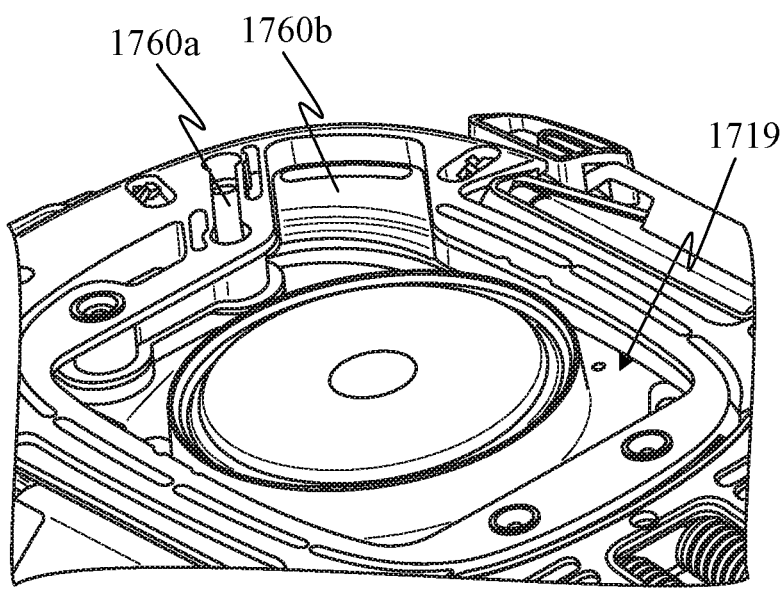
FIG. 17L is an additional portion of the acoustic channel of FIG. 17I in accordance with some embodiments.

In various embodiments, as shown in FIGS. 17K and 17L, the frame 1764 can include one or more acoustic channels 1760. For example, acoustic channel 1760*a* can couple the hollow fastener 1762 with the vent 1766 and acoustic channel 1760*b* can couple the back volume 1719 with the vent 1766. The vent 1766 can include the acoustic channels 1760*a*, 1760*b* and allow the air from the front volume 1717 and the back volume 1719, respectively to leave earpiece 1700 via openings 1772*a* and 1772*b*. The openings 1772*a* and 1772*b* can be aligned with aperture 1703 in the housing 1704.

User Interface

Some embodiments of the disclosure include a user interface on the headphones that enable a user to control one or more functions, such as audio playback, of the headphones. For example, user's may want to control the volume of the audio, play/pause the audio, go to the next track, and/or go to the previous track. When in use, the headphones are placed directly over a user's ears and as such, any noise produced by components of the headphones mechanically interacting with one another can be amplified and disruptive or unpleasant to a user. The user interface of the headphones can include various aspects to reduce component noise and aid the user when interacting with the interface.

Figure 18:
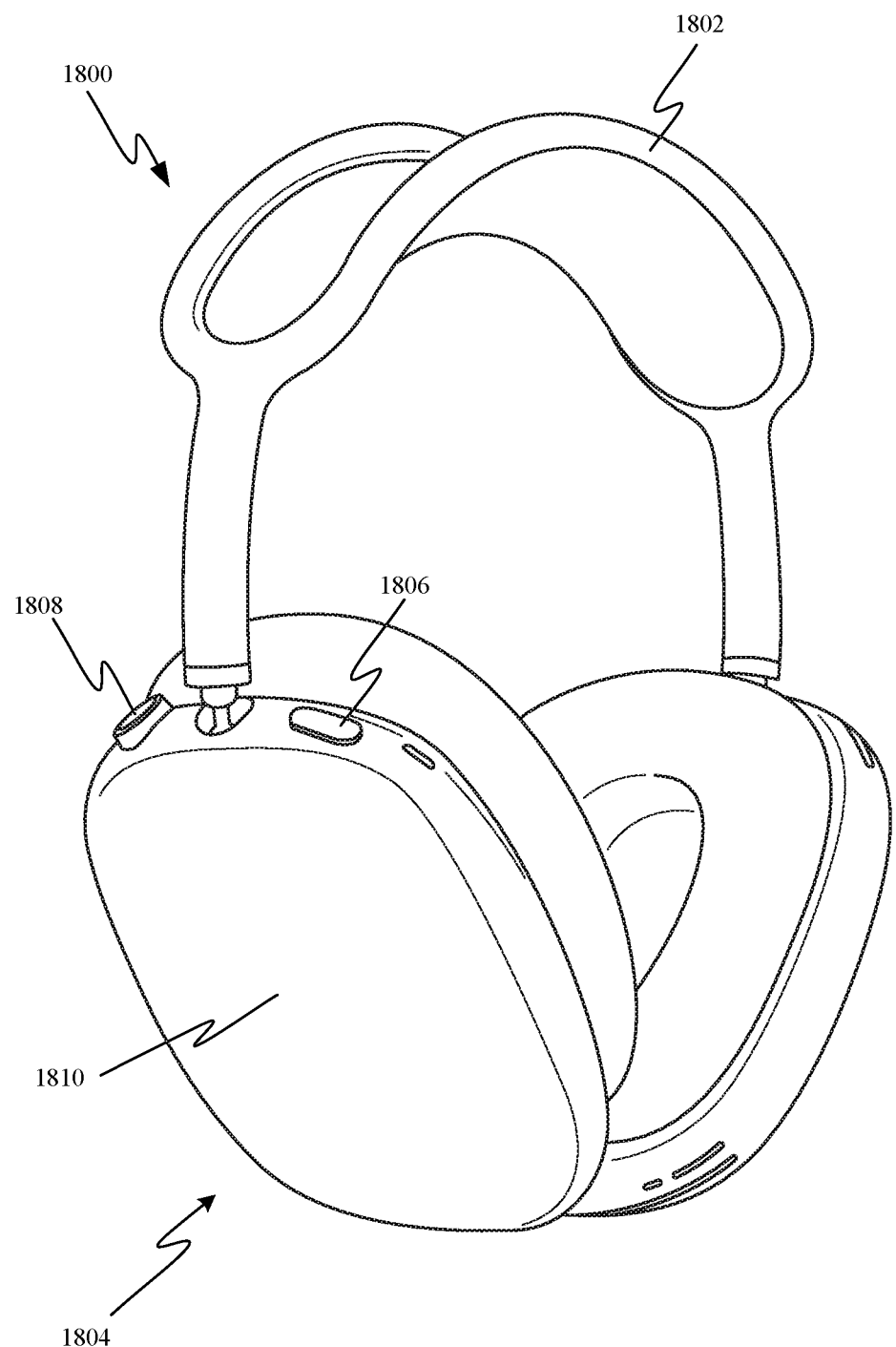
FIG. 18 shows a perspective view of a pair of headphones in accordance with some embodiments.

FIG. 18 is a simplified perspective view of a pair of headphones 1800 that includes first and second inputs 1806, 1808 (e.g., user controls) located on one of earpieces 1804 of the headphones. Headphones 1800 can be representative of headphones 100 or any of the other headphone embodiments of the present disclosure. The inputs 1806, 1808 can be or include buttons positioned along an upper portion of one of the earpieces 1804. In some embodiments, the inputs 1806, 1808 can be positioned on opposing sides of the headband assembly 1802. For example, the inputs 1806, 1808 can be positioned such that a user knows which input button they are interacting with based on the location of the input button relative to the headband assembly 1802. The inputs 1806, 1808 can be received into a housing 1810 of the earpieces 1804. For example, the housing 1810 can include an aperture that enables a first portion of the inputs 1806, 1808 (e.g., the portion a user directly interfaces with) to be external to housing 1810 and a second portion to be internal to housing 1810.

While each of the inputs 1806, 1808 can take the form of a button or any other input control, in some embodiments, input 1806 is an elongated button and input 1808 is a rotatable and depressible button. FIGS. 19A through 21 show examples of inputs 1806 and 1808 that can be used with headphones 1800.

Figure 19A:
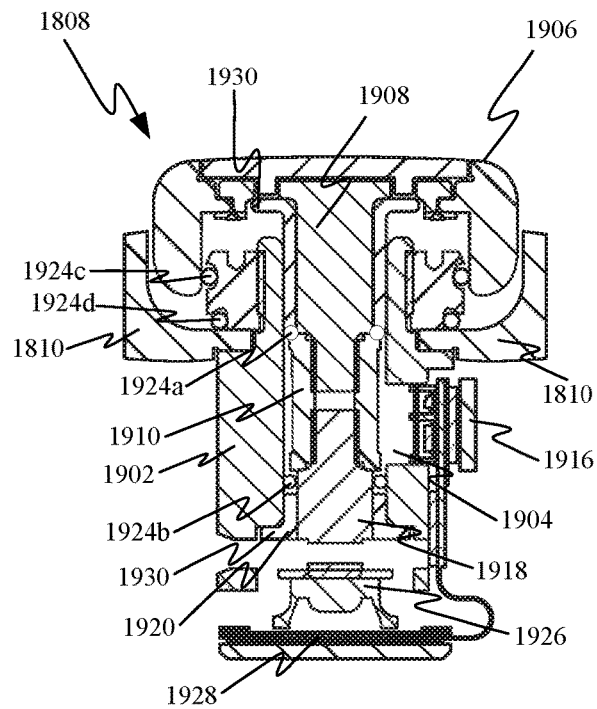
FIGS. 19A and 19B are simplified cross-sectional views of a user input button for use with the headphones of FIG. 18, in accordance with some embodiments.
Figure 19B:
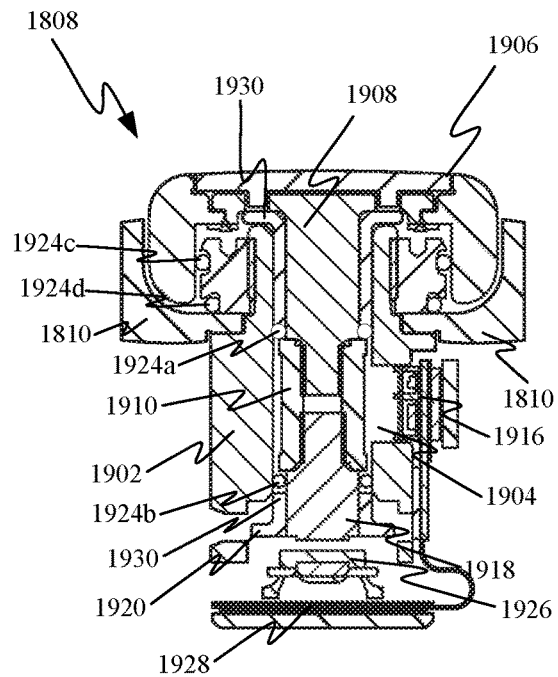

In various embodiments, the input 1808 can include a button that is able to perform more than one function (e.g., the button can be depressed and rotated). FIGS. 19A and 19B are cross-sections of an example input 1808 for use with headphones 1800 of FIG. 18. FIG. 19A shows in the input 1808 in an uncompressed state and FIG. 19B shows the input 1808 in a compressed state. A portion of the input 1808 can be received into the housing 1810 via a button housing 1902 (e.g., a sleeve) that defines a cavity 1904. The button housing 1902 can help secure one or more components of the input 1808 to the housing 1810 and can act to help seal the ingress of the cavity 1904. In various embodiments, a portion of the input 1808 can extend from the button housing 1902 and/or the housing 1810 and form a crown 1906. The crown 1906 can include material and/or features to aid a user in rotating and/or depressing the input 1808. For example, the crown 1906 can include grooves that allow a user to more easily grip the crown and rotate the input 1808. The crown 1906 can be coupled with a stem 1908 that extends into the button housing 1902 and engages with a coupling component 1910 that is sometimes referred to herein as a hub.

Figure 19C:
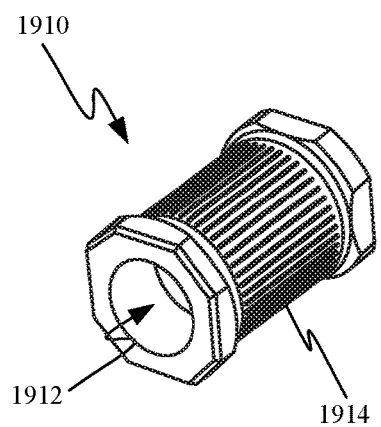
FIG. 19C is a perspective view of a component of the input button of FIGS. 19A and 19B, in accordance with embodiments.

As shown in FIG. 19C, which is a perspective view of coupling component 1910 according to some embodiments, the coupling component can include a channel 1912 (e.g., a central channel) extending through its length for receiving the stem 1908. The coupling component 1910 and the stem 1908 can be joined via the channel 1912 such that rotating the crown 1906 causes the stem 1908 and coupling component 1910 to rotate.

In various embodiments, the coupling component 1910 can include markings on at least a portion of the exterior surface. The markings can be formed based on characteristics of the material of the coupling component 1910. For example, the markings can be areas of discoloration on the surface of the coupling component 1910. In some embodiments, the markings can be made (e.g., etched, laser etched, and/or machined) on the exterior of the coupling component

1910. As shown in FIG. 19C, coupling component 1910 can include grooves 1914 fully around the periphery of coupling component 1910 extending between upper and lower rims of the component. The grooves 1914 form an encoder portion that can be detected by a sensor 1916 to detect movement of the coupling component 1910 (e.g., movement caused by a user applying force to the crown 1906). For example, the sensor 1916 can detect a rotation and/or translation of the coupling component 1910. The grooves 1914 can allow for greater precision in detecting the rotation and/or translation of the coupling component 1910 compared with using discoloration or similar markings on the exterior of the coupling component 1910 to detect the rotation and/or translation. For example, the grooves 1914 can cause less noise to be detected by the sensor 1916, which can increase the sensitivity of the sensing system.

The sensors 1916 can be or include an optical sensor, an accelerometer, a gyroscope, a capacitive sensor, a light sensor, an image sensor, a pressure or force sensor, or any suitable sensor for detecting data associated with the input 1808. In various embodiments, the sensor 1916 can include an optical transmitter 1917 (e.g., a light emitting diode (LED)) and a receiver 1919 (e.g., an optical receiver and/or a photo diode). The transmitter can direct light towards the coupling component 1910 which is reflected back to the receiver 1919. In some embodiments, some or all of the button housing 1902 (e.g., the portion between seals 1924a and 1924b) can include a coating to prevent the emitted light from being reflected by the button housing 1902 and creating noise in the system. For example, the coating can absorb light in a wavelength range between 700 nm and 900 nm. The sensor 1916 can be electrically coupled with an electrical control circuit (e.g., an audio control circuit) that can receive the light data and determine if the input 1818 is being rotated (e.g., by a user). The electrical control circuit can determine the direction and magnitude of the rotation of the input 1818 and adjust the audio output (e.g., volume up or volume down).

The coupling component 1910 can couple the stem 1908 with the stop 1918. The stop 1918 can include an step 1920 that extends around an outer surface. The step 1920 can have a larger diameter than the button housing 1902 and can aid in sealing the ingress of the button housing 1902 and/or cavity 1904 when the input 1808 is in the uncompressed state.

In various embodiments, seals 1924a, 1924b, 1924c, and/or 1924d (e.g., O-rings) can be positioned in and around the cavity 1904 to seal the ingress of the cavity 1904 and/or the button housing 1902 against foreign particles and/or moisture. The seals, which are referred to herein collectively as "seals 1924", can be or include material that is self-lubricating. A seal 1924a can be positioned in the cavity 1904, for example, near the upper portion of the coupling component 1910. The seal 1924a can seal the ingress of the cavity 1904 to prevent debris and/or moisture from reaching the coupling component 1910 and/or the sensor 1916. The seal 1924a can also prevent light from entering the cavity 1904. For example, the seal 1924a can be black to prevent possible light pollution into the cavity 1904. Preventing light from entering the cavity 1904 can allow for better sensor data to be collected by sensor 1916. Seal 1924b can aid in alignment of the stem 1908, coupling component 1910, and/or stop 1918 in the button housing 1902. For example, the seal 1924b can be or include an O-ring that prevents or reduces lateral movement of the stem 1908, coupling component 1910, and/or stop 1918.

Figure 19D:
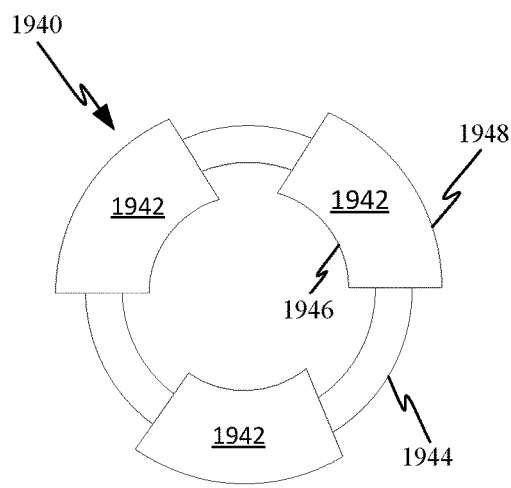
FIG. 19D is a top view of a component of the input button of FIGS. 19A and 19B, in accordance with some embodiments.

As shown in FIG. 19D, one or more of the seals 1924 can be or include an O-ring 1940. The O-ring 1940 can include large diameter portions 1942 and small diameter portions 1944. The large diameter portions 1942 can have an interior face 1946 that can engage with the stop 1918 and/or the stem 1908 and an exterior face 1948 that can engage with the button housing 1902. The large diameter portions 1942 can reduce the points of contact compared to an O-ring with a constant diameter. For example, the O-ring 1940 can be positioned between the button housing 1902 and the stop 1918 with the large diameter portions 1942 engaged with the button housing 1902 and the stop 1918 and the small diameter portions 1944 can be free from engaging with the button housing 1902 and the stop 1918. Reducing the points of contact can reduce the friction and/or resistance caused by the O-ring 1940 which can reduce the force needed to compress input 1808. The O-ring 1940 can be or include silicon, plastic, self-lubricating material and/or any suitable material.

As shown in FIG. 19B, the seals 1924a and/or 1924b can move with the stop 1918 (e.g., in a vertical direction) to seal the ingress of the button housing 1902 (i.e., the ingress remains sealed by the seals 1924a and/or 1924b when crown moves in the vertical direction). Seals 1924c and 1924c can be positioned between the crown 1906 and the button housing 1902 to aid in sealing the ingress of the button housing 1902 and/or the cavity 1904. In some embodiments, seals 1924 can change the force needed to compress input 1808. For example, seal 1924a can be made of a material that reduces the force needed to compress input 1808. The seals 1924 can be or include a compressible material and/or a self-lubricating material. In various embodiments, the seals 1924 can be or include silicon, rubber, or any suitable material.

FIG. 19B shows the input 1808 in the compressed state. In the compressed state, stop 1918 can engage with dome 1926. The dome 1926 can be or include a resilient and flexible material that collapses or flexes upon a predetermined force level and returns to its original shape when the force is removed. For example, the dome 1926 can be or include rubber and/or silicone. The dome 1926 can collapse (e.g., in response to the stop 1918 depressing the dome 1926) and causing contact element 1928 to generate an electrical signal (e.g., by completing an open circuit on contact element 1928). The electrical signal can indicate that a user has triggered an input (e.g., pressed input 1808).

In various embodiments, the dome 1926 can be optimized to withstand a certain amount of applied force before collapsing (i.e., a click ratio of the dome 1926). An increasing force (e.g., by a user) can be applied to the dome 1926 (e.g., via the crown 1906) until the dome 1926 can no longer resist the force and begins to collapse. The force at which the dome 1926 begins to collapse is the peak force of the dome 1926. The peak force can be a single force value or a range of force values. For example, the dome 1926 can have a peak force between 4 N and 8 N. The dome 1926 reaching the peak force and collapsing can provide feedback to a user. For example, a user can be alerted an action has occurred because the force needed to move the dome 1926 decreases as the dome 1926 collapses.

Force can continue to be applied to the dome 1926 until the dome 1926 makes contact with the contact element 1928. A force ratio (e.g., a click ratio) can be determined for the dome 1926 by subtracting the bottom force from the peak force and dividing the resulting number by the peak force. As an illustrative example, if the peak force (i.e., the force needed to collapse the dome 1926) is 6 N and the bottom force (i.e., the force needed to, after the dome 1926 has collapsed, move the dome 1926 into contact with the contact element 1928) is 1 N the resulting force ratio would be 0.83 (i.e., $$\frac{6-1}{6}$$

). A larger force ratio can provide better feedback to the user and enhance their interaction with the input 1818.

In various embodiments, dampening material 1930 can be positioned between components to reduce or prevent vibration (e.g., noise) when the components make contact. The noise made by components making contact with one another is of greater concern when the components are made of or include metal. In traditional headphones, these metal components are allowed to contact one another and can generate a contact noise that is unpleasant for users. The dampening material 1930 can be positioned between components (e.g., metal components) to reduce the noise generated by the components when they come in contact with one another. In various embodiments, dampening material 1930 can be positioned between the crown 1906 and the button housing 1902 to reduce the noise generated when the crown 1906 contacts the button housing 1902 (e.g., when the crown 1906 is depressed). The dampening material 1930 can extend into the button housing 1902 and curved to be positioned between a lower surface of the crown 1906 and the button housing 1902. Additionally or alternatively, the step 1920 can be or include dampening material 1930 to reduce the noise generated when the step 1920 engages with the button housing 1902 (e.g., when the crown 1906 is released). The dampening material 1930 can be a component with an annular opening (e.g., a collar or a channel). The dampening material 1930 can be or include plastic (e.g., soft plastic), rubber, silicone, foam, and/or similar material that reduces noise when components contact.

Figure 20A:
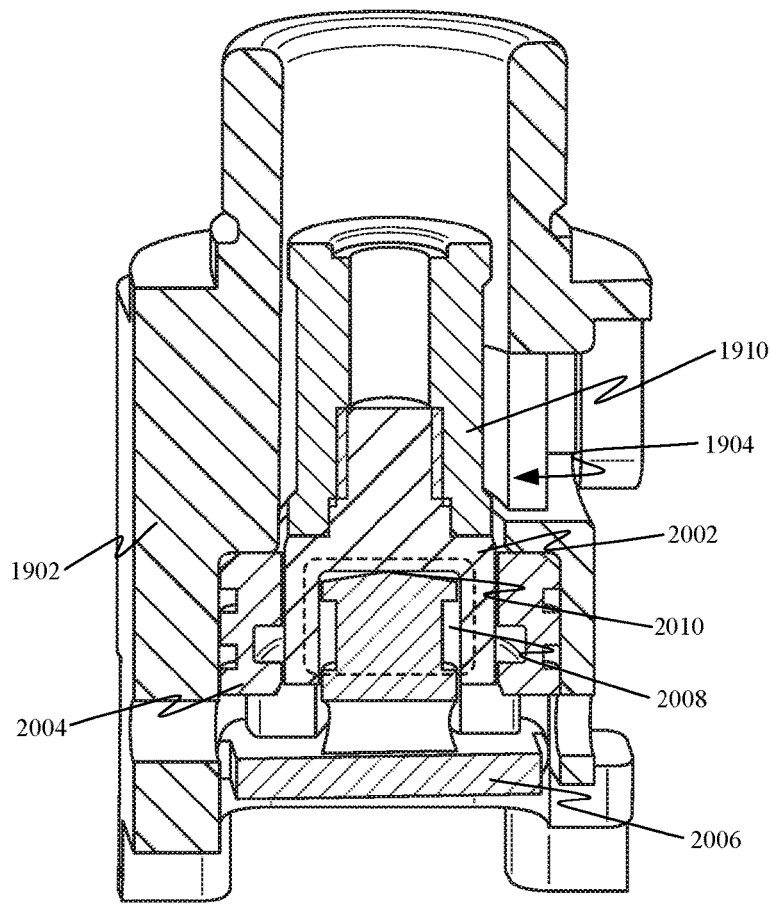
FIGS. 20A through 20D are simplified cross-sections of another example user input button for use with the headphones of FIG. 18, according to some embodiments.

In embodiments, it can be desirable to keep stop 1918 from rotating directly on the dome 1926 because continued rotation on the dome 1926 can cause damage. Additionally, it can be desirable to optimize the force needed to rotate the input 1808. FIGS. 20A-20D show cross-section views of various components for use with the input 1808 of FIG. 18. FIG. 20A includes a coupling component 1910 positioned in cavity 1904. A retaining component 2002 can be coupled to the coupling component 1910 and held laterally in place in the cavity 1904 by a bearing 2004. A decoupler can be positioned in a cavity 2008 of the retaining component 2002. The decoupler 2006 can include a rotation surface 2010 for engaging with the retaining component 2002. The rotation surface 2010 can allow for rotation of the coupling component 1910. Rotating on the rotation surface 2010 allows for rotation of the input 1808 without rotating on dome 1926.

Figure 20B:
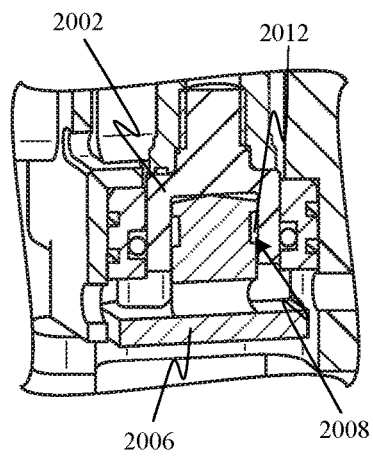
Figure 20C:
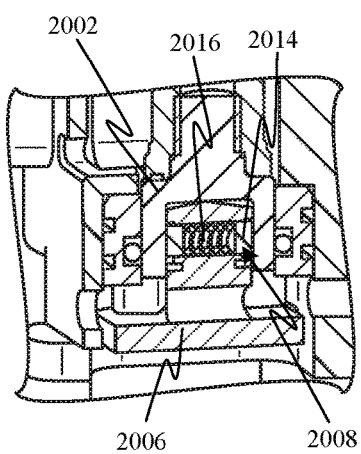
Figure 20D:
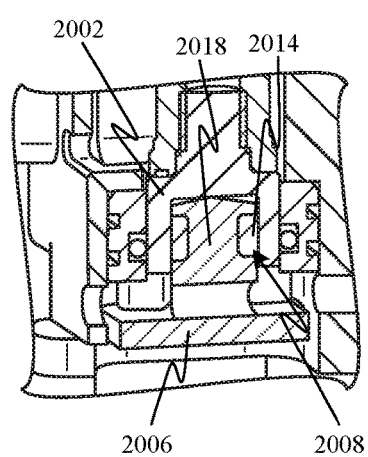

FIGS. 20B through 20D show components that can be used with the components of FIG. 20A to optimize the rotation force of the input 1808. Optimizing the rotation force can allow for a user to make an accurate selection using the rotation of the input 1808 without needing to apply excessive force. The rotation force can be optimized by changing the resistance between the decoupler 2006 and the retaining component 2002. FIG. 20B shows using shims 2012 positioned in the cavity 2008 of the retaining component 2002 to change the friction force between the decoupler 2006 and the retaining component 2002. Different sized shims 2012 can be used to optimize the rotation force for the components used in the input 1808. FIG. 20C shows using an expansion component 2014 positioned in the decoupler 2006 to adjust the friction force between the decoupler 2006 and the retaining component 2002. The expansion component 2014 can include a spring 2016 that can be changed to optimize the rotation force. FIG. 20D shows using an elastic material 2018 (e.g., a seal) to adjust the resistance force. Similar to the shims 2012, the elastic material 2018 can be changed until the rotation force has been optimized.

Figure 21:
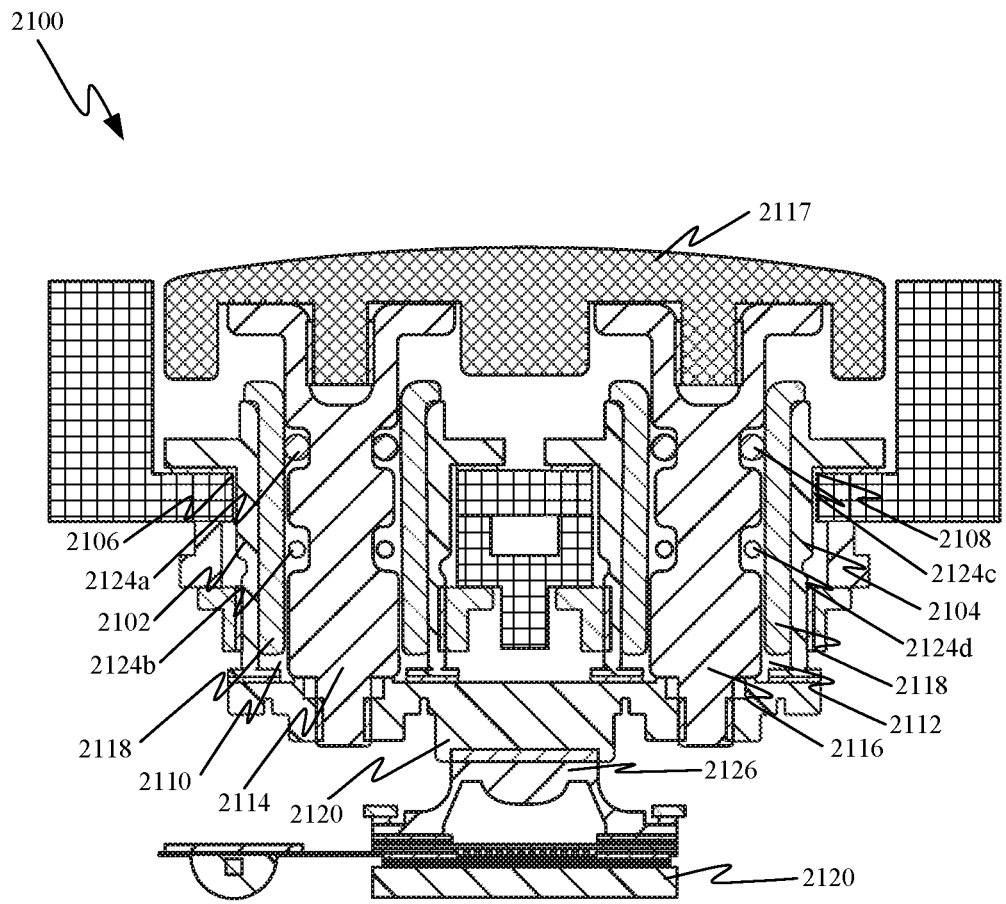
FIG. 21 is a simplified cross-sectional view of an another example button for use with the headphones of FIG. 18, according to some embodiments.

Turning to FIG. 21, a cross-section of an example input 1806 is shown. The input 1806 can have the same or similar components to input 1808, however, the input 1806 can have additional and/or alternative components. Two sleeves 2102 and 2104 can be received into respective apertures 2106 and 2108 in the housing 1810. The sleeves 2102, 2104 can define respective cavities 2110 and 2112. The cavities 2110, 2112 can receive respective stems 2114 and 2116. The stems 2114, 2116 can be connected via a plate 2117 such that applying a force to the plate 2117 causes the stems 2114, 2116 to move downwards in the sleeves 2102, 2104. The plate can be or include metal and/or a similar material that can be resistant to bending and/or flexing. In various embodiments, the length of the stems 2114, 2116 can be optimized for alignment in the sleeves 2102, 2104. For example, the stems 2114, 2116 can be made longer for better alignment in the sleeves 2102, 2104. Bushings 2118 can be positioned between the stems 2114, 2116 and the sleeves 2102, 2104 to align the stems 2114, 2116 in the sleeves 2102, 2104 and/or reduce friction between the stems 2114, 2116 and the sleeves 2102, 2104 respectively. The bushings 2118 can be or include self-lubricating material to reduce friction. In various embodiments, a portion of the bushings 2118 can be positioned above the sleeves 2104 (e.g., between In various embodiments, the stems 2114, 2116 can be inserted into the sleeves 2102, 2104 and the sleeves 2102, 2104 can be positioned into apertures 2106, 2108. In various embodiments, the apertures 2106, 2108 can have different diameters. For example, aperture 2108 can have a smaller diameter than aperture 2106. The difference in diameters of the apertures 2106, 2108 can aid in aligning the input 1806. The aperture 2108 can have a tight fit with the sleeve 2104 and the aperture 2106 can have a loose fit with the sleeve 2102. The difference in fit can allow for some lateral movement of the sleeve 2102 in the aperture 2106. The lateral movement of the sleeve 2102 in the aperture 2106 can allow the stem 2114 to remain aligned in the sleeve 2102 during installation of the sleeve 2102. The sleeves 2102, 2104 can be positioned in the apertures 2106, 2108 and secured in place (e.g., glued or secured with fasteners).

In various embodiments, the stems 2114, 2116 can be connected via connector 2120. The connector 2120 can join the stems 2114, 2116 so that movement of the two stems 2114, 2116 results in the movement of the connector 2120. The connector 2120 can be positioned above a dome 2126 (e.g., a collapsible dome). The dome 2126 can be the same as or similar to dome 1926. For example, dome 2126 can be or include a deformable material that can be compressed and return to its original shape. In various embodiments, the dome 2126 can be optimized to have a high force (i.e., click ratio) to enhance user feedback that input 1806 has been depressed. The dome 2126 can be collapsed and contact a contact element 2128. The contact by the dome 2126 can cause contact element 2128 to generate an electrical signal. The contact element 2128 can be electrically connected to one or more electrical components in the earpieces 1804. For example, the contact element 2128 can be electrically connected to an audio control circuit. The contact element 2128 can send the electrical signal to the audio control circuit which can adjust the audio output (e.g., play, pause, next track, skip track). In some embodiments, the electrical signal can cause the audio control circuit to toggle the earpieces 1804 between two or more modes (e.g., a noise cancelling mode and a listening mode).

In various embodiments, the input 1806 can include one or more seals (e.g., seals 2124*a*-2124*d*, which are referred to herein collectively as "seals 2124") that can be positioned in the sleeves 2102, 2104. The seals 2124 can seal the ingress of the cavities 2110, 2112 for foreign debris and/or moisture. The seals 2124 can additionally or alternatively aid in alignment of the stems 2114, 2116 in the sleeves 2102, 2104. In various embodiments, one or more of the seals 2124 can be or include an O-ring. For example, seals 2124*a* and 2124*c* can be or include self-lubricating O-rings that can aid in reducing friction of the stems 2114, 2116 when the input 1806 is being depressed. In further embodiments, seals 2124*b* and 2124*d* can be or include O-rings with portions of the O-rings having a larger diameter. Portions of the seals 2124*b*, 2124*d* having a larger diameter can reduce the points of contact between the seals 2124*b*, 2124*d* and the sleeves 2102, 2104 and/or the bushings 2118 which can reduce the friction caused by the seals 2124*b*, 2124*d*.

Figure 22A:
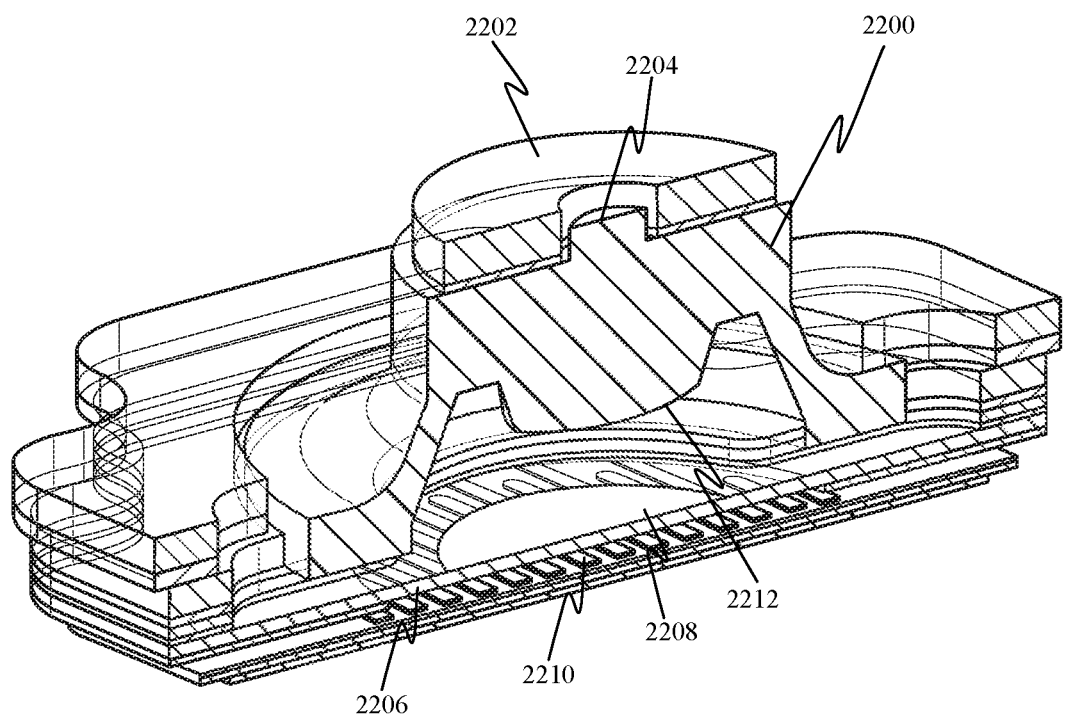
FIGS. 22A and 22B are cross-sectional views of a portion of an example button for use with the headphones of FIG. 18 in accordance with some embodiments.
Figure 22B:
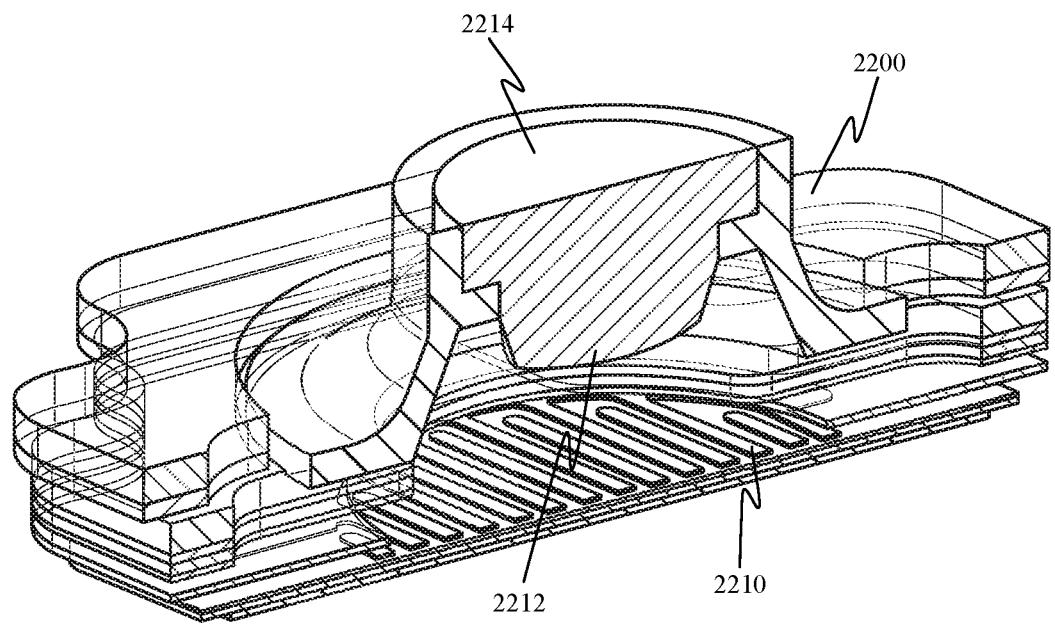

In various embodiments, the inputs 1806 and 1808 can include a deformable dome (e.g., domes 2126 and 1926 respectively). As shown in FIGS. 22A and 22B, the dome 2200 can be or include deformable material that can collapse and return to its original shape. In various embodiments, the dome 2200 can include a low-friction surface 2202. The low-friction surface 2202 can be attached to the dome 2200 and/or may be or include treating a portion of the material of the dome 2200. The low-friction surface 2202 can interface with the stop 1918 of input 1808 and/or the connector 2120 of input 1806. The low-friction surface 2202 can be or include a material with a low coefficient of friction (e.g., silicon, silicon dioxide, and/or self-lubricating material). In various embodiments, the low-friction surface 2202 can be formed by shinning UV light onto the upper portion of the dome 2200. For example, UV light can be shined onto the upper portion of a dome 2200 that includes silicon to form silicon dioxide. In some embodiments, the low-friction surface 2202 can be or include a replaceable shim. The shim can be changed to optimize the friction of the low-friction surface 2202. In further embodiments, the low-friction surface 2202 can be or include lubricants deposited onto the dome 2200.

In various embodiments, the dome 2200 can include one or more features for engaging with the low-friction surface 2202. For example, the dome 2200 can include a projection 2204. The projection 2204 can be used to align the low-friction surface 2202 with the dome 2200. The projection 2204 can additionally or alternatively be used to retain the low-friction surface 2202 on the dome 2200.

In various embodiments, the dome 2200 can be positioned above a sheet 2206 (e.g., a deformable sheet). The dome 2200 can be formed directly on the deformable sheet and/or joined to the deformable sheet using an adhesive and/or a fastener that extends through a portion of the dome 2200 and the sheet 2206. The sheet 2206 can be deformed by the dome 2200 to contact a conductive film 2208 to electrical traces 2210 (e.g., electrical contacts that are separated such that they form an open circuit). The conductive film 2208 can contact the electrical traces 2210 and complete an electrical circuit. The electrical traces 2210 can be electrically connected to one or more electrical circuits in the earpieces 1804 and can send an electric signal to the electrical circuits when the conductive film 2208 contacts the electrical traces 2210.

In some embodiments, the dome 2200 can include electrically conductive material 2212. For example, as shown in FIG. 22B, the dome 2200 can include an electrically conductive insert 2214. In embodiments with the electrically conductive material 2212, the conductive film 2208 may not need to be positioned between the dome 2200 and the electrical traces 2210. For example, the electrically conductive insert 2214 can engage with the electrical traces 2210 to close the electrical circuit between the electrical traces 2210 and send a signal to the electrical circuits in the earpieces 1804. In various embodiments, the electrically conductive material 2212 can be positioned on the exterior surface (e.g., bottom surface) of the dome 2200. The electrically conductive material 2212 can be or include conductive silicone and/or similarly conductive material.

On-Head Detect

It can be desirable to determine when headphones 100 are being donned by a user and when the headphones 100 have been doffed by the user. For example, when headphones 100 are doffed, the headphones can be put into a low power mode (e.g., a sleep or standby mode) and when the headphones are donned, the headphones can change from a low power mode to a higher powered mode that enables functions or activates features not available in the low power mode. Additionally or alternatively, audio playback can automatically start (e.g., the audio can start playing) when the headphones 100 have been determined to be donned by a user and audio playback can automatically stop (e.g., the audio can by paused) when the headphones 100 have been determined to be doffed by the user.

Figure 23:
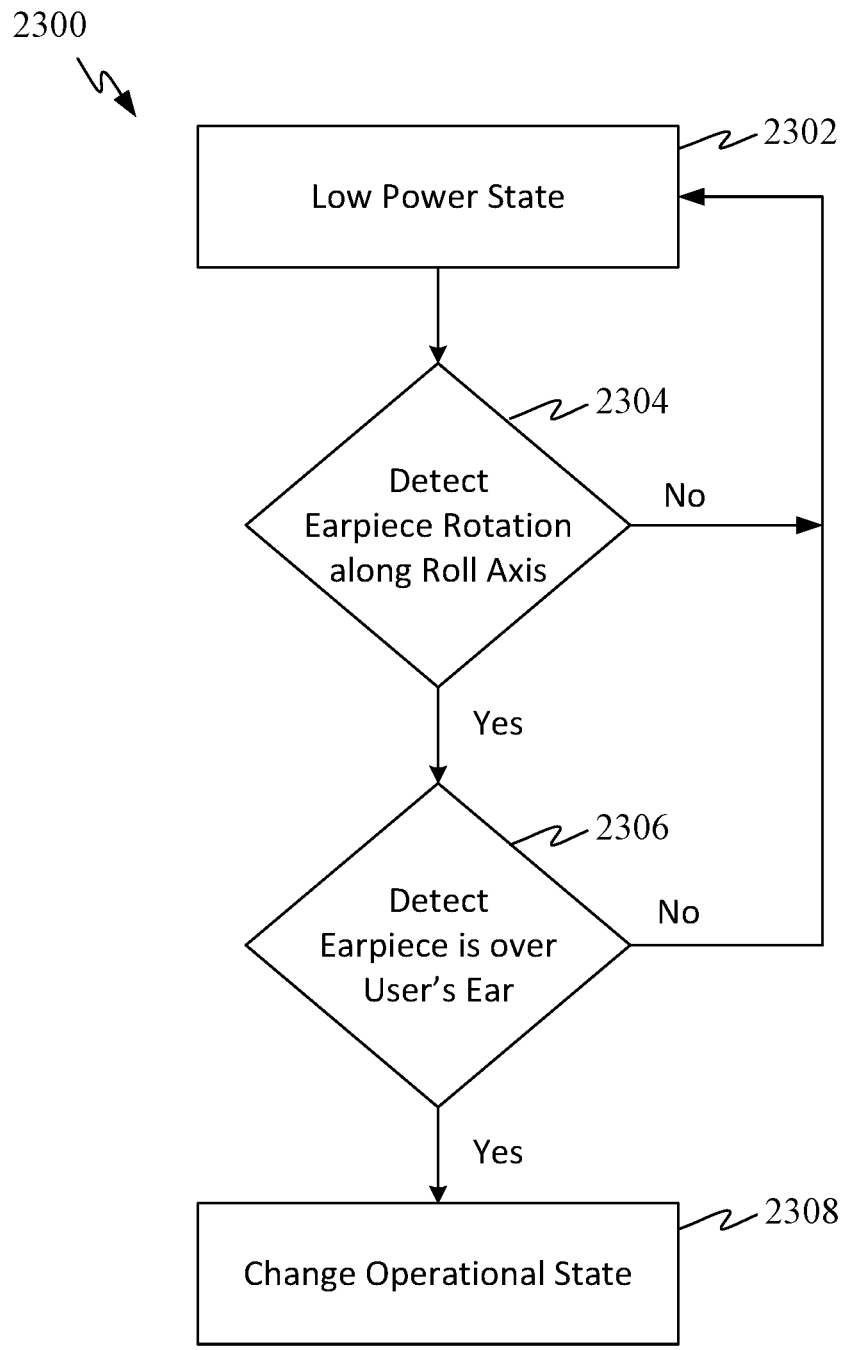
FIG. 23 is a flowchart showing a process for on-ear detection using an on-ear detection, according to some embodiments.

While it can be desirable and beneficial to determine when headphones are placed on a user's head, it can be challenging to accurately make such a determination in all use-case scenarios. Some embodiments of the disclosure can perform a multi-step process to accurately making such a determination. FIG. 23 illustrates an example process 2300 that can be used by the pairs of headphones disclosed herein to detect when a user has donned the pair of headphones. As shown in FIG. 23, a pair of headphones can start in a low power operational state, such as a sleep state, standby state, lower power state (block 2302) in which only certain components, for example one or more sensors within the headphones that can detect environmental changes, receive power and are operational. In some embodiments the low power state (block 2302) can be an intermediate power state. For example, in some embodiments the headphones can have an extreme low power (or deep sleep state) in which the headphones can stored in a charging case for extended periods of time while consuming minimal power. The headphones can exit the deep sleep state when, for example they are removed from their case, and enter a second low power state in which certain sensors receive power that did not receive power in the deep sleep state.

In some embodiments, while the headphones are in low power state 2302, sensors that detect whether the earpieces are pulled apart or otherwise rotated are operational. Process 2300 can be a multi-step process in which the circuitry within the headphones (e.g., a process or other type of controller) determines whether the headphones are donned based on readings from different sensors. For example, a mechanism that allows the earpieces to rotate and pivot, such as pivot mechanism 400 described above, can be leveraged to provide an initial indication that a user may have donned or is about to don a pair of headphones. Sensors associated with the pivot mechanism can detect that the earpieces have been bent or pulled outward by detecting a change in the angle of the earpieces relative to the headband along roll axis 404 (block 2304.) Such an angle change, when above a predetermined amount (e.g., greater 10 degrees or greater than 15 degrees or greater than 20 degrees), can indicate that the earpieces have been moved into a wearable configuration and process 2300 can proceed to a next step in its on-head detect algorithm. If, on the other hand, the roll axis sensor detects that the earpieces have been pulled apart but not by a sufficient amount to indicate that the headphones are on or about to be placed on a user's ear (i.e., the angle change is less than the predetermined amount), process 2300 can keep the headphones in low power state 2302.

Making an on-head detect determination based on sufficient movement of the earpieces with respect to the roll axis in block 2304 alone, however, can result in false triggers. For example, a user may pull the earpieces apart in preparation for donning the headphones but then change his or her mind and put the headphones away. Thus, some embodiments can use a second set of sensors, such as optical sensors or another appropriate type of proximity sensor or other sensor that can determine if a user's ear or other object is placed within the inner portion of the earpiece to confirm and make a final determination that the headphones have been donned (block 2306). In some embodiments, an optical emitter and optical receiver can be included in one or both earpieces as the second sensor. The optical emitter can emit one or more beams of radiation out of the earpiece towards a location where the user's ear would be if the headphones were placed on a user's head. Then, if the headphones are worn, radiation that is reflected back off the user's ear can be detected by the optical sensor. The detected radiation can then be sent to a processor to confirm that the headphones have been placed on a user's head (block 2306, yes) if, for example, the intensity of the detected radiation is above a predetermined threshold. If no radiation (or radiation below a threshold intensity value) is reflected back, embodiments can determine that the headphones are not on a user's ear (block 2306, no) and process 2300 can keep the headphones in low power state 2302.

When process 2300 determines that the earpieces have rotated along the roll axis beyond a predetermined amount 2308 and the second set of sensors has determined that the headphones are on a user's ear, process 2300 can change the operational state of the headphones 100 from low power state 2302 (e.g., a mode in which wireless circuitry to receive and send audio data between the headphones and a host device is not operational) to a higher power, operational mode (e.g., a mode where audio data can be wirelessly transferred between the headphones and a host device).

It is worth noting that relying on output from the second sensor alone, without making an initial determination in block 2304, can also lead to false positives. For example, the second sensor (or set of sensors) used in block 2306 could generate a false positive sensor signal indicative of the headphones being worn if the headphones are placed with the earpieces down on top of a reflective surface, such as a white table top. Thus, by combining the sensor readings from blocks 2304 and 2306, embodiments of the disclosure can provide a reliable indication as to when a user dons a pair of headphones.

Figure 24:
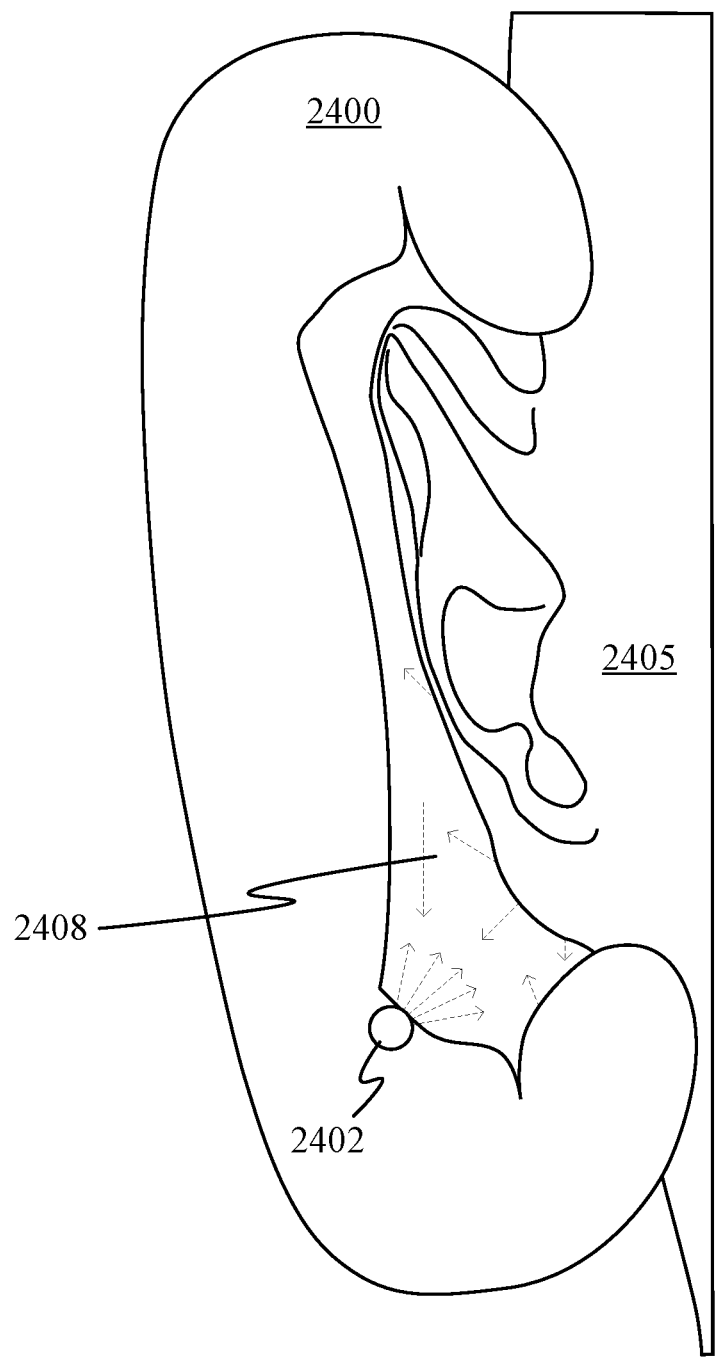
FIG. 24 shows an earpiece of headphones positioned over an ear of a user.

Some embodiments of the disclosure further relate to an optical sensor that can generate highly accurate sensor readings that can be used in block 2306 for an improved on-head detect determination as compared to previously known optical sensors. In some instances it is relatively easy for a simple optical sensor, such as a light emitting diode and a photodiode combination, to detect reflected radiation that can be indicative of when the headphones are on a user's ear. For example, FIG. 24 illustrates a simplified cross-section of an earpiece 2400 that includes a sensor 2402 (e.g., an optical sensor) for determining when the headphones 100 are donned or doffed by a user 2405. The earpiece 2400 can define a region 2408 within the inner periphery of its earpiece in which a portion of the user 2405 (e.g, the user's ear) can be situated. Sensor 2402 can be positioned in the earpiece 2400 and oriented to detect whether the user's ear is positioned within the region 2408. For example, the sensor 2402 can emit light radiation into region 2408 and detect whether any portion of the emitted light is reflected back to a photo sensor within sensor 2402.

In many user-case scenarios, the photodiode in sensor 2402 can readily detect light emitted from the LED in sensor 2402 when the headphones are on a user's head. In certain situations, however, such detection can be made more difficult resulting in a false negative determination. For example, users can have hair colors having different levels of reflectivity, some of which can adversely impact the sensor reading resulting in a false determination that the headphones are not donned. Some embodiments of the disclosure pertain to an optical sensor that can detect when a user's ear is placed within the region 2408 in use-case scenarios when other sensors may generate false negative readings.

Figure 25A:
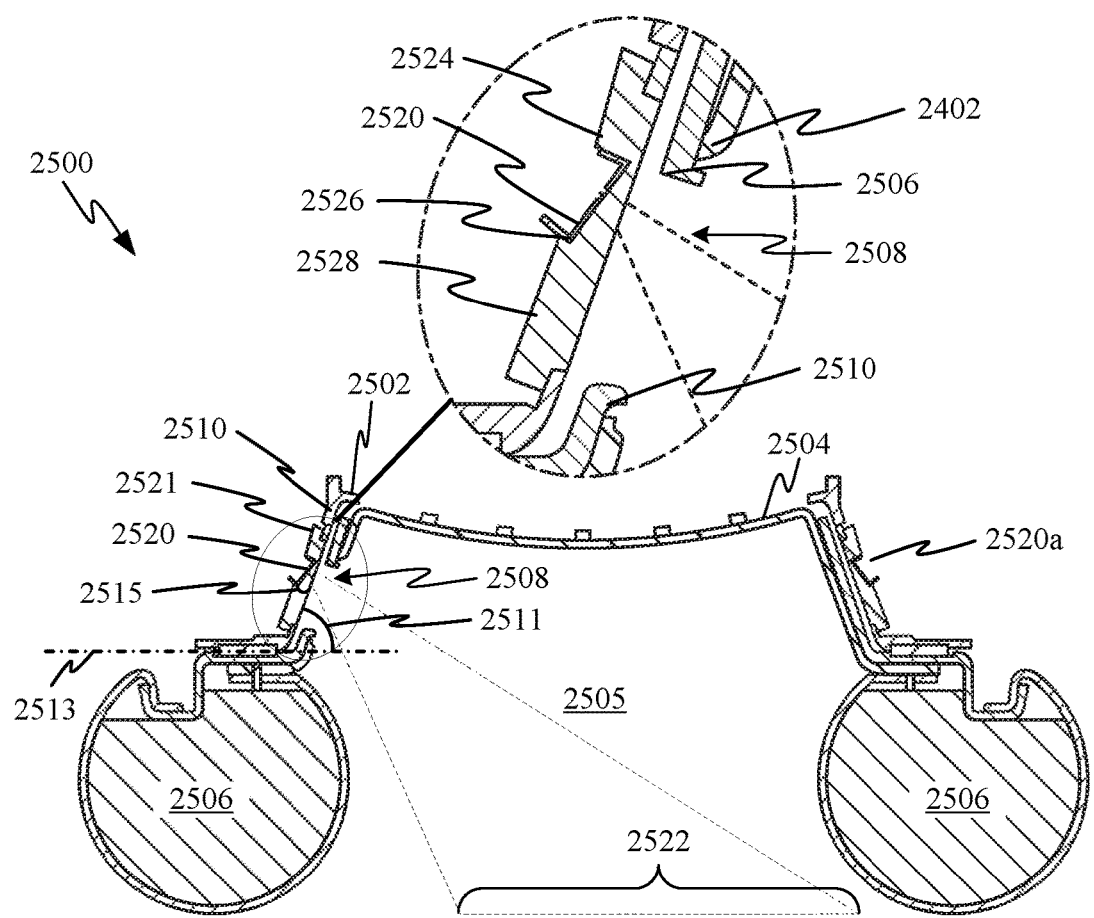
FIG. 25A shows a cross-section of an earpiece with an on-ear detection system, according to some embodiments.

FIG. 25A is a simplified illustration of a portion of an earpiece 2500 that includes an on-ear detect optical sensor according to some such embodiments. Earpiece 2500 can be representative of one or both of earpieces 104 discussed with respect to FIG. 1 or can be representative of any of the other earpieces described in the present disclosure. Earpiece 2500 can include a housing 2502 and a cover 2504 (e.g., an earpiece cover) attached to housing 2502 that includes multiple perforated holes to enable sound from an acoustic driver positioned within the housing to be directed out of housing 2502 towards a user's ear. An earpiece cushion assembly 2506 can be attached to the housing 2502 and cover 2504.

A sensor 2520 (e.g., an optical sensor) can be attached to the housing 2502 and oriented to detect a portion of a user (e.g., an ear of a user) positioned in the region 2505 within the inner periphery of earpiece cushion assembly 2506. For example, sensor 2520 can have a field of view (FOV) 2522 (the area in which light is emitted from the sensor and the area in which the sensor can detect reflected light) that is relatively wide cone to encompass a large region within region 2505 yet is confined to the inner periphery of the earpiece cushion assembly. Sensor 2520 can be an electro-optical device that includes one or more emitters (e.g., one or more vertical cavity surface emitting lasers, VCSELs) and an optical receiver (e.g., an array of photo sensors). In some embodiments, sensor 2520 includes a single nanosecond pulse VCSEL laser in the infrared wavelength range and a beam steering device that can direct the laser pulses at different individual fields of view within the larger FOV 2522 of sensor 2520.

In some embodiments, sensor 2520 further includes an array of SPADs as the receiver that can detect the reflected beams from within the FOV 2522. Thus, when earpiece 2500 is placed on a user's head, the sensor 2520 emits collimated beams of pulsed radiation at different locations within the FOV 2522. The pulsed laser beams can reflect off of the user (e.g., off the user's ear or portion of the user's skull surrounding the ear) and be detected by the SPAD array optical receiver. A processor or similar control circuit (not shown) within earpiece 2400 can be coupled to sensor 2520 to control the timing of the laser pulses and receive detection signals generated by the optical receiver. The processor can utilize the known timing of the laser pulses and other known information to determine the distance to the user's ear (or other reflected object) using time of flight calculation techniques. For example, the time of flight can be determined by emitting a beam of light at an object and measuring the time it takes a receiver to detect the light reflected off the object. In some embodiments the sensor 2520 can detect objects between approximately zero and at least approximately 300 mm away from the sensors. For example, the sensors 2520 can detect objects positioned approximately 1 mm to approximately 100 mm away from the sensor 2520.

Sensor 2520 can be electrically coupled with a processor for processing of the data detected by the SPAD as discussed above. The processor can additionally or alternatively change the headphones between a standby mode and an operational mode (e.g., between a low power mode and a higher power mode) as described with respect to FIG. 23. The processor can determine if the intensity of the reflected light meets a certain threshold and if the distance of the object indicates it is within the region 2505. SPADs are highly sensitive devices that can detect radiation as small as a single photon in some instances. Because of the sensitivity of the SPAD optical receiver array and the ability of sensor 2520 to both detect an intensity of reflected radiation and determine a distance from the sensor to the object that the pulsed beams are reflected from, embodiments of the disclosure can use both such pieces of information to determine if the earpiece is on a user's head in block 2306 discussed above. For example, process 2300 at block 2306 can include receiving reflected radiation data (e.g., photon counts) detected by the SPAD array and determine if the intensity of the reflected radiation meets a threshold and/or if the distance to the object the radiation is reflected off of is greater than predetermined distance. If the intensity of the reflected radiation is below the threshold, the processor can determine the headphones are not on a user's head. The processor can also determine the object that the headphones are not actually being worn by a user when the intensity of reflected radiation is above the threshold but the distance to the object is greater than a predetermined distance (e.g., greater than the border of the region 2505). If the intensity of the reflected radiation is above the threshold and the distance is less than the predetermined distance, the processor can determine that the headphones are on a user's head.

As shown in FIG. 25A, sensor 2520 can be positioned behind an aperture 2508 formed in a sidewall portion 2510 of housing 2502 and cover 2504 to enable sensor 2520 to both project radiation into region 2505 and receive radiation reflected from one or more surfaces within the region 2505 back to the optical sensor. In various embodiments, sensor 2520 can be positioned on carrier 2521 that can couple with sidewall portion 2510 and span the width of aperture 2508. In some embodiments, the sidewall portion 2510 can be at an angle 2511 relative to axis 2513. For example, the sidewall portion 2510 can be at an angle 2511 in a range between 20 degrees and 60 degrees relative to axis 2513. In further embodiments, the sensor 2520 can be oriented at an angle 2515 relative to the sidewall portion 2510, for example, at an angle 2515 in a range between 15 degrees and 50 degrees. of design considerations require that an angle of the sidewall portion 2510 of cover 2504 be such that an optical sensor mounted directly to housing 2502 (which includes a sidewall surface directly behind sidewall portion 2510) would direct at least some radiation towards the earpiece cushion assembly 2506. Radiation directed to the earpiece cushion can be readily reflected back to sensor 2520 and generate a false positive reading. To prevent such a situation and confine the field of view of sensor 2520 to a region within the earpiece cushion as shown by FOV 2522, some embodiments of the disclosure include a carrier 2524 coupled between sensor 2520 and housing 2502. Carrier 2524 can include an angled portion 2526 for mounting the sensor 2520 at an optimized angle relative to the housing 2502 and cover 2504 such that a field of view of sensor 2520 can detect a user's ear without encompassing any portion of the earpiece cushion assembly 2506. In some embodiments the portion 2526 of carrier enables sensor 2520 to be oriented at an angle in a range between 20 and 40 degrees relative to housing 2502 of the earpiece 2400. For example, the sensor 2520 can be oriented at a 32 degree angle relative to the housing 2502.

In some embodiments, sensor 2520 can emit radiation in the infrared wavelengths and portion 2526 can be transparent to the emitted IR wavelength. Since some portion of the emitted radiation can reflected off the housing 2502 in the area of aperture 2508, some portions of the disclosure coat a back surface 2528 of carrier 2524, in an area surrounding angled portion 2526, with an IR absorbing material to absorb IR light that can be reflected off of an inner surface of the housing and back towards the sensor.

Figure 25B:
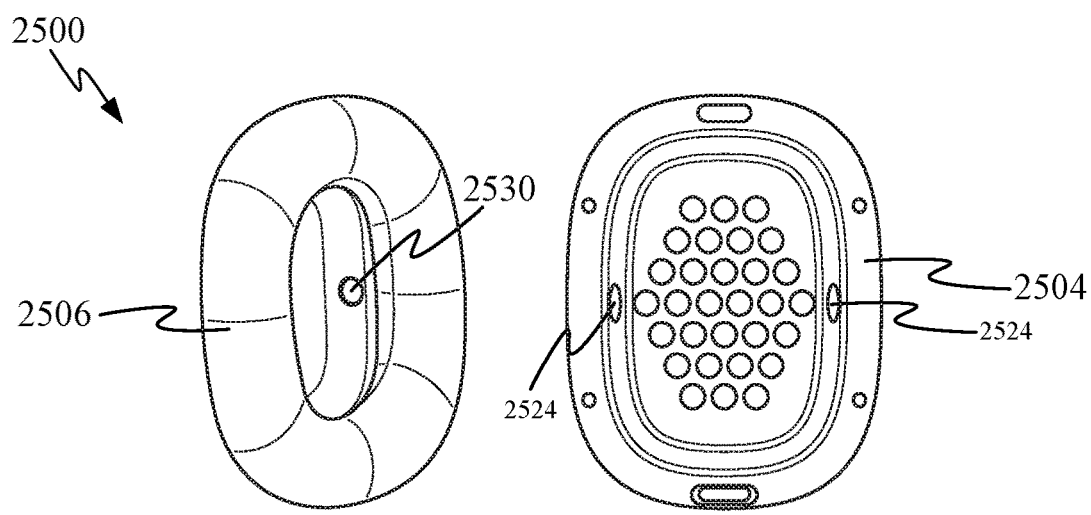
FIG. 25B shows various components for use with the on-ear detection system of FIG. 25A, according to some embodiments.

FIG. 25B shows portions of the earpiece 2500 that can be used with the sensor 2520. The earpiece 2500 can include a cover 2504 and an earpiece cushion assembly 2506. The earpiece cushion assembly 2506 can include an aperture 2530 that allows the sensor 2520 to emit radiation through the cushion assembly and into region 2502 as described above. The cover 2504 can include a carrier 2524 positioned over the aperture 2530 that allows IR light through while blocking non-IR light. The cover 2412 can additionally or alternatively include or be made from a scratch resistant material that can resist damage that may cause noise in the detection system. The cover 2412 can be or include Nickel Titanium Oxide ($NiO_3Ti$).

In some embodiments, earpiece 2500 can include two sensors 2520 on opposing sides of the earpiece where one of the sensors can be blocked by the cover 2504 and/or the earpiece cushion assembly 2506 (e.g., as shown by sensor 2520*a* being positioned adjacent to a side of the cover 2504 that does not include aperture 2508). The sensor 2520 can detect that there is something blocking the sensor based on detecting constant substantially stable data and/or a time of flight reading indicating there is an object positioned next to the sensor 2520. In response to determining the sensor 2520 is blocked, an indication can be sent to the user. For example, an indication alerting the user that the cover 2504 is installed incorrectly in the earpiece 2500.

Removable Earpiece Cushions

Figure 26A:
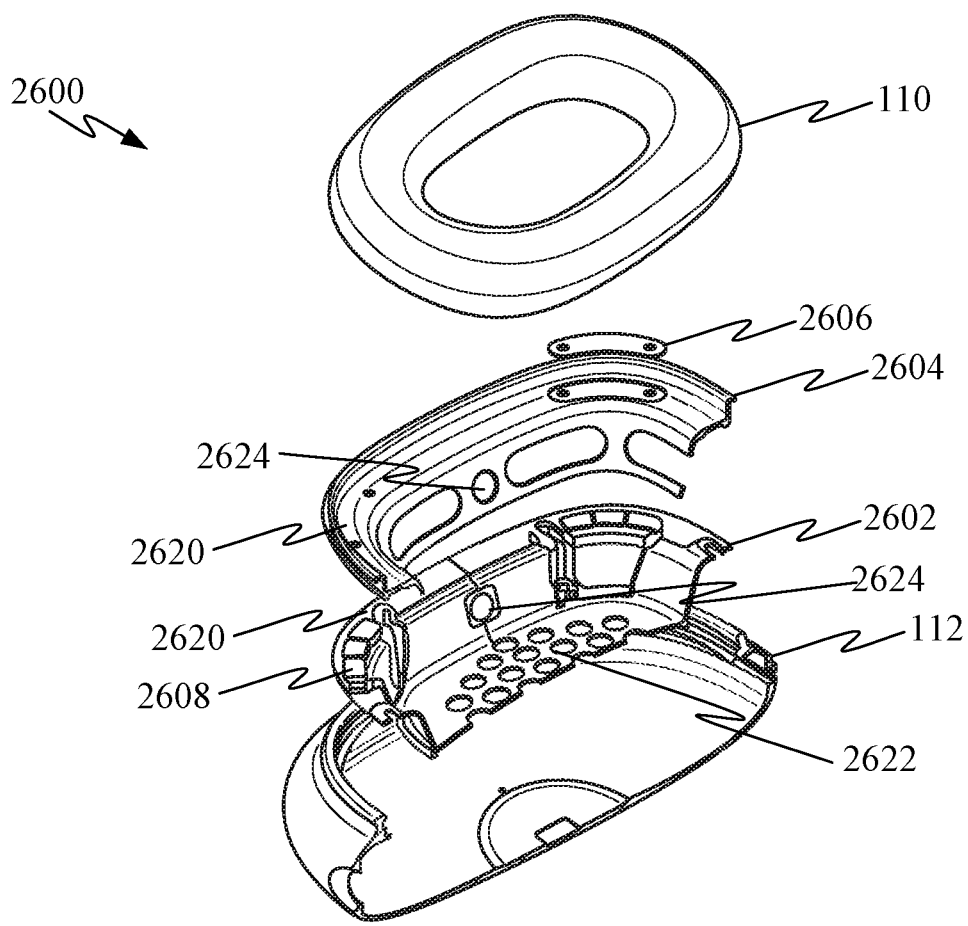
FIG. 26A shows a cross-section of coupling components of an earpiece, according to some embodiments.

A user may want to change one or more components of the headphones 100 to customize and/or enhance the comfort of the headphones. For example, a user may desire to change the earpiece cushion assembly 110 to a newer and/or different earpiece cushion. The earpiece cushion assembly 110 can include components that allow for removal and attachment of the earpiece cushion assembly 110 from the earpiece 104. FIG. 26A shows an example of an attachment assembly 2600 for use with earpieces 104. The attachment assembly 2600 can include a cover 2602 and a frame 2604. The cover 2602 can be representative of cover 2504 discussed with respect to FIGS. 25A, 25B and attached to the earpiece housing 112 of the earpiece 104. The frame 2604 can be attached to earpiece cushion assembly 110.

One or more securing mechanisms can be used to removably couple (e.g., magnetically couple) the cover 2602 and the frame 2604. The securing mechanisms can removably couple the frame 2604 to the cover 2602 when the frame 2604 is positioned in the cover 2602. For example, when the frame 2604 has been positioned in the cover 2602, the securing mechanisms can prevent the frame 2604 from being removed until a certain force threshold has been reached. In various embodiments, the securing mechanisms can be or include multiple components that engage with one another to attach the cover 2602 and the frame 2604. For example, a magnetic element 2606, such as metallic plate, may be positioned on the frame 2604 and a magnet array 2608 may be positioned on the cover 2602. The securing mechanisms may be or include a latch, hook and loop connectors, and/or any suitable connector for removably coupling the cover 2602 and the frame 2604.

Figure 26B:
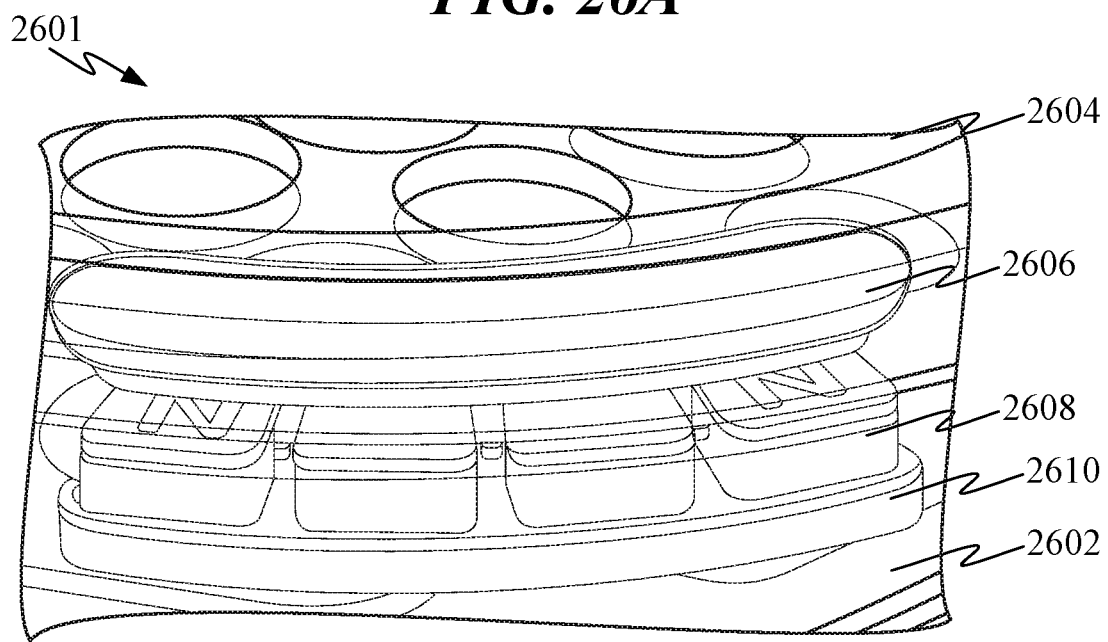
FIG. 26B shows a portion of the coupled components of the earpiece of FIG. 26A, according to some embodiments.

FIG. 26B shows an example securing mechanism 2601 for use with the attachment assembly 2600. The securing mechanism 2601 can include a magnetic element 2606 positioned on the frame 2604 and removably coupleable with a magnet array 2608 positioned on the cover 2602. A metal shunt 2610 can be positioned on the cover 2602 (e.g., between the magnet array 2608 and electronic components positioned within the earpiece housing 112). The metal shunt 2610 can prevent or reduce magnetic flux from the magnetic array 2608 from interfering with the electronic components contained in the earpiece 104. In some embodiments, the magnetic element 2606 may be positioned on the cover 2602 and the magnet array 2608 may be positioned on the frame 2604. The magnetic element 2606 can be or include a magnet and/or a metallic plate including one or more of steel, iron, nickel, cobalt, stainless steel, aluminum, gold, a metallic plate, a magnet, and/or any suitable component that is magnetically coupleable with the magnet array 2608.

The magnetic array 2608 can include one or more magnets that generate magnetic flux. The magnetic flux can act on the magnetic element 2606 to hold the frame 2604 in place when the insert has been positioned in the carrier. In various embodiments, the magnets in the magnetic array 2608 can be arranged in a pattern based on their orientation. For example, the magnetic array 2608 can include magnets arranged in a Halbach array (e.g., a rotating pattern of orientations for the magnets), an alternating array (e.g., the orientations of the magnets alternate), and/or a single pole orientation (e.g., the magnets are oriented in the same direction).

In some embodiments, the magnets of the magnetic array 2608 can be arranged in an alternating pole design (e.g., with poles of the magnets oriented in North, South, South, North (NSSN) or South, North, North, South (SNNS). In further embodiments, the magnetic element 2606 can be or include steel and the alternating pole magnetic array 2608 can direct magnetic flux into the steel element 2606. The steel element 2606 and the alternating pole magnetic array 2608 can have a magnetic coupling that can have advantages over other arrangements of the magnetic array 2608 and/or materials used in the magnetic element 2606. For example, the alternating pole magnetic array 2608 and the steel magnetic element 2606 can interact to have a greater retention force than other designs and/or materials. Additionally and/or alternatively the steel magnetic element 2606 positioned on the frame 2604 can prevent or reduce the magnetic flux from entering the front volume of the earpiece 204. For example, the steel magnetic element 2606 can reduce or prevent the magnetic flux from interfering with metal worn by a user (e.g., earrings).

In various embodiments, the cover 2602 and the frame 2604 can include an annular surface 2620 (i.e., an annular shelf) surrounding a central portion 2622. The magnetic element 2606 can be positioned on the annular surface 2620 of the frame 2604 and/or the magnetic array 2608, and/or metal shunt 2610 can be positioned on the annular surface 2620 of the cover 2602. The central portions 2622 of the frame 2604 and the cover 2602 can be aligned when the magnetic element 2606 is coupled with the magnetic array 2608.

In further embodiments, the cover 2602 and/or the frame 2604 can include an opening in a side wall (e.g., opening 2624). The openings 2624 can align when the frame 2604 is coupled with the cover 2602. In some embodiments, the opening 2624 can be representative of apertures 2508 and/or 2530 discussed with respect to FIGS. 25A, 25B.

In some embodiments, one or more layers of foam can be positioned between the cover 2602 and the frame 2604. A first layer of foam can be positioned, for example, on the annular surface 2620 of the frame 2604 (e.g., attached to the annular surface 2620 that engages with the annular surface 2620 of the cover 2602). For example, the foam can be positioned over areas where the magnetic elements 2606 are positioned on the annular surface 2620. A second layer of foam can be position over the first layer (e.g., between the first layer of foam and the cover 2602). The second layer can extend around the annular surface 2620 (e.g., around the periphery of the central portion 2622). The foam can provide a seal between the cover 2602 and the frame 2604. The seal can provide acoustic sealing for the earpiece 104 (e.g. provide acoustic sealing between the cover 2602 and the frame 2604). The foam can additionally or alternatively allow for consistent magnetic coupling of the cover 2602 and the frame 2604. In further embodiments, one or more layers can be a stiff foam that allows for optimized retention between the cover 2602 and the frame 2604, minimal deflection of the cover 2602 and/or the frame 2604 during engagement, and/or maximizing the tear strength.

Figure 26C:
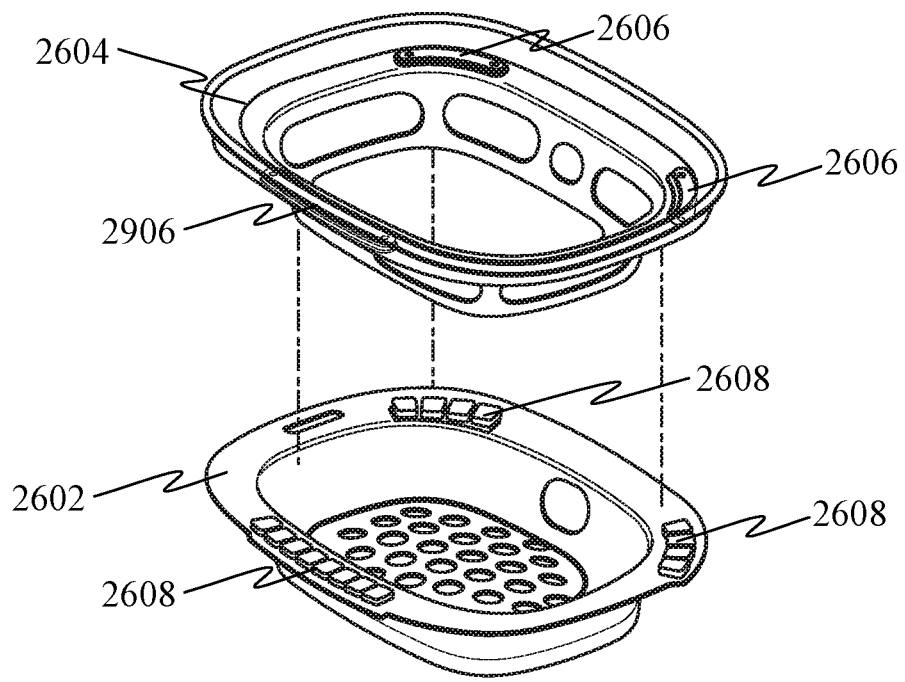
FIGS. 26C and 26D show alignment orientation of the coupling components of the earpiece of FIG. 26A, according to some embodiments.
Figure 26D:
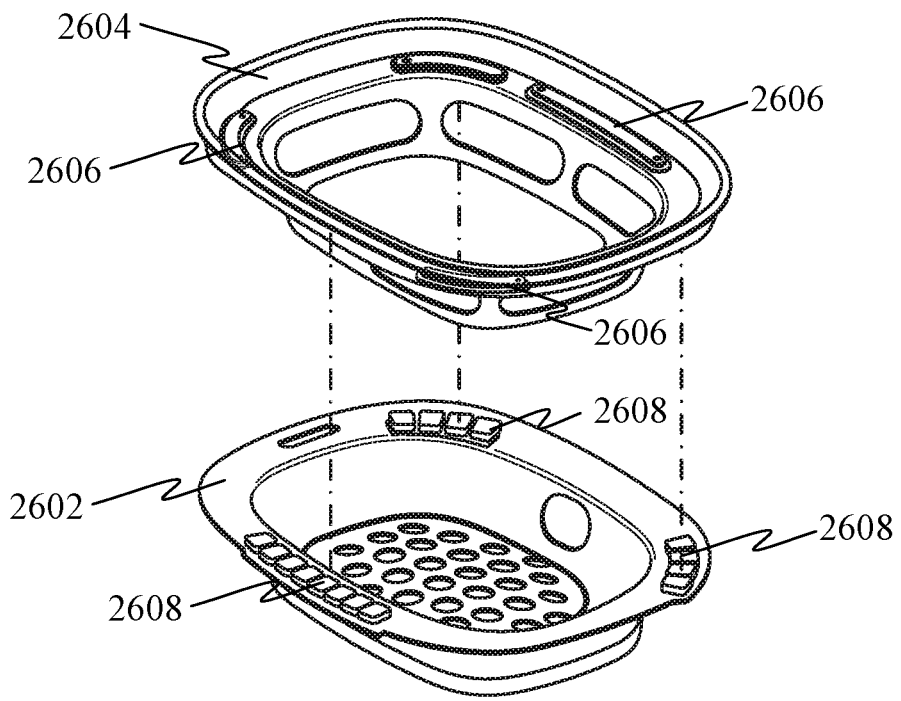

The magnetic arrays 2608 and magnetic elements 2606 can be arranged in corresponding patterns on the cover 2602 and the frame 2604, respectively. As shown in FIGS. 26C and 26D, the magnetic arrays 2608 and the magnetic elements 2606 can be arranged such that the magnetic elements 2606 on the cover 2602 can engage with the magnetic arrays on the frame 2604 in only one orientation. FIG. 26C shows the frame 2604 correctly oriented relative to the cover 2602 such that when the frame 2604 is positioned in the cover 2602, the magnetic arrays 2608 will engage with the magnetic elements 2606 and hold the frame 2604 in place. FIG. 26D shows the frame 2604 incorrectly oriented relative to the cover 2602 such that when the frame 2604 is positioned in the cover 2602, the magnetic arrays 2608 will not engage with the magnetic elements 2606 and the frame 2604 will not be held in place. The arrangement of the magnetic arrays 2608 and the magnetic elements 2606 in corresponding patterns allows for simple user feedback on the orientation of the frame 2604 and the cover 2602. For example, a user will know the frame 2604 is in the correct orientation because it will engage with the cover 2602. Similarly, a user will know the frame 2604 is in the incorrect orientation because it will not engage with the cover 2602.

Figure 27A:
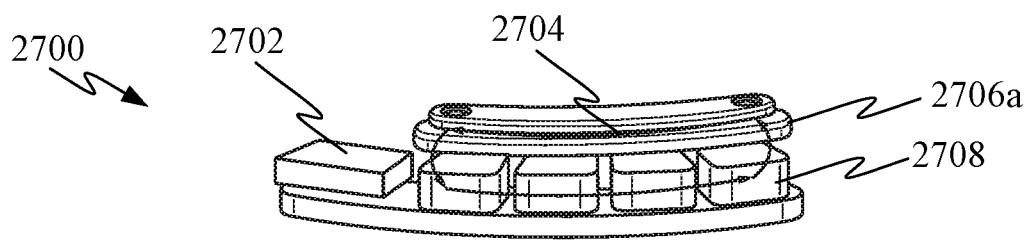
FIGS. 27A and 27B show an example cushion identification systems for use with the earpiece of FIG. 26A, according to some embodiments.
Figure 27B:
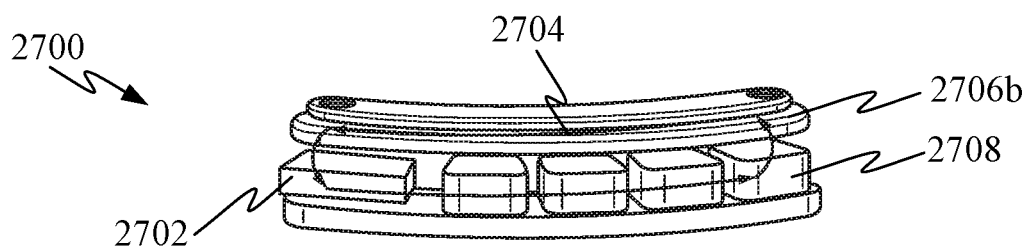
Figure 28A:
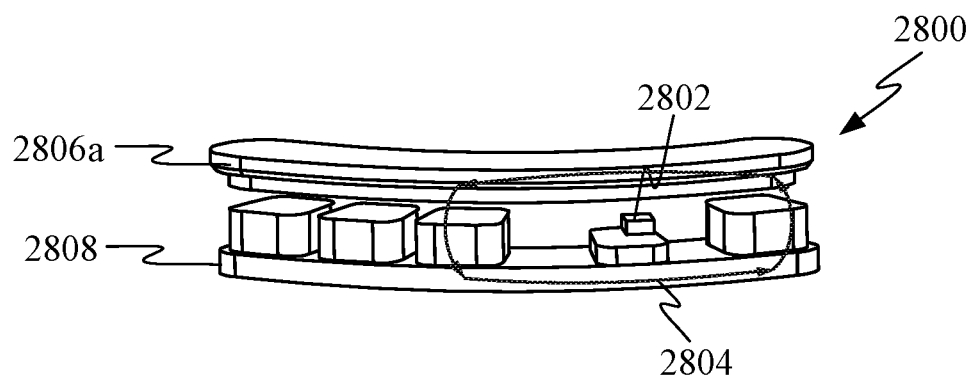
FIGS. 28A and 28B show another example cushion identification for use with the earpiece of FIG. 26A, according to some embodiments.
Figure 28B:
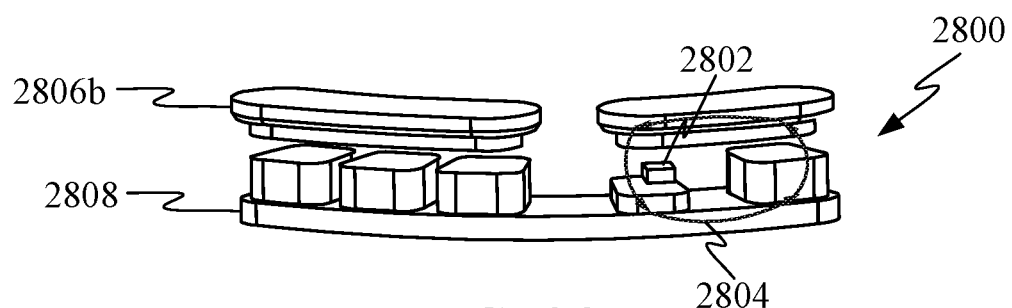

In various embodiments, the attachment assembly 2600 can include an identification system that can differentiate between earpiece cushion assemblies 110. FIGS. 27A and 27B illustrate an example identification system 2700 and FIGS. 28A and 28B illustrate an additional example identification system 2800 that can differentiate between two types of earpiece cushion assemblies 110. The identification systems 2700, 2800 can include one or more sensors 2702, 2802 that can detect the magnetic flux from the magnetic array 2708, 2808. The sensor 2702, 2802 can be or include a Hall effect sensor and/or a suitable sensor for detecting magnetic flux. In various embodiments, a sensor 2702, 2802 can positioned on one, some, or all of the securing mechanism 2601.

As shown in FIGS. 27A and 27B, the identification system 2700 can include two different sized metal plates 2706a and 2706b. The first metal plate 2706a can be sized and shaped to direct magnetic flux 2704 away from the sensor 2702. For example, the first magnetic element 2606a may not extend beyond the magnet array 2708 and will direct the magnetic flux 2704 from one side of the magnetic array to the other in a circular pattern with the sensor 2702 positioned outside the circle. The second metal plate 2706b can be sized and shaped to direct the magnetic flux 2704 through the sensor 2702. As shown in FIGS. 28A and 28B, the identification system 2800 can include a single piece metal plate 2806a and a multi-piece metal plate 2806b. The single piece metal plate 2806a can be sized and shaped to direct magnetic flux 2804 around the sensor 2802 and the multi-piece metal plate 2806b can have a piece sized and shaped to direct magnetic flux 2804 through the sensor 2802.

The identification systems 2700, 2800 can differentiate between two different earpiece cushion assemblies 110 based on whether the sensors 2702, 2802 detect the magnetic flux 2704, 2804. The detection or non-detection of the magnetic flux 2704, 2804 can correspond to an earpiece cushion assembly 110 having distinct properties. For example, an earpiece that causes the identification system 2700, 2800 to detect the magnetic flux 2704, 2804 may correspond to an earpiece cushion assembly 110 that is different and/or has distinct properties from the earpiece cushion assembly 110 that does not cause the identification system 2700, 2800 to detect the magnetic flux 2704. In various embodiments, the earpiece cushion assemblies 110 may be distinct due to the materials used in the earpiece cushion assembly 110, the size and/or shape of the earpiece cushion assembly 110 or their intended purpose (e.g., sport earpiece cushion assembly 110 or comfort earpiece cushion assembly 110).

In some embodiments, identifying the earpiece cushion assembly 110 that has been attached to the earpiece 104 can be used to adjust audio settings of the headphones 100. For example, identifying an earpiece cushion assembly 110 with a known internal volume can allow for audio settings to be automatically adjusted to optimize audio playback for the identified earpiece cushion assembly 110. The earpiece cushion assembly 110 can be identified using, for example, identification systems 2700, 2800.

Earpad Cushion—Passive Attenuation

Figure 29A:
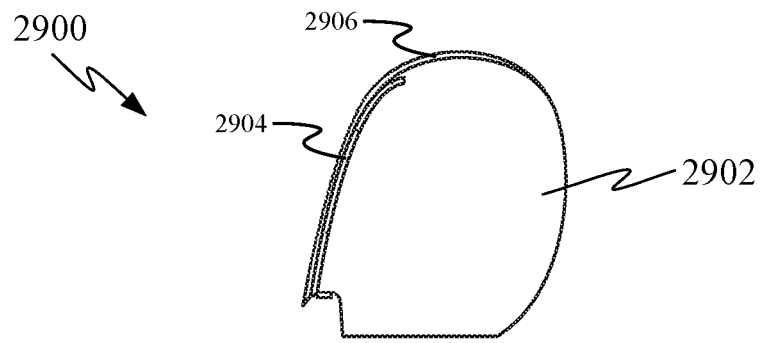
FIGS. 29A through 29C show cross-sections of various cushions for use with headphones, according to some embodiments.
Figure 29B:
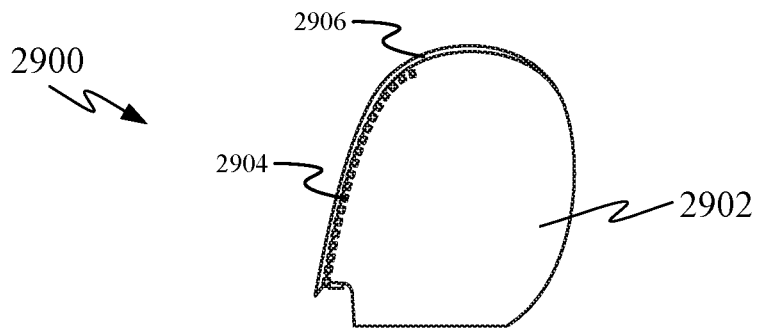
Figure 29C:
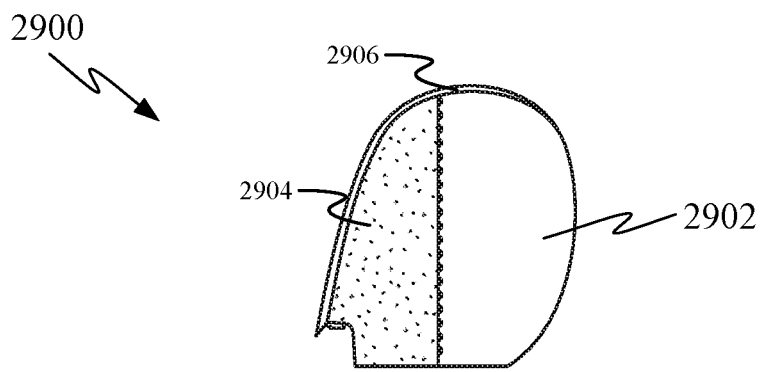

FIGS. 29A, 29B, and 29C show cross-sections of different embodiments of a cushion assembly 2900 for use with earpieces 104. The cushion assemblies 2900 can include a cushion padding 2902 that enhances a user's comfort while the headphones 100 are donned. The cushion padding 2902 can be used to enhance comfort but may allow some level of external audio to penetrate the earpiece 104, which can adversely affect an active noise cancelling (ANC) system of the headphones. Additional layers of stiffer and/or thicker material can be added to the cushion assembly to decrease external noise, however, this can lead to stiffer cushions that decrease comfort and can cause a gap between the earpiece and a user's head when the headphones are donned, allowing sound to reach a user.

In various embodiments, a layer of noise dampening (e.g., noise cancelling material) 2904 can be added to the cushion assembly 2900. The noise dampening material 2904 can be added to an interior side of the cushion assembly 2900 to reduce or prevent sound from penetrating the earpiece. For example, the noise dampening material 2904 can be disposed on an interior side of the cushion assembly between an outer wrap 2906 and the cushion padding 2902. The noise dampening material 2904 can be infused into the cushion padding 2902 and/or may be a layer of material that is positioned on the cushion padding. The noise dampening material 2904 can be or include silicon and/or a silicon mixture that decreases sound penetration while having a minimal effect on the stiffness of the cushion assembly 2900. In some embodiments, as shown in FIG. 29B, the noise dampening material 2904 can be dispersed on only a portion of the inner face of the cushion padding 2902. Spacing the noise dampening material 2904 can further decrease any stiffening effect the noise dampening material 2904 may have on the cushion padding 2902.

In some embodiments, the noise dampening material 2904 can be or include variable thickness silicone (e.g., a variable thickness silicone wall). The variable thickness noise dampening material 2904 can allow for tuning of the cushion assembly 2900. For example, the thickness can be increased in areas of the cushion assembly 2900 for additional noise dampening and decreased in areas for reduced cushion stiffness. The noise dampening material 2904 can additionally or alternatively be strategically thickened to tune for noise cancelling in the earpieces 104. For example, a first portion of the noise dampening material 2904 can be thicker than a second portion of the noise dampening material 2904 (e.g., a top portion can be thicker than a bottom portion, a front portion can be thicker than a back portion, a side portion can be thicker than an opposing side portion).

As shown in FIG. 29C, the noise dampening material 2904 can be a low durometer silicone gel that penetrates into a portion of the cushion padding 2902 adding mass to the cushion assembly without adding stiffness. For example, the noise dampening material 2904 can penetrate into the cushion padding 2902 a distance from the inner surface of the cushion assembly 2900. The noise dampening material 2904 can penetrate into the cushion padding 2902 by being deposited onto the outer surface of the cushion padding 2902, being injected into the cushion padding and/or being integrated into the foam matrix.

Charging Case

Figure 30:
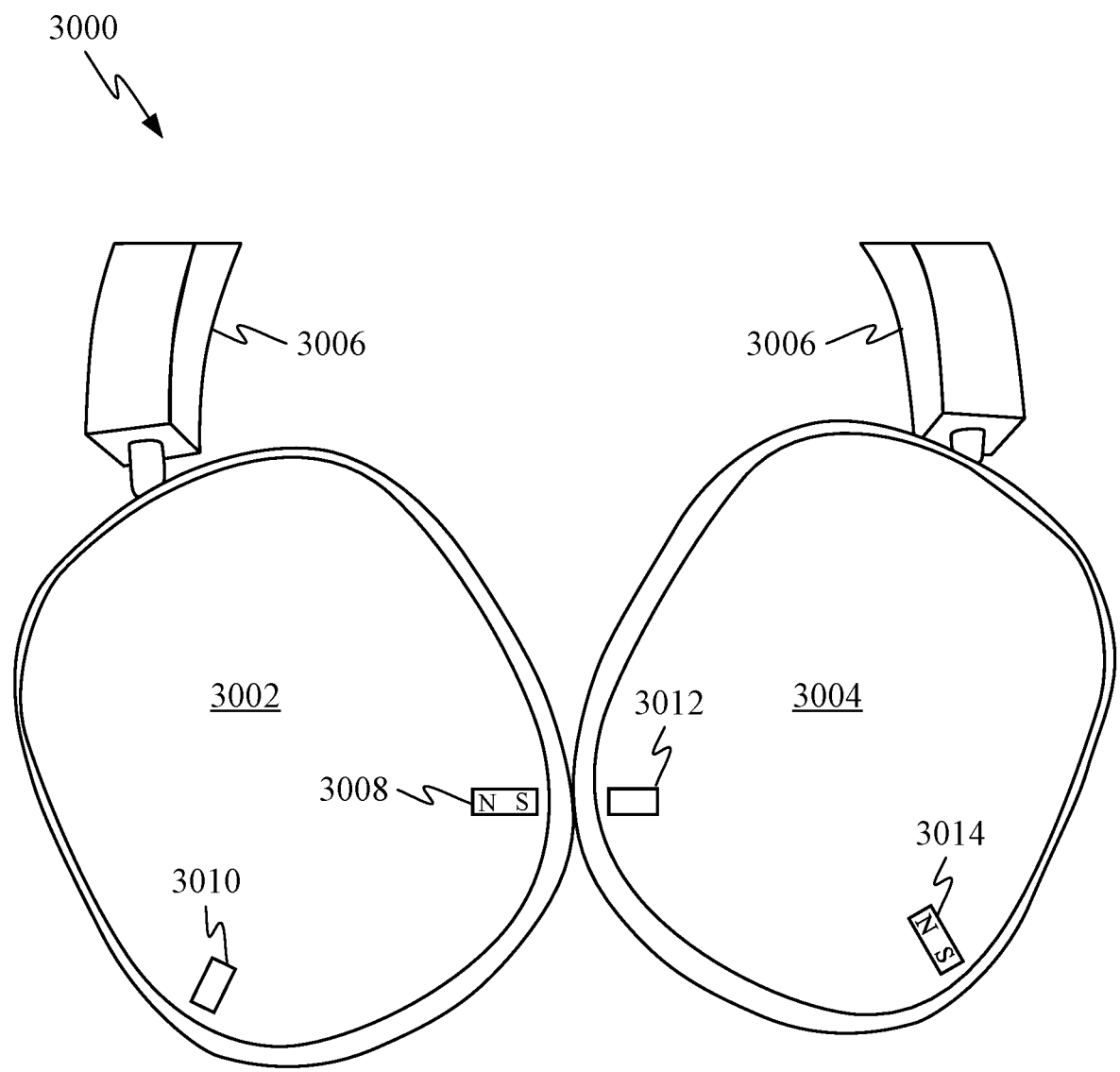
FIG. 30 shows exemplary headphones, which include earpieces joined together by a headband, in a flattened position in accordance with some embodiments.

FIG. 30 shows headphones 3000, which include earpieces 3002 and 3004 joined together by headband 3006. The headphones 3000 can be the same or similar to headphones 100, however, the headphones 3000 may include additional and/or alternative components. A central portion of headband 3006 has been omitted to focus on components within earpieces 3002 and 3004. In particular, earpieces 3002 and 3004 can include a mix of Hall effect sensors and permanent magnets. As depicted, earpiece 3002 includes permanent magnet 3008 and Hall effect sensor 3010. Permanent magnet 3008 generates a magnetic field extending away from earpiece 3002 with a South polarity. Earpiece 3004 includes Hall effect sensor 3012 and permanent magnet 3014. In the depicted configuration, permanent magnet 3008 is positioned to output a magnetic field sufficiently strong to saturate Hall effect sensor 3012. Sensor readings from Hall effect sensor 3012 can be sufficient to cue headphones 3000 that headphones 3000 are not being actively used and could enter into an energy savings mode. In some embodiments, this configuration could also cue headphones 3000 that headphones 3000 were being positioned within a case and should enter a lower power mode of operation to conserve battery power. Flipping earpieces 3002 and 3004 180 degrees each would result in a magnetic field emitted by permanent magnet 3014 saturating Hall effect Sensor 3010, which would also allow the device to enter a low power mode. In some embodiments, it could be desirable to use an accelerometer sensor within one or both of earpieces 3002 to confirm that earpieces 3002 and 3004 are facing toward the ground before entering a lower power state as a user could desire to set earpieces 3002 and 3004 facing upward to operate headphones in an off the head configuration and in such a case audio playback should be continued.

Figure 31:
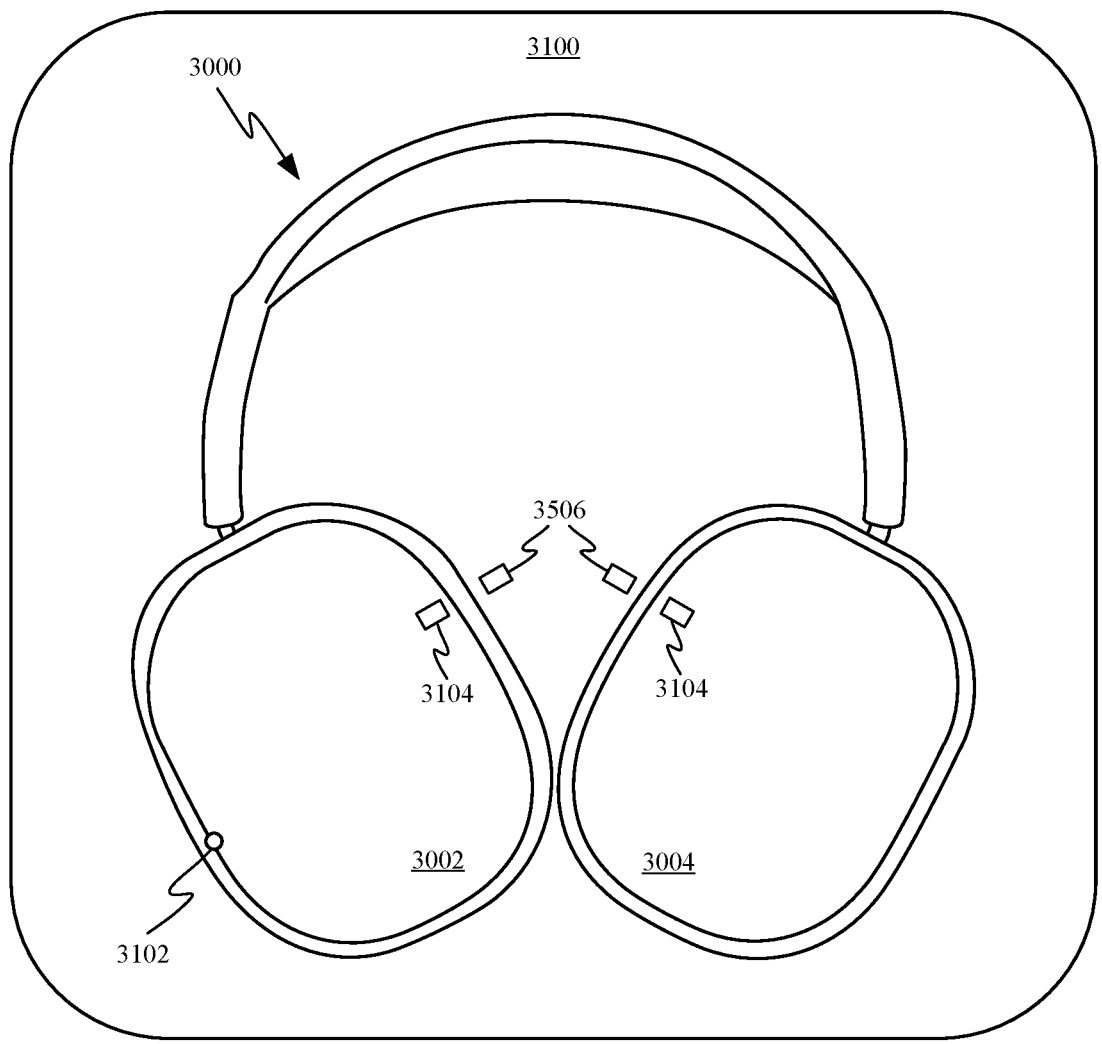
FIG. 31 shows a carrying case with headphones positioned therein.

FIG. 31 shows carrying case 3100 for use with headphones, for example headphones 3000, positioned therein. Headphones 3000 are depicted including ambient light sensor 3102. In some embodiments, input from ambient light sensor 3102 can be used to determine when case 3100 is closed with headphones disposed within case 3100. Similarly, when sensor readings from ambient light sensor 3102 indicate an amount of light consistent with carrying case 3100 opening, a processor within headphones 3000 can determine that carrying case 3100 has been opened. In some embodiments, when other sensors aboard headphones 3000 indicate headphones 3000 are positioned within a recess defined by carrying case 3100, the sensor data from ambient light sensor 3102 can be sufficient to determine when carrying case 3100 is open or closed.

In various embodiments, Hall effect sensors 3104 can be positioned within earpieces 3002 and 3004 and configured to detect magnetic fields emitted by permanent magnets 3106 disposed within carrying case 3100. This second set of sensor data could substantially reduce the incidence of sensor data from ambient light sensor 3102 mistakenly being correlated with case opening and closing events. The use of sensor readings from other types of sensors such as strain gauges, time of flight sensors and other headphone configuration sensors can also be used to make operating state determinations. Furthermore, depending on a determined operating state of headphones 3000 these sensors could be activated with varying frequency. For example, when carrying case 3100 is determined to be closed around headphones 3000 sensor readings can only be made at an infrequent rate, whereas in active use the sensors could operate more frequently.

The foregoing description, for purposes of explanation, described embodiments related to headphones to provide a thorough understanding of the described components. However, it will be apparent to one skilled in the art that the described components are not limited to use with headphones. For example, components described herein can be used with head mounted devices (HMD), augmented reality, virtual reality devices, and/or any suitable audio device. It will be apparent to one of ordinary skill in the art that many modifications and variations of components and/or embodiments are possible in view of the above teachings.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

All patents, publications and abstracts cited above are incorporated herein by reference in their entirety. The foregoing description of the embodiments, including illustrative aspects of embodiments, has been presented only for the purpose of illustration and description and is not intended to be exhaustive or limiting to the precise forms disclosed. Numerous modifications, adaptations, and uses thereof will be apparent to those skilled in the art.

Aspect 1 is a listening device, comprising: a first earpiece; a headband having a first end coupled to the first earpiece, the first earpiece comprising: an earpiece housing defining an interior volume; a speaker disposed within the interior volume; and a pivot mechanism coupled to the earpiece housing and operable to enable the earpiece housing to rotate separate from the headband along a first axis, the pivot mechanism comprising: an aperture sized and shaped to receive one of the first or second ends of the headband; first and second pivot rods; a first cylinder having a first channel and coupled to the first pivot rod; a first piston that fits within the first channel and is coupled to the second pivot rod; and a first compression spring at least partially surrounding the first piston and the first cylinder and positioned to compress relative to the aperture while opposing rotation of the pivot mechanism about the first axis.

Aspect 2 is the listening device set forth in aspect(s) 1 (or of any other preceding or subsequent aspects individually or in combination), wherein the pivot mechanism further comprises a second cylinder having a second channel and coupled to the first pivot rod, a second piston that fits within the second channel of the second cylinder and is coupled to the second pivot rod, and a second compression spring at least partially surrounding the second piston and the second cylinder and positioned to compress relative to the aperture while opposing rotation of the pivot mechanism about the first axis.

Aspect 3 is the listening device set forth in aspect(s) 1 (or of any other preceding or subsequent aspects individually or in combination), wherein the pivot mechanism further comprises a collar defining the aperture to receive one of the first or second ends of the headband, the collar having a protrusion for aligning the respective first or second ends of the headband with the pivot mechanism and configured to allow rotation of the pivot mechanism about a second axis.

Aspect 4 is the listening device set forth in aspect(s) 3 (or of any other preceding or subsequent aspects individually or in combination), wherein the first axis is a roll axis and the second axis is a yaw axis.

Aspect 5 is the listening device set forth in aspect(s) 1 (or of any other preceding or subsequent aspects individually or in combination), wherein the pivot mechanism further comprises a sensor configured to detect rotation of the pivot mechanism about the first axis.

Aspect 6 is the listening device set forth in aspect(s) 1 (or of any other preceding or subsequent aspects individually or in combination), wherein the pivot mechanism is positioned off-center of the first earpiece.

Aspect 7 is an earpiece, comprising: an earpiece housing defining an interior volume; a speaker disposed within the interior volume; and a pivot mechanism disposed at a first end of the earpiece housing and operable to enable the earpiece housing to rotate along a first axis and comprising: an aperture sized and shaped to receive a first end of a headband; first and second pivot rods; a first cylinder having a first channel and a second cylinder having a second channel, the first and second cylinders coupled to the first pivot rod; a first piston positionable within the first channel and a second piston positionable within the second channel, the first and second pistons coupled to the second pivot rod; and a first compression spring at least partially surrounding the first piston and the first cylinder and a second compression spring at least partially surrounding the second piston and the second cylinder and positioned to compress relative to the aperture while opposing rotation of the pivot mechanism about the first axis.

Aspect 8 is the earpiece as recited in aspect(s) 7 (or of any other preceding or subsequent aspects individually or in combination), wherein the pivot mechanism further comprises a magnet and a sensor, the sensor configured to detect a change in a magnetic field of the magnet to detect rotation of the pivot mechanism about the first axis.

Aspect 9 is the earpiece as recited in aspect(s) 7 (or of any other preceding or subsequent aspects individually or in combination), wherein the first axis is a roll axis and the pivot mechanism is further operable to enable the earpiece housing to rotate along a yaw axis.

Aspect 10 is the earpiece as recited in aspect(s) 7 (or of any other preceding or subsequent aspects individually or in combination), wherein the pivot mechanism further comprises a collar defining the aperture, the collar comprising a protrusion configured to engage an alignment notch of the headband.

Aspect 11 is the earpiece as recited in aspect(s) 10 (or of any other preceding or subsequent aspects individually or in combination), wherein the collar further defines a notch configured to receive a locking component that prevents the headband from being removed from the pivot mechanism.

Aspect 12 is the earpiece as recited in aspect(s) 7 (or of any other preceding or subsequent aspects individually or in combination), wherein the pivot mechanism further comprises a gasket configured to prevent ingress of moisture between the headband and the aperture and flex in response to rotation of the pivot mechanism.

Aspect 13 is headphones, comprising: a first earpiece comprising a first earpiece housing defining a first interior volume and a first pivot mechanism coupled to the first earpiece housing and operable to enable the first earpiece to rotate about a first axis, the first pivot mechanism comprising: a first aperture sized and shaped to receive a first end of a headband; first and second pivot rods; a first cylinder having a first channel and coupled to the first pivot rod; a first piston that fits within the first channel and is coupled to the second pivot rod; and a first compression spring at least partially surrounding the first piston and the first cylinder and positioned to compress relative to the first aperture while opposing rotation of the first pivot mechanism about the first axis; and a second earpiece comprising a second earpiece housing defining a second interior volume and a second pivot mechanism coupled to the second earpiece housing and operable to enable the second earpiece to rotate about a second axis, the second pivot mechanism comprising: a second aperture sized and shaped to receive a second end of a headband; third and fourth pivot rods; a second cylinder having a second channel and coupled to the third pivot rod; a second piston that fits within the second channel and is coupled to the fourth pivot rod; and a second compression spring at least partially surrounding the second piston and the second cylinder and positioned to compress relative to the second aperture while opposing rotation of the second pivot mechanism about the second axis.

Aspect 14 is the headphones as recited in aspect(s) 13 (or of any other preceding or subsequent aspects individually or in combination), wherein the first pivot mechanism further comprises a third cylinder having a third channel and coupled to the first pivot rod, a third piston that fits within the third channel and is coupled to the second pivot rod, and a third compression spring at least partially surrounding the third piston and the third cylinder and positioned to compress relative to the first aperture while opposing rotation of the first pivot mechanism about the first axis; and the second pivot mechanism further comprises a fourth cylinder having a fourth channel and coupled to the third pivot rod, a fourth piston that fits within the fourth channel and is coupled to the fourth pivot rod, and a fourth compression spring at least partially surrounding the fourth piston and the fourth cylinder and positioned to compress relative to the second aperture while opposing rotation of the second pivot mechanism about the second axis.

Aspect 15 is the headphones as recited in aspect(s) 13 (or of any other preceding or subsequent aspects individually or in combination), wherein first and second axes are roll axes, the first pivot mechanism is further operable to enable the first earpiece housing to rotate about a first yaw axis, and the second pivot mechanism is further operable to enable the second earpiece to rotate about a second yaw axis.

Aspect 16 is the headphones as recited in aspect(s) 13 (or of any other preceding or subsequent aspects individually or in combination), wherein the first earpiece comprises a first sensor configured to detect rotation of the first earpiece about the first axis.

Aspect 17 is the headphones as recited in aspect(s) 16 (or of any other preceding or subsequent aspects individually or in combination), wherein the second earpiece comprises a second sensor configured to detect rotation of the second earpiece about the second axis.

Aspect 18 is the headphones as recited in aspect(s) 13 (or of any other preceding or subsequent aspects individually or in combination), wherein the first and second pivot mechanisms are positioned off-center of the respective first and second earpieces.

Aspect 19 is the headphones as recited in aspect(s) 13 (or of any other preceding or subsequent aspects individually or in combination), wherein the first pivot mechanism comprises a collar defining the first aperture, the collar comprising protrusions engageable with the first end of the headband.

Aspect 20 is the headphones as recited in aspect(s) 13 (or of any other preceding or subsequent aspects individually or in combination), wherein the first pivot mechanism comprises a gasket configured to prevent ingress of moisture between the first end of the headband and the first aperture, the gasket configured to flex in response to rotation of the first pivot mechanism.

Aspect 21 is headphones, comprising: a headband; and an earpiece coupled with one end of the headband, the earpiece comprising: an earpiece housing defining an aperture; a button assembly positionable in the aperture and comprising: a button housing having an upper portion and a lower portion and defining a channel having a central axis; a crown axially aligned with the central axis and configured to move into engagement with the button housing; a damper positioned between the upper portion of the button housing and the crown and configured to dampen vibrations caused when the crown engages the button housing; a hub coupled with the crown and positioned in the channel and translatable along and rotatable about the central axis, the hub comprising one or more markings and configured to engage a compressible dome when the hub is translated toward an interior of the earpiece housing; and seals positioned between the hub and the button housing, one of the seals having a variable diameter and contacts the hub and the button housing with only a portion of the seal.

Aspect 22 is the headphones as recited in aspect(s) 21 (or of any other preceding or subsequent aspects individually or in combination), wherein the button assembly further comprises a sensor positioned within a portion of the button housing and configured to detect rotation of the hub about the central axis.

Aspect 23 is the headphones as recited in aspect(s) 22 (or of any other preceding or subsequent aspects individually or in combination), wherein the hub comprises a plurality of grooves formed along a length, the grooves detectable by the sensor to detect rotation of the hub.

Aspect 24 is the headphones as recited in aspect(s) 21 (or of any other preceding or subsequent aspects individually or in combination), wherein at least one of the seals comprises self-lubricating material.

Aspect 25 is the headphones as recited in aspect(s) 21 (or of any other preceding or subsequent aspects individually or in combination), wherein the compressible dome is engageable with an open electrical circuit to create a closed electrical circuit.

Aspect 26 is the headphones as recited in aspect(s) 25 (or of any other preceding or subsequent aspects individually or in combination), wherein the compressible dome comprises electrically conductive material engageable with the open electrical circuit to create the closed electrical circuit.

Aspect 27 is the headphones as recited in aspect(s) 21 (or of any other preceding or subsequent aspects individually or in combination), wherein the damper is a first damper and a second damper is positioned between the hub and the lower portion of the housing.

Aspect 28 is an earpiece, comprising: an earpiece housing defining an aperture; a button assembly positionable in the aperture and comprising: a button housing having an upper portion and a lower portion and defining a channel having a central axis; a crown axially aligned with the central axis and configured to move into engagement with the upper portion of the button housing; a first damper positioned between the button housing and the crown and configured to dampen vibrations caused when the crown engages the button housing; a hub coupled with the crown and positioned in the channel and translatable along and rotatable about the central axis, the hub comprising one or more markings and configured to move between engaging the lower portion of the button housing and engaging a compressible dome when the hub is translated toward an interior of the earpiece housing; and a second damper positioned between the hub and the lower portion of the button housing and configured to dampen vibration when the hub engages the lower portion of the button housing.

Aspect 29 is the earpiece set forth in aspect(s) 28 (or of any other preceding or subsequent aspects individually or in combination), wherein the hub comprises a plurality of grooves formed along a length, wherein the grooves are detectable by a sensor positioned within a portion of the button housing.

Aspect 30 is the earpiece set forth in aspect(s) 28 (or of any other preceding or subsequent aspects individually or in combination), wherein the button assembly further comprises seals positioned between the hub and the button housing, at least one of the seals comprising self-lubricating material.

Aspect 31 is the earpiece set forth in aspect(s) 30 (or of any other preceding or subsequent aspects individually or in combination), wherein a first seal of the seals has a variable diameter and contacts the hub and the button housing with only a portion of the first seal.

Aspect 32 is the earpiece set forth in aspect(s) 28 (or of any other preceding or subsequent aspects individually or in combination), wherein the button assembly further comprises a decoupler coupled to the hub and translatable along the central axis to engage the compressible dome, the decoupler configured to allow rotation of the hub relative to the decoupler.

Aspect 33 is the earpiece set forth in aspect(s) 32 (or of any other preceding or subsequent aspects individually or in combination), wherein the decoupler comprises an adjustable resistance component configured to adjust resistance between the decoupler and the button housing, the adjustable resistance component comprising at least one of a shim, a spring, or an elastic wedge.

Aspect 34 is the earpiece set forth in aspect(s) 28 (or of any other preceding or subsequent aspects individually or in combination), wherein the compressible dome is configured to engage with a flexible sheet comprising a conductive material, the flexible sheet configured to engage an open electrical circuit to create a closed electrical circuit.

Aspect 35 is a listening device, comprising: an earpiece having an earpiece housing defining an aperture; a button assembly positionable in the aperture and comprising: a button housing having an upper and a lower portion and defining a channel having a central axis; a crown axially aligned with the central axis and configured to move into engagement with the upper portion of the button housing; a hub coupled with the crown and positioned in the channel and translatable along and rotatable about the central axis, the hub comprising one or more markings and configured to engage a compressible dome when the hub is translated toward an interior of the earpiece housing; and seals positioned between the hub and the button housing, a first seal positioned adjacent to the upper portion of the button housing and configured to form a watertight seal and a second seal positioned between the hub and the compressible dome and having a variable diameter to contact the hub and the button housing with only a portion of the seal.

Aspect 36 is the earpiece set forth in aspect(s) 35 (or of any other preceding or subsequent aspects individually or in combination), wherein the button assembly further comprises a first damper positioned between the upper portion of the button housing and the crown and configured to dampen vibrations caused when the crown engages the button housing.

Aspect 37 is the earpiece set forth in aspect(s) 36 (or of any other preceding or subsequent aspects individually or in combination), wherein the button assembly further comprises a second damper positioned between the hub and the lower portion of the button housing and is configured to engage with the lower portion of the button housing when the button assembly is in an un-pressed state.

Aspect 38 is the earpiece set forth in aspect(s) 35 (or of any other preceding or subsequent aspects individually or in combination), wherein at least one of the seals comprises self-lubricating material.

Aspect 39 is the earpiece set forth in aspect(s) 35 (or of any other preceding or subsequent aspects individually or in combination), wherein the button assembly further comprises a sensor positioned within a portion of the button housing and configured to detect rotation of the hub about the central axis.

Aspect 40 is the earpiece set forth in aspect(s) 39 (or of any other preceding or subsequent aspects individually or in combination), wherein the hub comprises a plurality of grooves formed along a length, the grooves detectable by the sensor.

Aspect 41 is headphones, comprising: a headband assembly; and a first earpiece coupled to a first end of the headband assembly and a second earpiece coupled to a second end of the headband assembly, each of the first and second earpieces comprising an earpiece housing, an acoustic driver disposed within the earpiece housing and an earpiece cushion assembly coupled to the earpiece housing to cooperatively define a cavity sized to accommodate an ear of a user, the earpiece cushion assembly comprising: an annular earpiece cushion; and a support structure disposed between the annular earpiece cushion and the earpiece housing, the support structure comprising cantilevered support members distributed along a periphery of the cavity and protruding into the cavity.

Aspect 42 is the headphones as recited in aspect(s) 41 (or of any other preceding or subsequent aspects individually or in combination), wherein each of the cantilevered support members has a curved geometry that follows a curvature of a portion of the annular earpiece cushion.

Aspect 43 is the headphones as recited in aspect(s) 41 further comprising a cushion frame wherein the support structure is integrally formed with the cushion frame and the cushion frame is coupled directly to the earpiece housing.

Aspect 44 is the headphones as recited in aspect(s) 43 (or of any other preceding or subsequent aspects individually or in combination), wherein the support structure and the cushion frame cooperatively define an annular channel, the annular earpiece cushion being disposed within the annular channel.

Aspect 45 is the headphones as recited in aspect(s) 41 (or of any other preceding or subsequent aspects individually or in combination), wherein the earpiece cushion assembly further comprises a protective cover that wraps around both the annular earpiece cushion and at least a portion of the support structure.

Aspect 46 is the headphones as recited in aspect(s) 45 (or of any other preceding or subsequent aspects individually or in combination), wherein the protective cover comprises material selected from a group consisting of leather and textile material.

Aspect 47 is the headphones as recited in aspect(s) 41 (or of any other preceding or subsequent aspects individually or in combination), wherein the earpiece cushion assembly further comprises a protective cover and wherein one or more of the cantilevered support members are embedded within the protective cover.

Aspect 48 is the headphones as recited in aspect(s) 41 (or of any other preceding or subsequent aspects individually or in combination), further comprising webbing coupling adjacent cantilevered support members together.

Aspect 49 is the headphones as recited in aspect(s) 48 (or of any other preceding or subsequent aspects individually or in combination), wherein a stiffness of the webbing is lower than a stiffness of the cantilevered support members.

Aspect 50 is an earpiece suitable for use with over-ear headphones, the earpiece comprising: an earpiece housing; an earpiece cushion assembly coupled to the earpiece housing to cooperatively define a cavity sized to accommodate an ear of a user, the earpiece cushion assembly comprising an annular earpiece cushion and a support structure disposed between the annular earpiece cushion and the earpiece housing, the support structure comprising cantilevered support members distributed around the cavity and protruding into the cavity; and an acoustic driver.

Aspect 51 is the earpiece as recited in aspect(s) 50 (or of any other preceding or subsequent aspects individually or in combination), wherein the earpiece cushion assembly further comprises a protective cover and wherein one or more of the cantilevered support members are embedded within the protective cover.

Aspect 52 is the earpiece as recited in aspect(s) 50 (or of any other preceding or subsequent aspects individually or in combination), wherein a first one of the cantilevered support members has a different size or shape than a second one of the cantilevered support members.

Aspect 53 is the earpiece as recited in aspect(s) 50 (or of any other preceding or subsequent aspects individually or in combination), wherein the annular earpiece cushion is formed from open cell foam.

Aspect 54 is the earpiece as recited in aspect(s) 50 (or of any other preceding or subsequent aspects individually or in combination), wherein an interior-facing surface of the annular earpiece cushion and an adjacent interior surface of the earpiece housing operate to form an undercut.

Aspect 55 is the earpiece as recited in aspect(s) 50 (or of any other preceding or subsequent aspects individually or in combination), wherein each of the cantilevered support members have the same size and shape.

Aspect 56 is the earpiece as recited in aspect(s) 50 (or of any other preceding or subsequent aspects individually or in combination), wherein each of the cantilevered support members curve toward the annular earpiece cushion.

Aspect 57 is headphones, comprising: a first earpiece and a second earpiece, each of the earpieces comprising an earpiece housing, an acoustic driver disposed within the earpiece housing, and an earpiece cushion assembly coupled to the earpiece housing, wherein each earpiece cushion assembly comprises: an annular earpiece cushion; and a support structure disposed between the annular earpiece cushion and the earpiece housing, the support structure comprising cantilevered support members distributed around and supporting the annular earpiece cushion; and a headband assembly mechanically coupling the first and second earpieces.

Aspect 58 is the headphones as recited in aspect(s) 57 (or of any other preceding or subsequent aspects individually or in combination), wherein the annular earpiece cushion comprises a foam cushion disposed within a protective cover.

Aspect 59 is the headphones as recited in aspect(s) 57 (or of any other preceding or subsequent aspects individually or in combination), wherein the annular earpiece cushion further comprises a cushion frame and wherein the cantilevered support members are integrally formed with the cushion frame.

Aspect 60 is the headphones as recited in aspect(s) 57 (or of any other preceding or subsequent aspects individually or in combination), wherein the cantilevered support members are configured to independently reinforce select regions of the annular earpiece cushion.

Aspect 61 is an earpiece for a pair of headphones, the earpiece comprising: a conductive earpiece housing defining an interior volume having a central region and an outer region surrounding the central region, wherein the conductive earpiece housing includes a portion that defines a ground plane element for an antenna and has an elongated slot formed through the ground plane element; and a slot antenna disposed within the outer region of the interior volume and electrically coupled to the ground plane element, the slot antenna comprising a frame formed from a radio frequency transparent material and defining an enclosed interior cavity within the interior volume, wherein the frame includes a tongue having first and second opposing surfaces protruding away from the interior cavity and a distal end facing the elongated slot and extending between the first and second opposing surfaces, and wherein a distal end of the tongue allows radio frequency waves to enter the interior cavity through the elongated slot and a remainder of an exterior of the frame is plated with one or more layers of metal that prevents radio frequency waves from entering the interior cavity.

Aspect 62 is the earpiece set forth in aspect(s) 61 wherein: the earpiece housing further includes an acoustic opening proximate the elongated slot; and the frame includes a first and second apertures formed through the one or more layers of metal plating and a channel extending through the interior cavity defined by the frame and having walls formed from the radio frequency transparent material, wherein the second aperture is aligned with the acoustic opening in the earpiece housing and the channel acoustically couples the first aperture to the second aperture providing a pressure relief vent through the earpiece housing.

Aspect 63 is the earpiece set forth in aspect(s) 61 wherein the slot antenna defines an antenna pattern and the earpiece further comprises a passive component positioned within the antenna pattern and configured divide the slot antenna into two or more segments tuning the antenna to at least two different radio frequencies.

Aspect 64 is the earpiece set forth in aspect(s) 61 wherein the outer region of the interior volume has a bulbous cross-sectional shape that extends 360 degrees around the central region.

Aspect 65 is the earpiece set forth in aspect(s) 61 further comprising a sealant disposed within and filling the elongated slot and co-finished with the earpiece housing.

Aspect 66 is the earpiece set forth in aspect(s) 61 wherein the one or more layers of metal comprises a layer of copper, a layer of gold, and a layer of nickel disposed between the layer of copper and the layer of gold.

Aspect 67 is an earpiece for a pair of headphones, the earpiece comprising: a conductive earpiece housing defining an interior volume having a central region and an outer bulbous region surrounding the central region, wherein the conductive earpiece housing includes a portion that defines a ground plane element for an antenna and has an elongated rectangular slot formed through the ground plane element; wireless circuitry disposed within the interior volume; audio processing circuitry disposed within the interior volume and operatively coupled to the wireless circuitry; a microphone disposed within the interior volume and operatively coupled to the audio processing circuitry; a speaker disposed within the central region of the interior volume and operatively coupled to the audio processing circuitry; a slot antenna disposed within the bulbous region of the interior volume and operatively coupled to the wireless circuitry, the slot antenna comprising a frame formed from a rigid radio frequency transparent material and defining an interior cavity within the interior volume, wherein the frame includes a tongue having first and second opposing surfaces protruding away from the interior cavity and a distal end facing the elongated rectangular slot and extending between the first and second opposing surfaces, and wherein a distal end of the tongue allows radio frequency waves to enter the interior cavity through the elongated slot and a remainder of an exterior of the frame is plated with one or more layers of metal that prevents radio frequency waves from entering the interior cavity; and a grounding connection between the slot antenna and the ground plane element of the conductive earpiece housing.

Aspect 68 is the earpiece set forth in aspect(s) 67 (or of any other preceding or subsequent aspects individually or in combination), wherein: the earpiece housing further includes an acoustic opening proximate the elongated slot; and the earpiece further comprises an audio port component that includes an opening aligned with the acoustic opening and an acoustic channel that acoustically couples the acoustic opening with the interior volume.

Aspect 69 is the earpiece set forth in aspect(s) 68 (or of any other preceding or subsequent aspects individually or in combination), wherein the acoustic channel comprises a hollow fastener defining an opening in a support structure coupled with the speaker.

Aspect 70 is the earpiece set forth in aspect(s) 67 (or of any other preceding or subsequent aspects individually or in combination), further comprising: a first termination feature electrically coupled to the microphone; and a second termination feature electrically coupled to the audio processing circuitry.

Aspect 71 is the earpiece set forth in aspect(s) 67 (or of any other preceding or subsequent aspects individually or in combination), wherein the frame comprises a plurality of ribs projecting into the interior cavity and providing additional strength to the frame.

Aspect 72 is the earpiece set forth in aspect(s) 67 (or of any other preceding or subsequent aspects individually or in combination), wherein the earpiece further comprises a speaker cover comprising a plurality of audio openings, the speaker cover coupled with the earpiece housing and positioned over the central region of the earpiece housing.

Aspect 73 is the earpiece set forth in aspect(s) 67 (or of any other preceding or subsequent aspects individually or in combination), wherein the one or more layers of metal comprises a copper layer, a gold layer, and a nickel layer.

Aspect 74 is the earpiece set forth in aspect(s) 73 (or of any other preceding or subsequent aspects individually or in combination), wherein the copper layer is positioned on the exterior of the frame and is disposed between the copper layer and the gold layer.

Aspect 75 is an earpiece for a pair of headphones, the earpiece comprising: an earpiece housing defining an interior volume having a central region and an outer region surrounding the central region, wherein the earpiece housing includes an elongated slot and an acoustic opening proximate the elongated slot formed through the earpiece housing; a slot antenna disposed within the outer region of the interior volume and comprising a frame formed from a radio frequency transparent material and defining an enclosed interior cavity within the interior volume, wherein the frame includes a support structure extending into the interior cavity and a tongue, the tongue having first and second opposing surfaces protruding away from the interior cavity and a distal end facing the elongated slot and extending between the first and second opposing surfaces, and wherein a distal end of the tongue allows radio frequency waves to enter the interior cavity through the elongated slot and a remainder of an exterior of the frame is plated with one or more layers of metal that prevents radio frequency waves from entering the interior cavity; and an acoustic pathway at least partially defined by an acoustic vent having an opening aligned with the acoustic opening, the acoustic pathway acoustically coupling the acoustic opening with the interior volume.

Aspect 76 is the earpiece set forth in aspect(s) 75 (or of any other preceding or subsequent aspects individually or in combination), wherein the frame includes a first and second apertures formed through the one or more layers of metal plating and the acoustic pathway extends through the interior cavity defined by the frame and comprises walls formed from the radio frequency transparent material, and wherein the acoustic vent comprises the second aperture and the acoustic pathway acoustically couples the first aperture to the second aperture providing a pressure relief vent through the earpiece housing.

Aspect 77 is the earpiece set forth in aspect(s) 75 (or of any other preceding or subsequent aspects individually or in combination), wherein the acoustic pathway comprises a hallow fastener that acoustically couples interior volume of the earpiece with the acoustic opening.

Aspect 78 is the earpiece set forth in aspect(s) 75 (or of any other preceding or subsequent aspects individually or in combination), wherein the slot antenna defines an antenna pattern and the earpiece comprises an antenna tuning component positioned within the antenna pattern and configured to divide the slot antenna into multiple segments tuning the slot antenna to at least two radio frequencies.

Aspect 79 is the earpiece set forth in aspect(s) 75 (or of any other preceding or subsequent aspects individually or in combination), wherein a microphone is positioned between the slot antenna and the earpiece housing and aligned with a microphone aperture in the earpiece housing.

Aspect 80 is the earpiece set forth in aspect(s) 75 (or of any other preceding or subsequent aspects individually or in combination), wherein the elongated slot comprises a sealant disposed within the elongated slot and wherein the sealant is configured to prevent ingress of moisture into the elongated slot and allow passage of radio frequency waves.

Aspect 81 is an earpiece for a pair of headphones, the earpiece comprising: an earpiece housing defining an interior volume, the earpiece housing having an interior sidewall surface extending around a central opening of the earpiece housing at a first angle and a first aperture formed through the interior sidewall surface; an earpiece cover coupled to the earpiece housing and covering the central opening, the earpiece cover having a plurality of sound openings formed through a central region of the earpiece cover, an outer sidewall surface extending around the central region and aligned with and extending over the interior sidewall surface of the earpiece housing, and a second aperture formed through the outer sidewall surface and aligned with the first aperture; an annular earpiece cushion coupled to the earpiece housing surrounding an ear-receiving region of the earpiece; a speaker disposed within the interior volume and positioned to direct acoustic energy through the plurality of sound openings in the earpiece cover into the ear-receiving region of the earpiece; a carrier coupled to the earpiece housing and disposed over the first and second apertures, the carrier having a body formed between first and second opposing major surfaces, the first major surface facing the ear-receiving region and the second major surface including a mounting portion disposed at a second angle relative to the earpiece housing different than the first angle; an optical sensor comprising an optical emitter and an optical receiver and coupled to the mounting portion of the carrier, the optical sensor aligned to emit radiation through the body of the carrier and through the first and second apertures into the ear-receiving region and receive reflected radiation back through the first and second apertures and through the body of the carrier.

Aspect 82 is the earpiece set forth in aspect(s) 81 (or of any other preceding or subsequent aspects individually or in combination), wherein the optical sensor has a field of view that is confined to an area within an inner periphery of the earpiece cushion.

Aspect 83 is the earpiece set forth in aspect(s) 81 (or of any other preceding or subsequent aspects individually or in combination), wherein the optical emitter is an infrared laser.

Aspect 84 is the earpiece set forth in aspect(s) 81 (or of any other preceding or subsequent aspects individually or in combination), wherein the carrier comprises material transparent to infrared radiation and the first major surface of the carrier comprises an infrared radiation absorbing material.

Aspect 85 is the earpiece set forth in aspect(s) 81 (or of any other preceding or subsequent aspects individually or in combination), wherein the optical sensor comprises a vertical cavity surface emitting laser (VCSEL) and an array of single-photon avalanche diodes (SPAD).

Aspect 86 is the earpiece set forth in aspect(s) 85 (or of any other preceding or subsequent aspects individually or in combination), wherein the earpiece further comprises a processor programmed to calculate time-of-flight distance information received from the VCSEL and the SPAD.

Aspect 87 is an earpiece, comprising: an earpiece housing defining an interior volume, the earpiece housing having an interior sidewall surface extending around a central opening of the earpiece housing at a first angle and a first aperture formed through the interior sidewall surface; an annular earpiece cushion coupled to the earpiece housing surrounding an ear-receiving region of the earpiece; a speaker disposed within the interior volume and positioned to direct acoustic energy into the ear-receiving region of the earpiece; a carrier coupled to the earpiece housing and disposed over the first aperture, the carrier having a body formed between first and second opposing major surfaces, the first major surface facing the ear-receiving region and the second major surface including a mounting portion disposed at a second angle relative to the earpiece housing different than the first angle; an optical sensor comprising an optical emitter and an optical receiver and coupled to the mounting portion of the carrier, the optical sensor aligned to emit radiation through the body of the carrier and through the first aperture into the ear-receiving region and receive reflected radiation back through the first aperture and through the body of the carrier.

Aspect 88 is the earpiece set forth in aspect(s) 87 (or of any other preceding or subsequent aspects individually or in combination), further comprising an earpiece cover coupled to the earpiece housing and covering the central opening, the earpiece cover having a plurality of sound openings formed through a central region of the earpiece cover, an outer sidewall surface extending around the central region and aligned with and extending over the interior sidewall surface of the earpiece housing, and a second aperture formed through the outer sidewall surface and aligned with the first aperture, wherein the speaker is positioned to direct the acoustic energy through the plurality of sound openings in the earpiece cover and the optical sensor is aligned to emit radiation through the first and second apertures and receive reflected radiation through the first and second apertures.

Aspect 89 is the earpiece set forth in aspect(s) 87 (or of any other preceding or subsequent aspects individually or in combination), wherein the optical sensor has a first field of view contained within an inner periphery of the ear-receiving region of the earpiece.

Aspect 90 is the earpiece set forth in aspect(s) 89 (or of any other preceding or subsequent aspects individually or in combination), wherein the optical sensor further comprises a beam steering device configured to direct the radiation to a plurality of individual fields of view contained within the first field of view.

Aspect 91 is the earpiece set forth in aspect(s) 87 (or of any other preceding or subsequent aspects individually or in combination), wherein the optical sensor comprises a vertical cavity surface emitting laser (VCSEL) and an array of single-photon avalanche diodes (SPAD).

Aspect 92 is the earpiece set forth in aspect(s) 91 (or of any other preceding or subsequent aspects individually or in combination), wherein the earpiece further comprises a processor programmed to calculate time-of-flight distance information received from the VCSEL and the SPAD.

Aspect 93 is the earpiece set forth in aspect(s) 87 (or of any other preceding or subsequent aspects individually or in combination), wherein the carrier comprises material transparent to infrared radiation and the first major surface of the carrier comprises an infrared radiation absorbing material.

Aspect 94 is an earpiece comprising: an earpiece housing defining an interior volume, the earpiece housing having an interior sidewall surface extending around a central opening of the earpiece housing at a first angle and a first aperture formed through the interior sidewall surface; an annular earpiece cushion coupled to the earpiece housing surrounding an ear-receiving region of the earpiece; a speaker disposed within the interior volume and positioned to direct acoustic energy into the ear-receiving region of the earpiece; an optical sensor coupled to the interior sidewall surface of the earpiece housing, the optical sensor comprising an optical emitter and an optical receiver and aligned to emit radiation through first aperture into the ear-receiving region and receive reflected radiation back through the first aperture.

Aspect 95 is the earpiece as set forth in aspect(s) 94 (or of any other preceding or subsequent aspects individually or in combination), further comprising a carrier coupled to the earpiece housing and disposed over the first aperture, the carrier having a body formed between first and second opposing major surfaces, the first major surface facing the ear-receiving region and the second major surface including a mounting portion disposed at a second angle relative to the earpiece housing different than the first angle, wherein the optical sensor is coupled to the mounting portion of the carrier and aligned to emit and receive reflected radiation through the body of the carrier.

Aspect 96 is the earpiece as set forth in aspect(s) 95 (or of any other preceding or subsequent aspects individually or in combination), further comprising an earpiece cover coupled to the earpiece housing and covering the central opening, the earpiece cover having a plurality of sound openings formed through a central region of the earpiece cover, an outer sidewall surface extending around the central region and aligned with and extending over the interior sidewall surface of the earpiece housing, and a second aperture formed through the outer sidewall surface and aligned with the first aperture, wherein the speaker is positioned to direct the acoustic energy through the plurality of sound openings in the earpiece cover and the optical sensor is aligned to emit radiation through the first and second apertures and receive reflected radiation through the first and second apertures.

Aspect 97 is the earpiece set forth in aspect(s) 95 (or of any other preceding or subsequent aspects individually or in combination), wherein the carrier comprises material transparent to infrared radiation and the first major surface of the carrier comprises an infrared radiation absorbing material.

Aspect 98 is the earpiece set forth in aspect(s) 94 (or of any other preceding or subsequent aspects individually or in combination), wherein the optical sensor has a field of view that is confined to an area within an inner periphery of the earpiece cushion.

Aspect 99 is the earpiece set forth in aspect(s) 94 (or of any other preceding or subsequent aspects individually or in combination), wherein the optical emitter is an infrared laser.

Aspect 100 is the earpiece set forth in aspect(s) 94 (or of any other preceding or subsequent aspects individually or in combination), wherein the optical sensor comprises a vertical cavity surface emitting laser (VCSEL) and an array of single-photon avalanche diodes (SPAD).

Aspect 101 is a headphone earpiece assembly comprising: a housing defining an interior volume; an earpiece cover disposed in the interior volume and comprising a first magnet and a metal shunt, the metal shunt positioned between the earpiece cover and the first magnet; and an earpiece cushion assembly removably coupled to the housing and comprising an annular earpiece cushion coupled to a frame and a magnetic element disposed between the earpiece cushion and the frame, the magnetic element magnetically coupled with the first magnet when the earpiece cushion assembly is coupled to the housing, wherein the first magnet is configured to direct magnetic flux through the magnetic element to secure the earpiece cushion assembly to the housing.

Aspect 102 is the headphone earpiece assembly set forth in aspect(s) 101 (or of any other preceding or subsequent aspects individually or in combination), wherein the magnet comprises an array of magnets with alternating pole orientations.

Aspect 103 is the headphone earpiece assembly set forth in aspect(s) 101 (or of any other preceding or subsequent aspects individually or in combination), wherein the metal shunt is configured to direct flux away from electronic components positioned in the interior volume of the housing.

Aspect 104 is the headphone earpiece assembly set forth in aspect(s) 101 (or of any other preceding or subsequent aspects individually or in combination), wherein the magnetic element comprises a metal plate or a magnet.

Aspect 105 is the headphone earpiece assembly set forth in aspect(s) 101 (or of any other preceding or subsequent aspects individually or in combination), wherein the cover and the frame each comprise an annular surface surrounding a central portion.

Aspect 106 is the headphone earpiece assembly set forth in aspect(s) 105 (or of any other preceding or subsequent aspects individually or in combination), wherein the magnet and the metal shunt are disposed on the annular surface of the cover and the magnetic element is disposed on the annular surface of the frame.

Aspect 107 is the headphone earpiece assembly set forth in aspect(s) 105 (or of any other preceding or subsequent aspects individually or in combination), wherein a plurality of magnets are arranged in a pattern on the annular shelf of the cover and a plurality of magnetic elements are arranged in the pattern on the annular surface of the cover.

Aspect 108 is an earpiece, comprising: a housing defining an interior volume; an earpiece cover coupled with the housing and comprising a central portion disposed in the interior volume, an annular shelf surrounding the central portion, a sidewall extending around the central opening of the earpiece cover between the central portion and the annular shelf, and a first magnet and a metal shunt positioned on the annular shelf, the metal shunt positioned between the earpiece cover and the first magnet; a speaker disposed within the interior volume and positioned to direct acoustic energy through the central portion of the earpiece cover; and an earpiece cushion assembly removably coupled to the earpiece cover and comprising a frame having a central portion, an annular surface surrounding the central portion of the frame, a sidewall extending around the central portion of the frame between the central portion and the annular surface, an earpiece cushion coupled with the annular surface of the frame, and a magnetic element disposed on the annular surface between the earpiece cushion and the frame, the magnetic element magnetically coupled with the first magnet when the earpiece cushion assembly is coupled to the housing, wherein the first magnet is configured to direct magnetic flux through the magnetic element to secure the earpiece cushion assembly to the housing.

Aspect 109 is the headphone earpiece assembly set forth in 108 (or of any other preceding or subsequent aspects individually or in combination), wherein a plurality of sound openings are formed through the central portion of the earpiece cover and the speaker is positioned to direct acoustic energy through the plurality of sound openings in the earpiece cover.

Aspect 110 is the headphone earpiece assembly set forth in aspect(s) 108 (or of any other preceding or subsequent aspects individually or in combination), wherein the earpiece cover sidewall defines a first aperture and the frame sidewall defines a second aperture.

Aspect 111 is the headphone earpiece assembly set forth in aspect(s) 110 (or of any other preceding or subsequent aspects individually or in combination), wherein the first and second apertures are aligned when the earpiece cover is coupled with the earpiece cushion assembly.

Aspect 112 is the headphone earpiece assembly set forth in aspect(s) 108 (or of any other preceding or subsequent aspects individually or in combination), wherein a plurality of magnets are arranged in a pattern on the annular shelf of the cover and a plurality of magnetic elements are arranged in the pattern on the annular surface of the cover.

Aspect 113 is the headphone earpiece assembly set forth in aspect(s) 108 (or of any other preceding or subsequent aspects individually or in combination), wherein the magnetic shunt is configured to direct flux away from the speaker in the interior volume.

Aspect 114 is the headphone earpiece assembly set forth in aspect(s) 108 (or of any other preceding or subsequent aspects individually or in combination), wherein the magnet comprises an array of magnets arranged in a pattern.

Aspect 115 is an earpiece, comprising: a housing defining an interior volume; an earpiece cover coupled with the housing and comprising a central portion disposed in the interior volume, an annular shelf surrounding the central portion, a sidewall extending around the central opening of the earpiece cover between the central portion and the annular shelf, and a first magnet positioned on the annular shelf.

Aspect 115 is an earpiece cushion assembly removably coupled to the earpiece cover and comprising a frame having a central portion, an annular surface surrounding the central portion of the frame, a sidewall extending around the central portion of the frame between the central portion and the annular surface, an earpiece cushion coupled with the annular surface of the frame, and a magnetic element disposed on the annular surface between the earpiece cushion and the frame, the magnetic element magnetically coupled with the first magnet when the earpiece cushion assembly is coupled to the housing, wherein the first magnet is configured to direct magnetic flux through the magnetic element to secure the earpiece cushion assembly to the housing.

Aspect 116 is the headphone earpiece assembly set forth in aspect(s) 115 (or of any other preceding or subsequent aspects individually or in combination), further comprising a speaker disposed within the interior volume and positioned to direct acoustic energy through the central portion of the earpiece cover.

Aspect 117 is the headphone earpiece assembly set forth in aspect(s) 116 (or of any other preceding or subsequent aspects individually or in combination), further comprising a metal shunt positioned on the annular shelf between the earpiece cover and the first magnet.

Aspect 118 is the headphone earpiece assembly set forth in aspect(s) 117 (or of any other preceding or subsequent aspects individually or in combination), wherein the metal shunt is configured to direct flux away from electronic components positioned in the interior volume of the housing.

Aspect 119 is the headphone earpiece assembly set forth in aspect(s) 115 (or of any other preceding or subsequent aspects individually or in combination), wherein the magnet comprises an array of magnets with alternating pole orientations.

Aspect 120 is the headphone earpiece assembly set forth in aspect(s) 115 (or of any other preceding or subsequent aspects individually or in combination), wherein a plurality of magnets are arranged in a pattern on the annular shelf of the cover and a plurality of magnetic elements are arranged in the pattern on the annular surface of the cover.

What is claimed is:

1. An earpiece for a pair of headphones, the earpiece comprising:
    an earpiece housing defining an interior volume, the earpiece housing having an interior sidewall surface extending around a central opening of the earpiece housing at a first angle and a first aperture formed through the interior sidewall surface;
    an earpiece cover coupled to the earpiece housing and covering the central opening, the earpiece cover having a plurality of sound openings formed through a central region of the earpiece cover, an outer sidewall surface extending around the central region and aligned with and extending over the interior sidewall surface of the earpiece housing, and a second aperture formed through the outer sidewall surface and aligned with the first aperture;
    an annular earpiece cushion coupled to the earpiece housing surrounding an ear-receiving region of the earpiece;
    a speaker disposed within the interior volume and positioned to direct acoustic energy through the plurality of sound openings in the earpiece cover into the ear-receiving region of the earpiece;
    a carrier coupled to the earpiece housing and disposed over the first and second apertures, the carrier having a body formed between first and second opposing major surfaces, the first major surface facing the ear-receiving region and the second major surface including a mounting portion disposed at a second angle relative to the earpiece housing different than the first angle;

an optical sensor comprising an optical emitter and an optical receiver and coupled to the mounting portion of the carrier, the optical sensor aligned to emit radiation through the body of the carrier and through the first and second apertures into the ear-receiving region and receive reflected radiation back through the first and second apertures and through the body of the carrier.

2. The earpiece set forth in claim 1, wherein the optical sensor has a field of view that is confined to an area within an inner periphery of the earpiece cushion.

3. The earpiece set forth in claim 1, wherein the optical emitter is an infrared laser.

4. The earpiece set forth in claim 1, wherein the carrier comprises material transparent to infrared radiation and the first major surface of the carrier comprises an infrared radiation absorbing material.

5. The earpiece set forth in claim 1, wherein the optical sensor comprises a vertical cavity surface emitting laser (VCSEL) and an array of single-photon avalanche diodes (SPAD).

6. The earpiece set forth in claim 5, wherein the earpiece further comprises a processor programmed to calculate time-of-flight distance information received from the VCSEL and the SPAD.

7. An earpiece, comprising:
an earpiece housing defining an interior volume, the earpiece housing having an interior sidewall surface extending around a central opening of the earpiece housing at a first angle and a first aperture formed through the interior sidewall surface;
an annular earpiece cushion coupled to the earpiece housing surrounding an ear-receiving region of the earpiece;
a speaker disposed within the interior volume and positioned to direct acoustic energy into the ear-receiving region of the earpiece;
a carrier coupled to the earpiece housing and disposed over the first aperture, the carrier having a body formed between first and second opposing major surfaces, the first major surface facing the ear-receiving region and the second major surface including a mounting portion disposed at a second angle relative to the earpiece housing different than the first angle;
an optical sensor comprising an optical emitter and an optical receiver and coupled to the mounting portion of the carrier, the optical sensor aligned to emit radiation through the body of the carrier and through the first aperture into the ear-receiving region and receive reflected radiation back through the first aperture and through the body of the carrier.

8. The earpiece set forth in claim 7, further comprising an earpiece cover coupled to the earpiece housing and covering the central opening, the earpiece cover having a plurality of sound openings formed through a central region of the earpiece cover, an outer sidewall surface extending around the central region and aligned with and extending over the interior sidewall surface of the earpiece housing, and a second aperture formed through the outer sidewall surface and aligned with the first aperture, wherein the speaker is positioned to direct the acoustic energy through the plurality of sound openings in the earpiece cover and the optical sensor is aligned to emit radiation through the first and second apertures and receive reflected radiation through the first and second apertures.

9. The earpiece set forth in claim 7, wherein the optical sensor has a first field of view contained within an inner periphery of the ear-receiving region of the earpiece.

10. The earpiece set forth in claim 9, wherein the optical sensor further comprises a beam steering device configured to direct the radiation to a plurality of individual fields of view contained within the first field of view.

11. The earpiece set forth in claim 7, wherein the optical sensor comprises a vertical cavity surface emitting laser (VCSEL) and an array of single-photon avalanche diodes (SPAD).

12. The earpiece set forth in claim 11, wherein the earpiece further comprises a processor programmed to calculate time-of-flight distance information received from the VCSEL and the SPAD.

13. The earpiece set forth in claim 7, wherein the carrier comprises material transparent to infrared radiation and the first major surface of the carrier comprises an infrared radiation absorbing material.

14. An earpiece comprising:
an earpiece housing defining an interior volume, the earpiece housing having an interior sidewall surface extending around a central opening of the earpiece housing at a first angle and a first aperture formed through the interior sidewall surface;
an annular earpiece cushion coupled to the earpiece housing surrounding an ear-receiving region of the earpiece;
a speaker disposed within the interior volume and positioned to direct acoustic energy into the ear-receiving region of the earpiece;
an optical sensor coupled to the interior sidewall surface of the earpiece housing, the optical sensor comprising an optical emitter and an optical receiver and aligned to emit radiation through the first aperture into the ear-receiving region and receive reflected radiation back through the first aperture.

15. The earpiece as set forth in claim 14, further comprising a carrier coupled to the earpiece housing and disposed over the first aperture, the carrier having a body formed between first and second opposing major surfaces, the first major surface facing the ear-receiving region and the second major surface including a mounting portion disposed at a second angle relative to the earpiece housing different than the first angle, wherein the optical sensor is coupled to the mounting portion of the carrier and aligned to emit and receive reflected radiation through the body of the carrier.

16. The earpiece as set forth in claim 15, further comprising an earpiece cover coupled to the earpiece housing and covering the central opening, the earpiece cover having a plurality of sound openings formed through a central region of the earpiece cover, an outer sidewall surface extending around the central region and aligned with and extending over the interior sidewall surface of the earpiece housing, and a second aperture formed through the outer sidewall surface and aligned with the first aperture, wherein the speaker is positioned to direct the acoustic energy through the plurality of sound openings in the earpiece cover and the optical sensor is aligned to emit radiation through the first and second apertures and receive reflected radiation through the first and second apertures.

17. The earpiece set forth in claim 15, wherein the carrier comprises material transparent to infrared radiation and the first major surface of the carrier comprises an infrared radiation absorbing material.

18. The earpiece set forth in claim 14, wherein the optical sensor has a field of view that is confined to an area within an inner periphery of the earpiece cushion.

19. The earpiece set forth in claim 14, wherein the optical emitter is an infrared laser.

20. The earpiece set forth in claim 14, wherein the optical sensor comprises a vertical cavity surface emitting laser (VCSEL) and an array of single-photon avalanche diodes (SPAD).

* * * * *